United States Patent
Lee et al.

(10) Patent No.: US 12,504,558 B2
(45) Date of Patent: Dec. 23, 2025

(54) SEMICONDUCTOR-NANOPARTICLE-LIGAND COMPLEX, PREPARATION METHOD THEREFOR, PHOTOSENSITIVE RESIN COMPOSITION, OPTICAL FILM, ELECTROLUMINESCENT DIODE AND ELECTRONIC DEVICE

(71) Applicant: DUK SAN NEOLUX CO., LTD., Cheonan-si (KR)

(72) Inventors: See Maek Lee, Cheonan-si (KR); Yum Hee Park, Cheonan-si (KR); Eun Byul Bang, Cheonan-si (KR); Do Eon Kim, Cheonan-si (KR); Tae Yun Kim, Cheonan-si (KR); Jong Moon Shin, Cheonan-si (KR); Chang Min Lee, Cheonan (KR); Hyung Dong Lee, Cheonan-si (KR); Hyun Ji Oh, Cheonan-si (KR)

(73) Assignee: Duk San Neolux Co., Ltd., Cheonan-si (KR)

( * ) Notice: Subject to any disclaimer, the term of this patent is extended or adjusted under 35 U.S.C. 154(b) by 475 days.

(21) Appl. No.: 18/035,072

(22) PCT Filed: Nov. 18, 2021

(86) PCT No.: PCT/KR2021/016958
§ 371 (c)(1),
(2) Date: May 2, 2023

(87) PCT Pub. No.: WO2022/108350
PCT Pub. Date: May 27, 2022

(65) Prior Publication Data
US 2024/0008304 A1    Jan. 4, 2024

(30) Foreign Application Priority Data

Nov. 18, 2020  (KR) ........................ 10-2020-0154256
Oct. 8, 2021  (KR) ........................ 10-2021-0133629

(51) Int. Cl.
*G02B 1/00* (2006.01)
*C08K 9/04* (2006.01)
(Continued)

(52) U.S. Cl.
CPC ................ *G02B 1/002* (2013.01); *C08K 9/04* (2013.01); *G02B 1/10* (2013.01); *H10K 59/875* (2023.02);
(Continued)

(58) Field of Classification Search
CPC ........ G02B 1/002; G02B 1/10; H10K 59/875; C08K 9/04
(Continued)

(56) References Cited

U.S. PATENT DOCUMENTS 8,481,162 B2    7/2013  Bawendi et al.
10,942,450 B2    3/2021  Chae et al.
(Continued)

FOREIGN PATENT DOCUMENTS

JP    2011006412 A    1/2011
JP    5165815 B2    3/2013
(Continued)

OTHER PUBLICATIONS

International Search Report (English and Korean) and Written Opinion of the ISA (Korean) issued in PCT/KR2021/016958, mailed Feb. 28, 2022; ISA/KR.
(Continued)

*Primary Examiner* — Anita Nassiri-Motlagh
(74) *Attorney, Agent, or Firm* — Harness, Dickey & Pierce, P.L.C.

(57) ABSTRACT

Embodiments of the present invention relate to a semiconductor-nanoparticle-ligand complex, a preparation method therefor, a photosensitive resin composition, an optical film, an electroluminescent diode and an electronic device, and, (Continued)

more specifically, can provide: a semiconductor-nanoparticle-ligand complex comprising a ligand represented by chemical formula 1, and thus has excellent compatibility; an optical film with excellent efficiency; an electroluminescent diode; and an electronic device.

16 Claims, 3 Drawing Sheets

(51) Int. Cl.
    *G02B 1/10*     (2015.01)
    *H10K 50/81*     (2023.01)
    *H10K 59/80*     (2023.01)

(52) U.S. Cl.
    CPC ........ *C08K 2201/005* (2013.01); *H10K 50/81* (2023.02)

(58) Field of Classification Search
    USPC .................................................. 252/301.16
    See application file for complete search history.

(56) References Cited

U.S. PATENT DOCUMENTS

2018/0081236 A1     3/2018   Chikushi et al.
2020/0231871 A1     7/2020   Kim et al.

FOREIGN PATENT DOCUMENTS

| | | |
|---|---|---|
| JP | 2019206641 A | 12/2019 |
| KR | 101140086 B1 | 4/2012 |
| KR | 101828214 B1 | 2/2018 |
| KR | 20200090493 A | 7/2020 |
| WO | WO-2016189827 A1 | 12/2016 |

OTHER PUBLICATIONS

Trivedi et al., "Design, sythesis, biological evaluation and molecular docking study of arylcarboxamido piperidine and piperazine-based hydroxamates as potential HDAC8 inhibitors with promising anticancer activity", *European Journal of Pharmaceutical Sciences* 138 (2019) 105046, pp. 1-15.

SEMICONDUCTOR-NANOPARTICLE-LIGAND COMPLEX, PREPARATION METHOD THEREFOR, PHOTOSENSITIVE RESIN COMPOSITION, OPTICAL FILM, ELECTROLUMINESCENT DIODE AND ELECTRONIC DEVICE

CROSS-REFERENCE TO RELATED APPLICATIONS

This application is a U.S. National Phase Application under 35 U.S.C. 371 of International Application No. PCT/KR2021/016958, filed on Nov. 18, 2021, which claims the benefit of Korean Patent Application No. 10-2020-0154256, filed on Nov. 18, 2020, and Korean Patent Application No. 10-2021-0133629, filed on Oct. 8, 2021, the disclosures of which are herein incorporated by reference in their entirety. The present patent application claims priority to other applications to be filed in other countries, the disclosures of which are also incorporated by reference herein in their entirety.

TECHNICAL FIELD

The present invention relates to a semiconductor nanoparticle-ligand complex, a manufacturing method thereof, a photosensitive resin composition, an optical film, a light emitting diode, and an electronic device.

BACKGROUND ART

Conventional liquid crystal displays are widely used because they consume less power, are lightweight, and may be implemented in a thin film type. However, liquid crystal displays, by their non-self emissive nature, require a backlight and may not implement perfect black as compared with organic light emitting diodes. Further, the organic light emitting diode display has difficulty in wide color reproducibility due to limitations of the light emitting organic structure.

To address the issues with the liquid crystal display device, a technology has been developed that adopts blue organic light emitting diodes, which emit blue light, as the light sources of the backlight unit and uses quantum dots, which are a semiconductor nanoparticle-ligand complex to convert blue light into a different color.

To use quantum dots, a process of patterning a layer containing quantum dots is required. However, quantum dots have low compatibility with organic resins used in the patterning process, so that it is difficult to increase the content of quantum dots, making it difficult to realize excellent color characteristics. Therefore, to enhance quantum dot patterning processability, it is required to enhance compatibility with organic resins used in the patterning process.

DETAILED DESCRIPTION OF THE INVENTION

Technical Problem

Embodiments of the present invention may provide a semiconductor nanoparticle-ligand complex having enhanced compatibility.

Further, embodiments of the present invention may provide a photosensitive resin composition capable of forming an optical film capable of exhibiting excellent color characteristics.

Further, embodiments of the present invention may provide an optical film capable of exhibiting excellent color characteristics.

Further, embodiments of the present invention may provide an electric light emitting diode and an electronic device having excellent color characteristics.

Technical Solution

In one aspect, embodiments of the present invention provide a semiconductor nanoparticle-ligand complex including a ligand represented by chemical formula 1 below.

[Chemical formula 1]

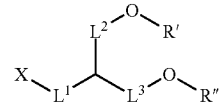

in chemical formula 1,
wherein X is a functional group bonded to a surface of a semiconductor nanoparticle and is —S(H), —P=O(OH)$_2$ or —COOH, wherein
L$^1$ is selected from the group consisting of: an arylene group of C$_6$-C$_{30}$; a heterocyclic group of C$_2$-C$_{30}$ including at least one heteroatom selected from the group consisting of O, N, S, Si, and P; an alkylene group of C$_1$-C$_{20}$; an alkoxyl group of C$_1$-C$_{20}$; an alkylthio group of C$_1$-C$_{20}$; and a combination thereof, wherein
L$^2$ and L$^3$ are, independently of each other, selected from the group consisting of a single bond; an arylene group of C$_6$-C$_{20}$; a heterocyclic group of C$_2$-C$_{20}$ including at least one heteroatom selected from the group consisting of O, N, S, Si, and P; an aliphatic ring group of C$_3$-C$_{20}$; an alkylene group of C$_1$-C$_{10}$; an alkoxyl group of C$_1$-C$_{10}$; an alkylthio group of C$_1$-C$_{10}$; and a combination thereof, wherein
R' and R" are, independently of each other, chemical formulas 2 to 4 below, wherein

[Chemical formula 2]

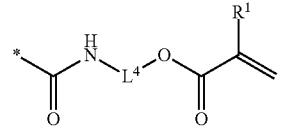

in chemical formula 2,
wherein R$^1$ is, independently of each other, a hydrogen or methyl group, wherein
L$^4$ is, independently of each other, selected from the group consisting of an alkylene group of C$_1$-C$_{20}$; an alkoxyl group of C$_1$-C$_{20}$; an alkylthio group of C$_1$-C$_{20}$; and chemical formula 5 below, wherein

[Chemical formula 3]

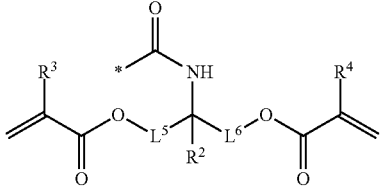

in chemical formula 3,
wherein $R^2$ to $R^4$ are, independently of each other, a hydrogen or methyl group, wherein
$L^5$ and $L^6$ are, independently of each other, selected from the group consisting of an alkylene group of $C_1$-$C_{20}$; an alkoxyl group of $C_1$-$C_{20}$; an alkylthio group of $C_1$-$C_{20}$; and chemical formula 5, wherein

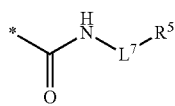

[Chemical formula 4]

wherein in chemical formula 4 above, $R^5$ is, independently of each other, an alkyl group of $C_1$-$C_{10}$, wherein
$L^7$ is, independently of each other, selected from the group consisting of a single bond; an alkylene group of $C_1$-$C_{20}$; an alkoxyl group of $C_1$-$C_{20}$; an alkylthio group of $C_1$-$C_{20}$; and chemical formula 5, wherein
in $L^1$ to $L^7$ in chemical formulas 1 to 4, each of the arylene group, the heterocyclic group, the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$, wherein

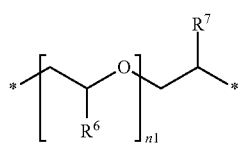

[Chemical formula 5]

in chemical formula 5,
wherein n1 is an integer from 1 to 12, and wherein
$R^6$ and $R^7$ are, independently of each other, a hydrogen or methyl group.

According to another aspect of the present invention, there is provided a method for preparing a semiconductor nanoparticle-ligand complex, comprising a first surface modification step surface-modifying a surface of a semiconductor nanoparticle with a compound represented by chemical formula 6 below and a second surface modification step performing surface modification by reacting an alcohol group (—OH) of chemical formula 6 of the semiconductor nanoparticle surface-modified by the compound represented by chemical formula 6 with an acrylic compound.

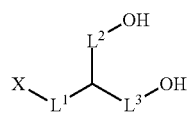

[Chemical formula 6]

in chemical formula 6,
wherein X is a functional group bonded to a surface of a semiconductor nanoparticle and is —S(H), —P═O(OH)$_2$ or —COOH, wherein
$L^1$ is selected from the group consisting of: an arylene group of $C_6$-$C_{30}$; a heterocyclic group of $C_2$-$C_{30}$ including at least one heteroatom selected from the group consisting of O, N, S, Si, and P; an alkylene group of $C_1$-$C_{20}$; an alkoxyl group of $C_1$-$C_{20}$; an alkylthio group of $C_1$-$C_{20}$; and a combination thereof, wherein
$L^2$ and $L^3$ are, independently of each other, selected from the group consisting of a single bond; an arylene group of $C_6$-$C_{20}$; a heterocyclic group of $C_2$-$C_{20}$ including at least one heteroatom selected from the group consisting of O, N, S, Si, and P; an aliphatic ring group of $C_3$-$C_{20}$; an alkylene group of $C_1$-$C_{10}$; an alkoxyl group of $C_1$-$C_{10}$; an alkylthio group of $C_1$-$C_{10}$; and a combination thereof, wherein
in $L^1$ to $L^3$, each of the arylene group, the heterocyclic group, the alkylene group, the alkoxyl group, and the alkylthio group may further be substituted with one or more substituents selected from the group consisting of deuterium; an aryl group of C6-C10; a heterocyclic group of C2-C10; an aliphatic ring group of C3-C10; and an alkyl group of C1-C10.

The acrylic compound may be represented by chemical formula 7 to chemical formula 9 below.

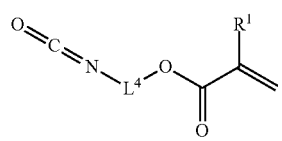

[Chemical formula 7]

in chemical formula 7,
$R^1$ is a hydrogen or methyl group, wherein
$L^4$ is selected from the group consisting of an alkylene group of $C_1$-$C_{20}$; an alkoxyl group of $C_1$-$C_{20}$; an alkylthio group of $C_1$-$C_{20}$; and chemical formula 10 below, wherein

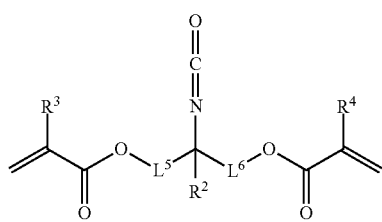

[Chemical formula 8]

in chemical formula 8,
wherein $R^2$ to $R^4$ are, independently of each other, a hydrogen or methyl group, wherein
$L^5$ and $L^6$ are, independently of each other, selected from the group consisting of an alkylene group of $C_1$-$C_{20}$; an alkoxyl group of $C_1$-$C_{20}$; an alkylthio group of $C_1$-$C_{20}$; and chemical formula 10, wherein

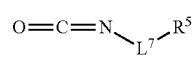

[Chemical formula 9]

in chemical formula 9,
$R^5$ is hydrogen or an alkyl group of $C_1$-$C_{10}$, wherein
$L^7$ is selected from the group consisting of a single bond, an alkylene group of $C_1$-$C_{20}$; an alkoxyl group of $C_1$-$C_{20}$; an alkylthio group of $C_1$-$C_{20}$; and chemical formula 10 below, wherein in $L^4$ to $L^7$ in chemical formulas 7 to 9, each of the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$, wherein

[Chemical formula 10]

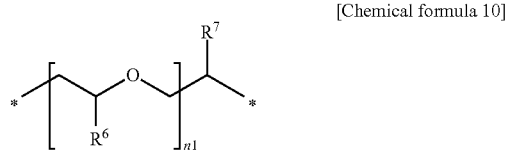

in chemical formula 10,
wherein n1 is an integer from 1 to 12, and wherein $R^5$ and $R^6$ are, independently of each other, a hydrogen or methyl group.

Here, it is preferable that the particle size of the semiconductor nanoparticles is 1 nm to 30 nm.

In another aspect, according to embodiments of the present invention, there is provided a photosensitive resin composition comprising (A) a semiconductor nanoparticle-ligand complex represented by chemical formula 1 above, (B) a photocrosslinkable monomer, and (C) an initiator.

The photocrosslinkable monomer may be represented by chemical formula I below.

[Chemical formula I]

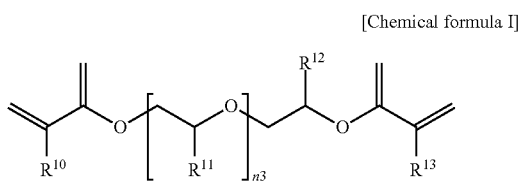

In chemical formula I above,
wherein $R^{10}$ to $R^{13}$ are, independently of each other, a hydrogen or methyl group, wherein
n3 is an integer from 1 to 15.

The photosensitive resin composition may further comprise a light diffuser. Here, the light diffuser may include barium sulfate, calcium carbonate, titanium dioxide, zirconia, or a combination thereof.

A content of the light diffuser may be 0.1 wt % to 10 wt % with respect to a total amount of the photosensitive resin composition.

The photosensitive resin composition may include 10 wt % to 60 wt % of the semiconductor nanoparticle-ligand complex (A), 30 wt % to 90 wt % of the photocrosslinkable monomer (B), and 0.1 wt % to 10 wt % of the initiator (C) with respect to the total amount of the photosensitive resin composition.

In another aspect, according to embodiments of the present invention, there is provided an optical film comprising a semiconductor nanoparticle-ligand complex and having a thickness of 0.005 μM to 500 μm.

In another aspect, according to embodiments of the present invention, there is provided an electroluminescent diode comprising an optical film.

In another aspect, according to embodiments of the present invention, there is provided an electronic device comprising a display device including an optical film and a controller driving the display device.

In another aspect, according to embodiments of the present invention, there is provided an electronic device comprising a display device including an electroluminescent diode and a controller driving the display device.

Advantageous Effects

According to embodiments of the present invention, it is possible to provide a semiconductor nanoparticle-ligand complex having excellent compatibility with an organic resin by including a ligand represented by chemical formula 1.

Further, according to embodiments of the present invention, it is possible to provide a photosensitive resin composition capable of manufacturing an optical film, an electric light emitting diode, and an electronic device having excellent quantum efficiency by including a semiconductor nanoparticle-ligand complex and a method for manufacturing the same.

MODE FOR CARRYING OUT THE INVENTION

Figure 1:
FIG. 1 is a view illustrating the compatibility of the semiconductor nanoparticle-ligand complex of embodiment 1.

Hereinafter, some embodiments of the present invention are described in detail with reference to the accompanying drawings. In assigning reference numerals to components of each drawing, the same components may be assigned the same numerals even when they are shown on different drawings. When determined to make the subject matter of the present invention unclear, the detailed description of the known configurations or functions may be skipped.

In describing the components of the present invention, when a component "includes," "has," or "is composed of" another component, the component may add other components unless the component "only" includes, has, or is composed of the other component. As used herein, the singular forms "a," "an," and "the" are intended to include the plural forms as well, unless the context clearly indicates otherwise.

Such denotations as "first," "second," "A," "B," "(a)," and "(b)," may be used in describing the components of the present invention. These denotations are provided merely to distinguish a component from another, and the essence, order, or number of the components are not limited by the denotations.

In describing the positional relationship between components, when two or more components are described as "connected", "coupled" or "linked", the two or more components may be directly "connected", "coupled" or "linked"", or another component may intervene. Here, the other component may be included in one or more of the two or more components that are "connected", "coupled" or "linked" to each other.

When a component is "on" or "above" another component, it should be understood that the component may be immediately on or above the other component, or other components may intervene therebetween. In contrast, when a component is "immediately on" another component, it should be understood that no intervening component is present therebetween. Further, when a component is "on" or "above" another component, the component may be positioned above or under the other component, but not necessarily means that the component is "on" or "above" the other component in the direction opposite to the direction of gravity.

When such terms as, e.g., "after", "next to", "after", and "before", are used to describe the temporal flow relationship related to components, operation methods, and fabricating methods, it may include a non-continuous relationship unless the term "immediately" or "directly" is used.

When a component is designated with a value or its corresponding information, unless explicitly stated, the value or the corresponding information may be interpreted as including a tolerance that may arise due to various factors (e.g., process factors, internal or external impacts, or noise).

As used herein, the term "halo" or "halogen" means fluorine (F), chlorine (Cl), bromine (Br), and iodine (I), and the like, unless otherwise specified.

As used herein, the term "alkyl," "alkyl group," or "alkylene group" means a radical of a saturated aliphatic functional group having 1 to 60 carbon atoms linked by a single bond and including a straight chain alkyl group, branched chain alkyl group, cycloalkyl (alicyclic) group, alkyl-substituted cycloalkyl group, or cycloalkyl-substituted alkyl group, unless otherwise specified.

As used herein, the term "alkenyl", "alkenyl group", "alkenyl" or "alkenyl group" each may have a double bond, and may include a straight or branched chain group and may have 2 to carbon atoms unless otherwise specified.

As used herein, the term "alkynyl", "alkynyl group", "alkynyl", "alkynyl group", "alkynyl" or "alkynyl group" each may have a triple bond, respectively, and may include a straight or branched chain group and may have 2 to 60 carbon atoms unless otherwise specified.

As used herein, the term "cycloalkyl" refers to an alkyl forming a ring having 3 to 60 carbon atoms, unless otherwise specified, but is not limited thereto.

As used herein, the term "alkoxyl group", "alkoxy group" or "alkyloxy group" refers to an alkyl group to which an oxygen radical is bonded, and may have 1 to 60 carbon atoms unless otherwise specified, but is not limited thereto. As used herein, the term "alkenoxyl group", "alkenoxy group", "alkenyloxyl group", or "alkenyloxy group" refers to an alkenyl group to which an oxygen radical is attached, and may have 2 to 60 carbon atoms unless otherwise specified, but is not limited thereto.

As used herein, the term "alkylthio group" refers to an alkyl group to which a sulfur radical is attached, and may have 1 to 60 carbon atoms unless otherwise specified, but is not limited thereto.

As used herein, the terms "aryl group" and "arylene group" each may have 6 to 60 carbon atoms unless otherwise specified, but are not limited thereto. In embodiments of the present invention, aryl group or arylene group means a monocyclic or multicyclic aromatic compound. For example, the aryl group may be a phenyl group, a monovalent functional group of biphenyl, a monovalent functional group of naphthalene, a fluorenyl group, or a spirofluorenyl group.

The prefix "aryl" or "ar" as used herein refers to a radical substituted with an aryl group. For example, the arylalkyl group is an alkyl group substituted with an aryl group, an arylalkenyl group is an alkenyl group substituted with an aryl group, and a radical substituted with an aryl group has carbon atoms described herein. When prefixes are named successively, it means that the substituents are listed in the order specified first. For example, arylalkoxy group means an alkoxy group substituted with an aryl group, alkoxylcarbonyl group means a carbonyl group substituted with an alkoxyl group, and arylcarbonylalkenyl group means an alkenyl group substituted with an arylcarbonyl group. Here, the arylcarbonyl group is a carbonyl group substituted with an aryl group.

In the disclosure, the term "fluorenyl group" or "fluorenylene group" may refer to a monovalent or divalent functional group, respectively, of fluorene, unless otherwise specified. "Substituted fluorenyl group" or "substituted fluorenylene group" may refer to a monovalent or divalent functional group of substituted fluorene. "Substituted fluorene" means that at least one of the following substituents R, R', R" and R'" is a functional group other than hydrogen, and includes the case where R and R' are bonded to each other to form a spiro compound together with the carbons to which they are bonded.

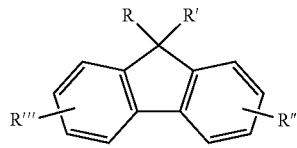

As used herein, the term "spiro compound" has a 'spiro union', and the spiro union means a union formed as two rings share only one atom. In this case, the atom shared by the two rings are called 'spiro atom', and according to the number of spiro atoms in a compound, it may be called 'monospiro-', 'dispiro-', or 'trispiro-' compound.

As used herein, the term "heterocyclic group" may include not only an aromatic ring, such as a "heteroaryl group" or "heteroarylene group" but also an aliphatic ring and, unless otherwise specified, means a single ring or multiple rings with 2 to 60 carbon atoms and one or more heteroatoms, but is not limited thereto.

As used herein, the term "aliphatic" refers to, but is not limited to, an aliphatic hydrocarbon having 1 to 60 carbon atoms unless otherwise specified.

As used herein, the term "aliphatic ring" refers to an aliphatic hydrocarbon ring having 3 to 60 carbon atoms unless otherwise specified, but is not limited thereto.

As used herein, the term "heteroatom" refers to N, O, S, P or Si unless otherwise specified.

The "heterocyclic group" may include a ring containing SO2 instead of carbon forming the ring. For example, the "heterocyclic group" may include the following compounds.

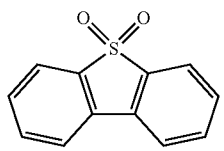 [SMILES: O=S1(=O)c2ccccc2-c2ccccc21]

As used herein, the term "ring" may include monocycles and polycycles, may include hydrocarbon rings as well as heterocycles containing at least one heteroatom, or may include aromatic and aliphatic rings.

As used herein, the term "polycyclic" or "multicyclic" may include ring assemblies, such as biphenyls or terphenyls, fused polycyclic systems, and spiro compounds, may include aromatic as well as aliphatic compounds, or may include heterocycles containing at least one heteroatom as well as hydrocarbon rings.

Unless otherwise explicitly stated, in the term "substituted" or "unsubstituted" as used herein, "substituted" may mean being substituted with one or more substituents selected from the group consisting of deuterium, halogen, amino group, nitrile group, nitro group, C1-C20 alkyl group, C1-C20 alkoxy group, C1-C20 alkylamine group, C1-C20 alkylthiophene group, C6-C20 arylthiophene group, C2-C20 alkenyl group, C2-C20 alkynyl group, C3-C20 cycloalkyl group, C6-C20 aryl group, C6-C20 aryl group substituted with deuterium, C8-C20 arylalkenyl group, silane group, boron group, germanium group, and C2-C20 heterocyclic group including at least one heteroatom selected from the group consisting of O, N, S, Si and P, but is not limited to the substituents.

In the disclosure, the 'functional group names' corresponding to the aryl group, arylene group, and heterocyclic group provided as examples of the symbols and their substituents may be described with 'the names of the functional groups reflecting the valence', but may also be described with 'the names of the parent compounds.' For example, in the case of 'phenanthrene', which is a type of aryl group, its name may be specified with its group identified, such as 'phenanthryl (group)' for the monovalent group, and 'phenanthrylene (group)' as the divalent group, but may also be specified as 'phenanthrene', which is the name of the parent compound, regardless of the valence. Similarly, pyrimidine may be specified as 'pyrimidine' regardless of the valence or may also be specified as pyrimidinyl (group) for the monovalence and as pyrimidylene (group) for the divalence. Therefore, in the disclosure, when the type of the substituent is specified with the name of the parent compound, it may mean an n-valent 'group' formed by detachment of the hydrogen atom bonded to a carbon atom and/or a heteroatom of the parent compound.

In the disclosure, the numbers or alphabet characters may be omitted from the names of compounds or substituents. For example, pyrido[4,3-d]pyrimidine may be simply referred to as pyridopyrimidine, benzofuro[2,3-d]pyrimidine as benzofuropyrimidine, and 9,9-dimethyl-9H-fluorene as dimethylfluorene. Therefore, both benzo[g]quinoxaline and benzo[f]quinoxaline may be referred to as benzoquinoxaline.

Further, unless explicitly stated, the formulas used in the disclosure may be applied in the same manner as the definition of the substituent by the exponent definition of the following formulas.

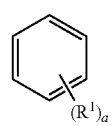

Here, when a is 0, the substituent $R^1$ is absent, and when a is 1, one substituent $R^1$ is bonded to any one of the carbons forming the benzene ring. When a is 2 or 3, each is bonded as follows, where $R^1$ may be the same or different. When a is an integer from 4 to 6, it is bonded to the carbon of the benzene ring in a similar manner. The denotation of the hydrogen bonded to the carbon forming the benzene ring may be omitted.

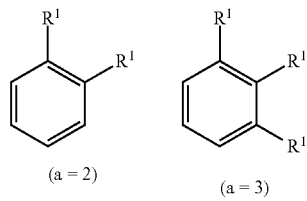

In the present application, that substituents are bonded to each other to form a ring means that a plurality of substituents bonded to each other share an arbitrary atom, e.g., at least one atom among a carbon atom or a heteroatoms, such as O, N, S, Si, and P to form a saturated or unsaturated ring. For example, in the case of naphthalene, an adjacent methyl group and butadienyl group substituted in any one benzene ring may share one carbon to form an unsaturated ring, or a vinyl group and a propyleneyl group may share one carbon to form an unsaturated ring. Further, in the case of fluorene, it, per se, may be regarded as an aryl group having 13 carbon atoms, but it may also be regarded as two methyl groups substituted with a biphenyl group being bonded to share one carbon to form a ring.

In the application, organic electrical element may mean a component(s) between the anode and the cathode or an organic light emitting diode including an anode, a cathode, and component(s) positioned therebetween.

Further, in some cases, in the application, organic electrical element may mean an organic light emitting diode and a panel including the same, or an electronic device including the panel and circuitry. The electronic device may include, e.g., a display device, a lighting device, a solar cell, a portable or mobile terminal (e.g., a smart phone, a tablet, a PDA, an electronic dictionary, or PMP), a navigation terminal, a game device, various TVs, and various computer monitors but, without limited thereto, may be any type of device including the component(s).

As used herein, the term "precursor" is a chemical substance previously prepared to react semiconductor nanoparticles, and is a concept denoting all compounds including metals, ions, elements, compounds, complexes, or clusters. It is not necessarily limited to the final material of any reaction, and means a material that may be obtained at any stage arbitrarily determined.

As used herein, the term "cluster" means a particle in which several tens of to several thousands of single atoms, molecules, or other types of atoms are aggregated or combined.

The semiconductor nanoparticle-ligand complex according to embodiments of the present invention may include a ligand represented by chemical formula 1 below.

[Chemical formula 1]

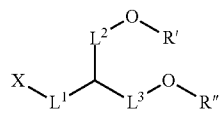

Hereinafter, chemical formula 1 is described.

X is a functional group bonded to the surface of semiconductor nanoparticles, and is —S(H), —P=O(OH)$_2$ or —COOH. Since the ligand represented by chemical formula 1 forms a coordination bond with the inorganic atoms of the semiconductor nanoparticles, e.g., X, as —SH, or —S which is resultant as H is detached from —SH, may form a coordination bond with the semiconductor nanoparticles. In another example, X, as —P=O(OH)$_2$, or —P=O(O)$_2$ which is resultant as H is detached from —P=O(OH)$_2$, may form a coordination bond with semiconductor nanoparticles. In another example, X, as —COOH, or —COO resultant as H is detached from —COOH, may form a coordinate bond with semiconductor nanoparticles.

$L^1$ is selected from the group consisting of: an arylene group of $C_6$-$C_{30}$; a heterocyclic group of $C_2$-$C_{30}$ including at least one heteroatom selected from the group consisting of O, N, S, Si, and P; an alkylene group of $C_1$-$C_{20}$; an alkoxyl group of $C_1$-$C_{20}$; an alkylthio group of $C_1$-$C_{20}$; and a combination thereof.

When $L^1$ is selected as a combination thereof, it means that a plurality of combinations of the aforementioned divalent radicals are selected, and may refer to a form in which two or more independently selected radicals, e.g., first radical-second radical, are connected to each other.

The arylene group in $L^1$ may be, e.g., an arylene group of $C_6$-$C_{20}$ or an arylene group of $C_6$-$C_{18}$. For example, the arylene group may be phenyl, biphenyl, naphthyl, and terphenyl.

The heterocycle in $L^1$ may be, e.g., a heterocyclic group of $C_2$-$C_{20}$ or a heterocyclic group of $C_2$-$C_{18}$. For example, the heterocyclic group may be pyridine, pyrimidine, benzofuran, benzothiophene, dioxin, dibenzofuran, dibenzothiophene, naphthobenzothiophene, and naphthobenzofuran.

The alkylene group in $L^1$ may be, e.g., an alkylene group of $C_1$-$C_{10}$. For example, the alkylene group may be a methylene group, an ethylene group, and a t-butylene group.

In $L^1$, the alkoxyl group may be, e.g., an alkoxyl group of $C_1$-$C_{10}$. For example, the alcoholyl group may be methoxy, t-butoxy, and the like.

In $L^1$, the alkylthio group may be, e.g., an alkylthio group of $C_1$-$C_{10}$. For example, the alkylthio group may be a methylthio group and a t-butylthio group.

$L^2$ and $L^3$ are, independently of each other, selected from the group consisting of a single bond; an arylene group of $C_6$-$C_{20}$; a heterocyclic group of $C_2$-$C_{20}$ including at least one heteroatom selected from the group consisting of O, N, S, Si, and P; an aliphatic ring group of $C_3$-$C_{20}$; an alkylene group of $C_1$-$C_{10}$; an alkoxyl group of $C_1$-$C_{10}$; an alkylthio group of $C_1$-$C_{10}$; and a combination thereof.

When $L^2$ and $L^3$ are selected as a combination thereof, it means that a plurality of combinations of the aforementioned divalent radicals are selected, and may refer to a form in which two or more independently selected radicals, e.g., first radical-second radical, are connected to each other.

In $L^2$ and $L^3$, the arylene group may be, e.g., an arylene group of $C_6$-$C_{18}$. For example, the arylene group may be phenyl, biphenyl, naphthyl, and terphenyl.

In $L^2$ and $L^3$, the heterocyclic group may be, e.g., a heterocyclic group of $C_2$-$C_{18}$.

For example, the heterocyclic group may be pyridine, pyrimidine, benzofuran, benzothiophene, dioxin, dibenzofuran, dibenzothiophene, naphthobenzothiophene, and naphthobenzofuran.

In $L^2$ and $L^3$, the alkylene group may be, e.g., an alkylene group of $C_1$-$C_5$. For example, the alkylene group may be a methylene group, an ethylene group, and a t-butylene group.

In $L^2$ and $L^3$, the alkoxyl group may be, e.g., an alkoxyl group of $C_1$-$C_5$. For example, the alcoholyl group may be methoxy, t-butoxy, and the like.

In $L^2$ and $L^3$, the alkylthio group may be, e.g., an alkylthio group of $C_1$-$C_5$. For example, the alkylthio group may be a methylthio group and a t-butylthio group.

R' and R" are, independently of each other, chemical formulas 2 to 4 below.

[Chemical formula 2]

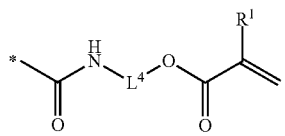

In chemical formula 2 above, $R^1$ is, independently of each other, a hydrogen or methyl group.

In chemical formula 2 above, $L^4$ is, independently of each other, selected from the group consisting of an alkylene group of $C_1$-$C_{20}$; an alkoxyl group of $C_1$-$C_{20}$; an alkylthio group of $C_1$-$C_{20}$; and chemical formula 5 below.

When $L^4$ is an alkylene group, $L^4$ may be, e.g., an alkylene group of $C_1$-$C_{10}$. For example, $L^4$ may be a methylene group, an ethylene group, and a t-butylene group.

When $L^4$ is an alkoxyl group, $L^4$ may be, e.g., an alkoxyl group of $C_1$-$C_{10}$. For example, $L^4$ may be methoxy, t-butoxy, and the like.

When $L^4$ is an alkylthio group, $L^4$ may be, e.g., an alkylthio group of $C_1$-$C_{10}$. For example, $L^4$ may be a methylthio group and a t-butylthio group.

In $L^4$ above, each of the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$.

[Chemical formula 3]

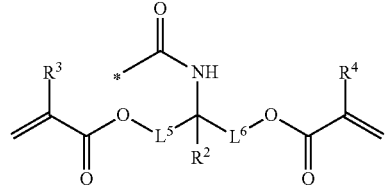

In chemical formula 3 above, $R^2$ to $R^4$ are, independently of each other, a hydrogen or methyl group.

In chemical formula 3 above, $L^5$ and $L^6$ are, independently of each other, selected from the group consisting of an alkylene group of $C_1$-$C_{20}$; an alkoxyl group of $C_1$-$C_{20}$; an alkylthio group of $C_1$-$C_{20}$; and chemical formula 5.

When $L^5$ and $L^6$ are alkylene groups, $L^5$ and $L^6$ may be, independently of each other, alkylene groups of $C_1$-$C_{10}$. For example, $L^5$ and $L^6$ may be, independently of each other, a methylene group, an ethylene group, and a t-butylene group.

When $L^5$ and $L^6$ are alkoxyl groups, $L^5$ and $L^6$ may be, independently of each other, alkoxyl groups of $C_1$-$C_{10}$. For example, $L^5$ and $L^6$ may be, independently of each other, methoxy, t-butoxy, and the like.

When $L^5$ and $L^6$ are alkylthio groups, $L^5$ and $L^6$ may be, independently of each other, alkylthio groups of $C_1$-$C_{10}$. For example, $L^5$ and $L^6$ may be, independently of each other, a methylthio group, a t-butylthio group, or the like.

In $L^5$ and $L^6$ above, each of the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$.

[Chemical formula 4]

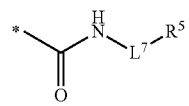

In chemical formula 4 above, $R^5$ is, independently of each other, an alkyl group of $C_1$-$C_{10}$.

In chemical formula 4 above, $L^7$ is, independently of each other, selected from the group consisting of a single bond; an alkylene group of $C_1$-$C_{20}$; an alkoxyl group of $C_1$-$C_{20}$; an alkylthio group of $C_1$-$C_{20}$; and chemical formula 5 below.

In $L^7$ above, each of the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$.

[Chemical formula 5]

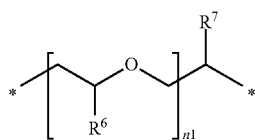

In chemical formula 5, n1 is an integer from 1 to 12.

In chemical formula 5 above, $R^6$ and $R^7$ are, independently of each other, a hydrogen or methyl group.

The ligand represented by chemical formula 1 may be represented by any one of chemical formulas 1-1 to 1-6 below.

[Chemical formula 1-1]

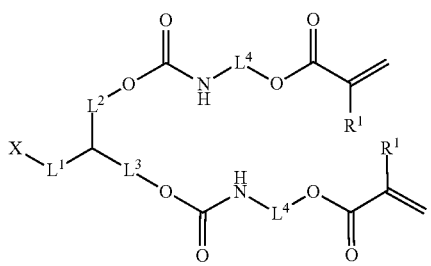

[Chemical formula 1-2]

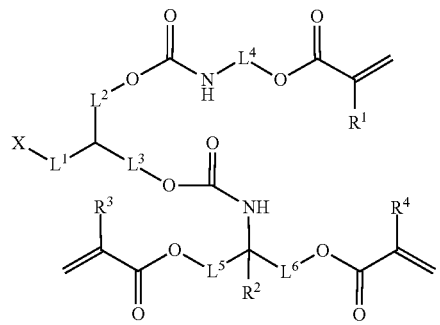

[Chemical formula 1-3]

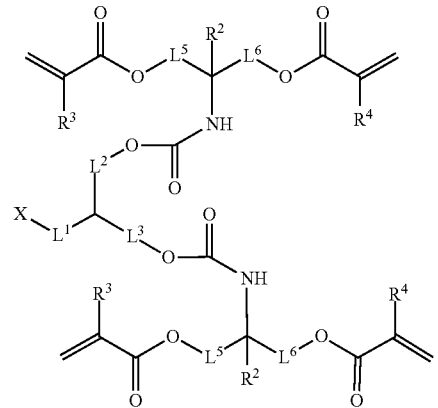

[Chemical formula 1-4]

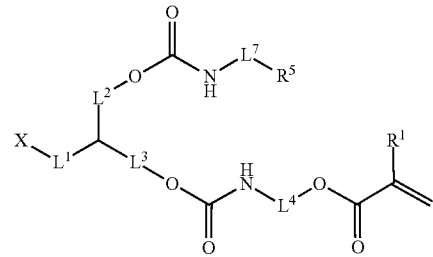

[Chemical formula 1-5]

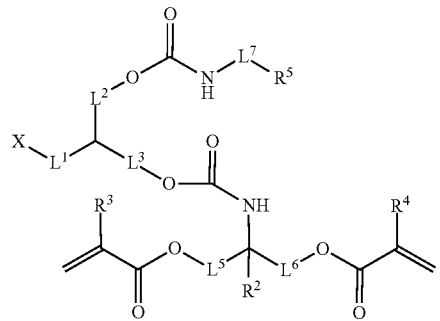

[Chemical formula 1-6]
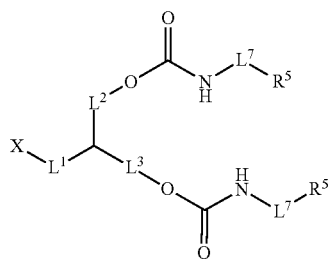
In chemical formula 1-1 to chemical formula 1-6 above, X, $L^1$, $L^2$ and $L^3$ are the same as those defined in chemical formula 1 above, and $R^1$ to $R^5$ and $L^4$ to $L^7$ are the same as those defined in chemical formulas 2 to 4 above.
The ligand represented by chemical formula 1 may be any one of the following L1 to L82, but is not limited thereto.
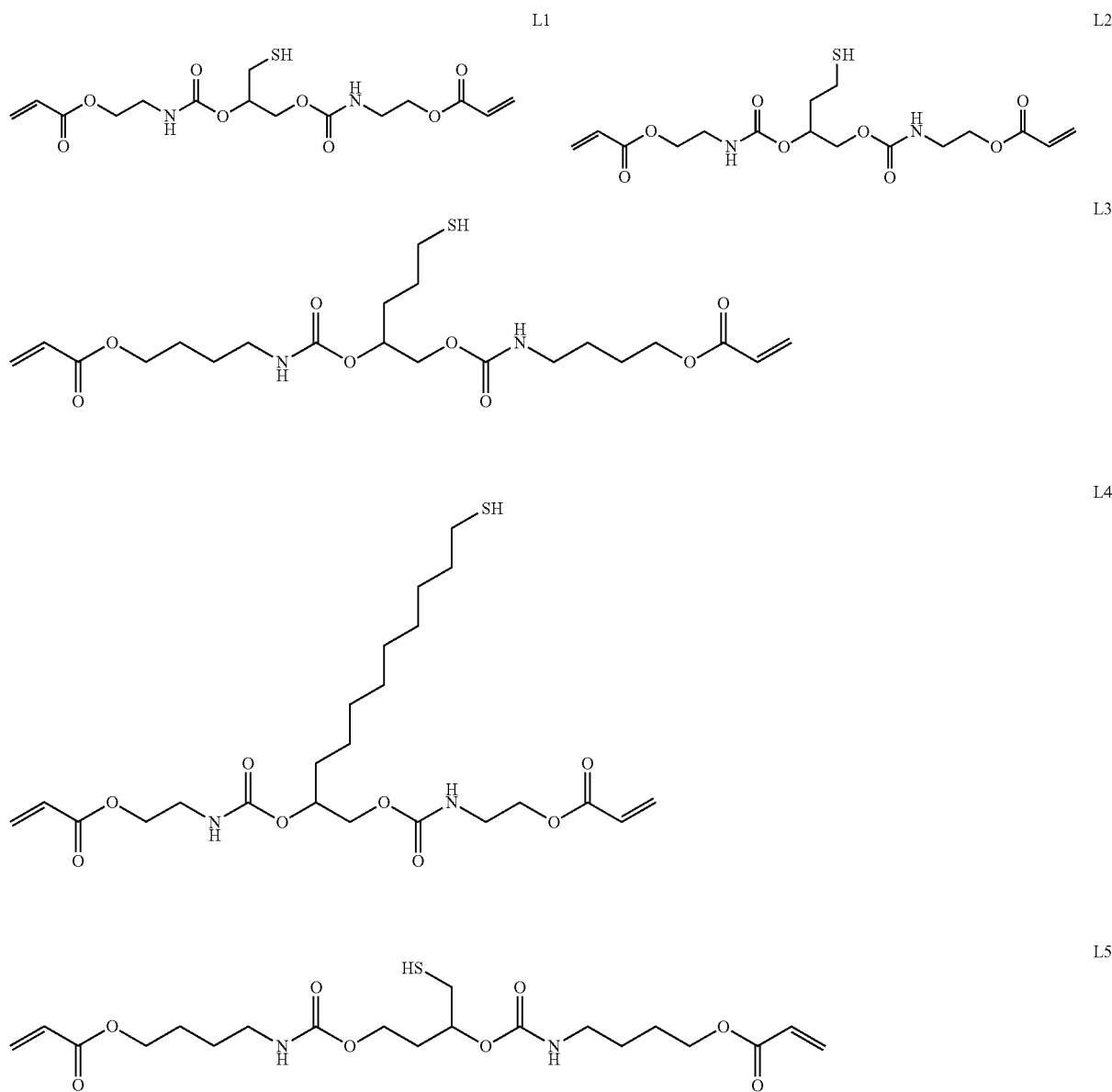

-continued
L6
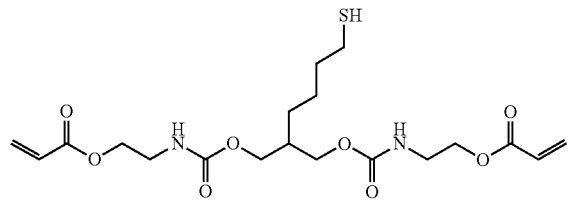
L7
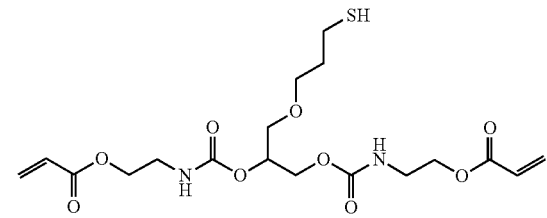
L8
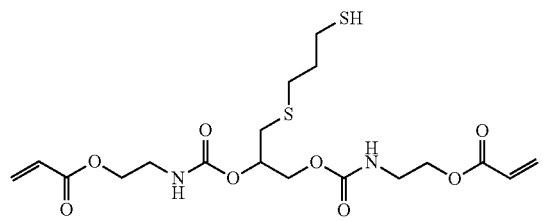
L9
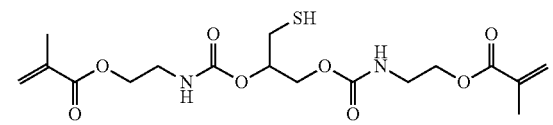
L10
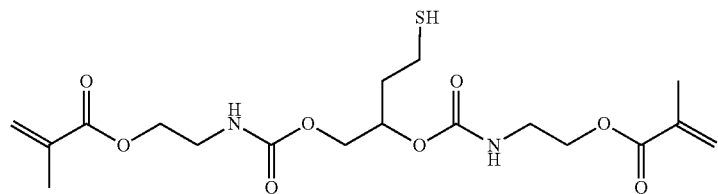
L11
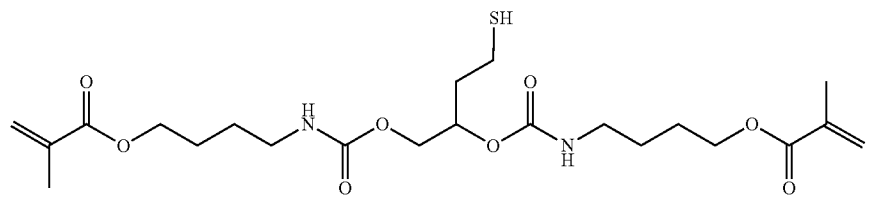
L12
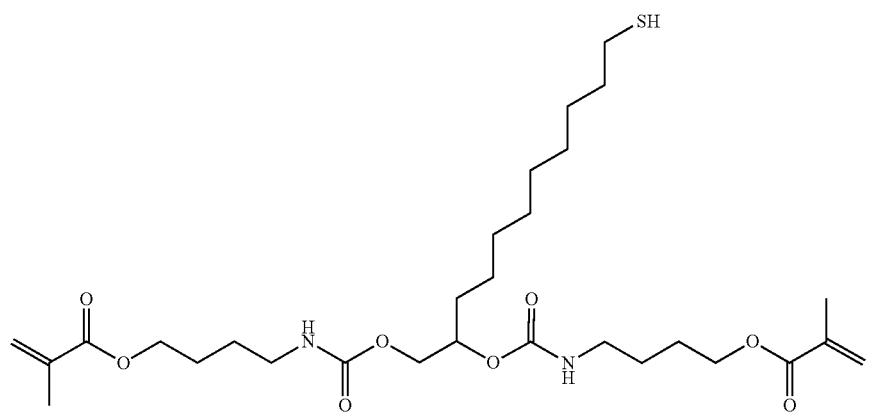
L13
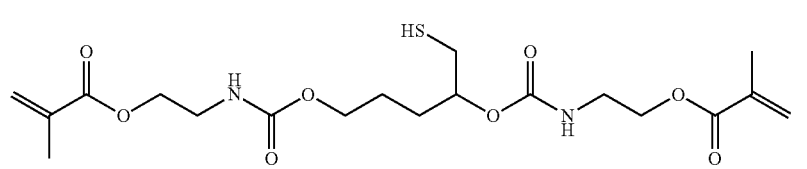

-continued
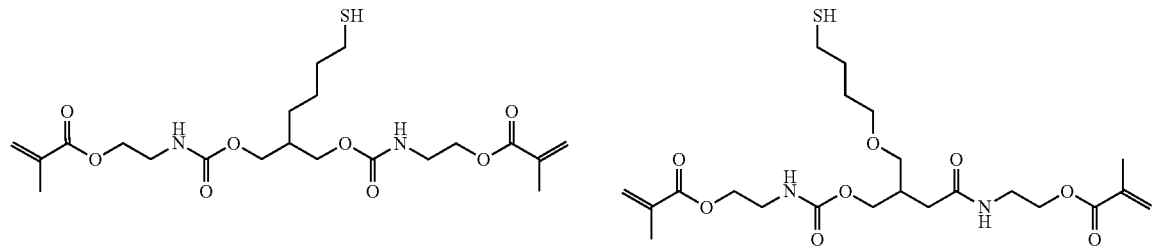
L14
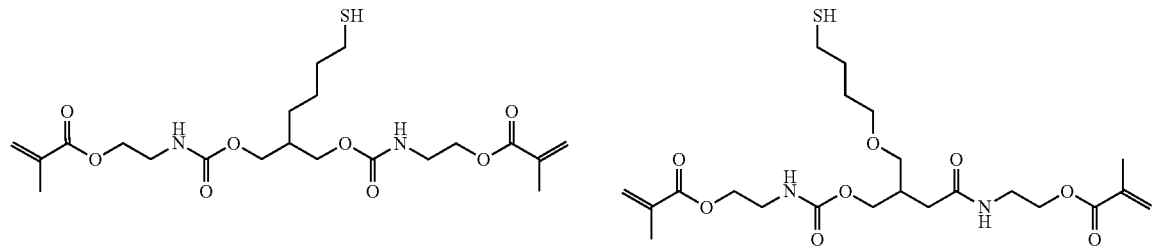
L15
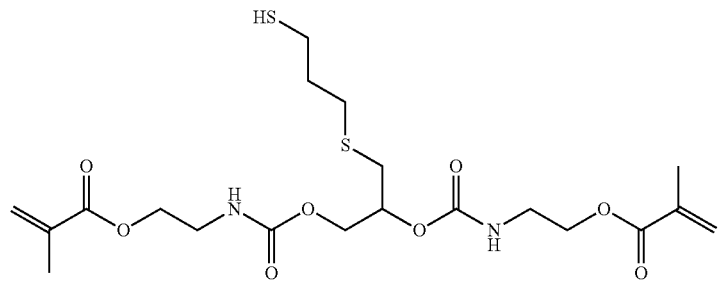
L16
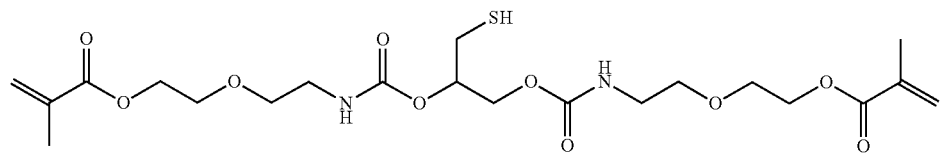
L17
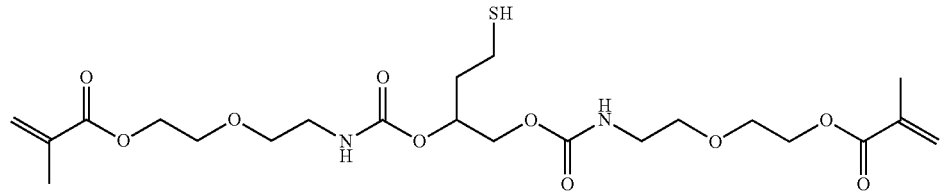
L18
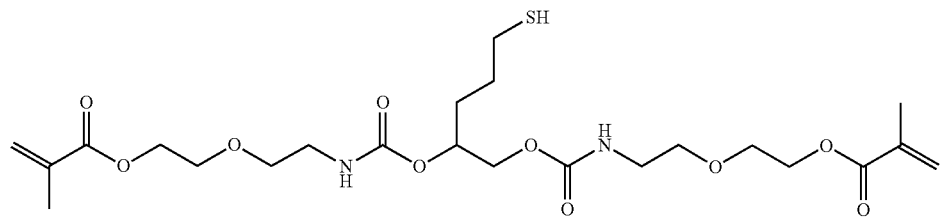
L19
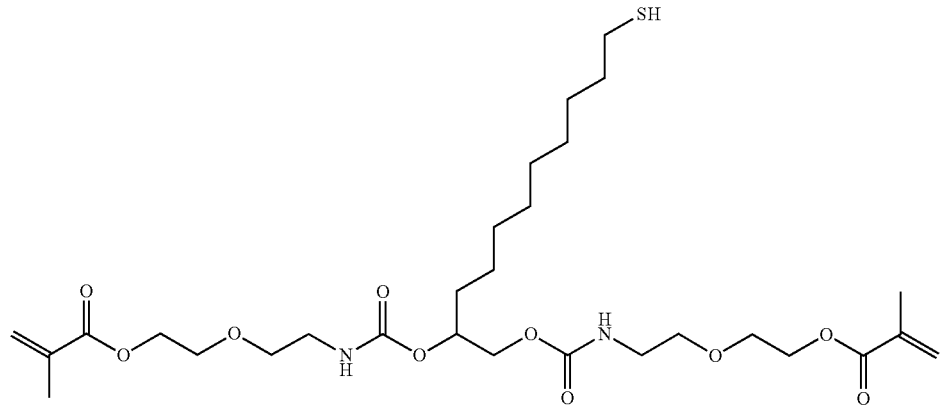
L20

-continued
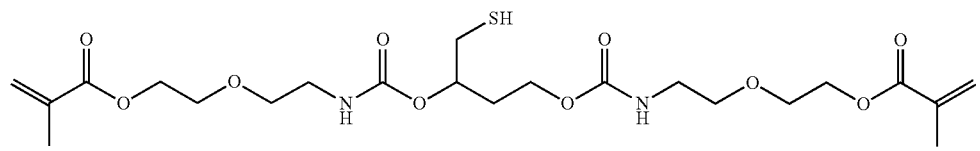
L21
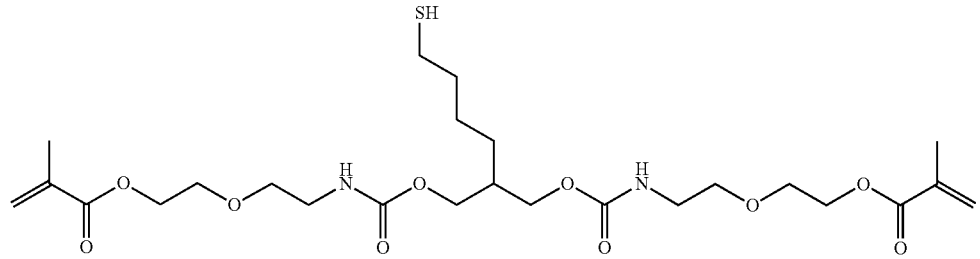
L22
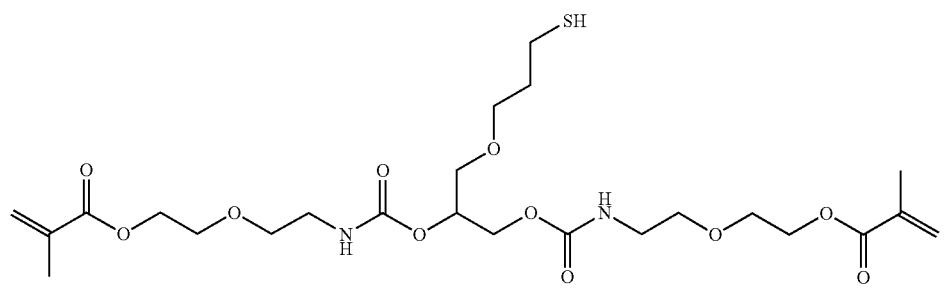
L23
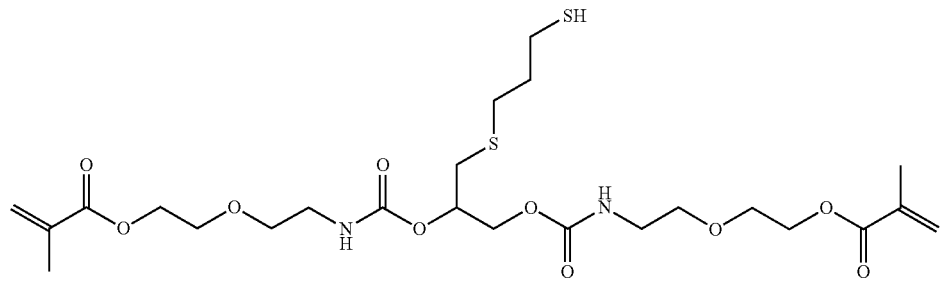
L24
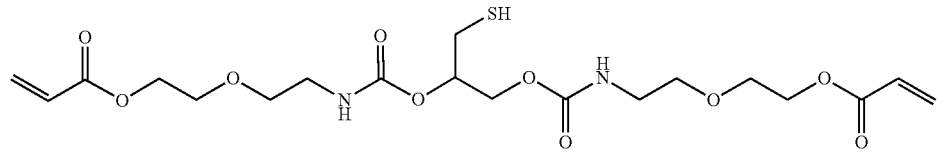
L25
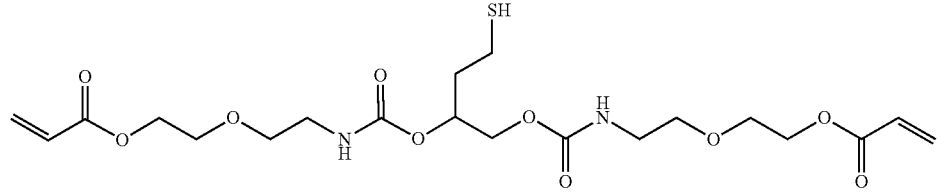
L26
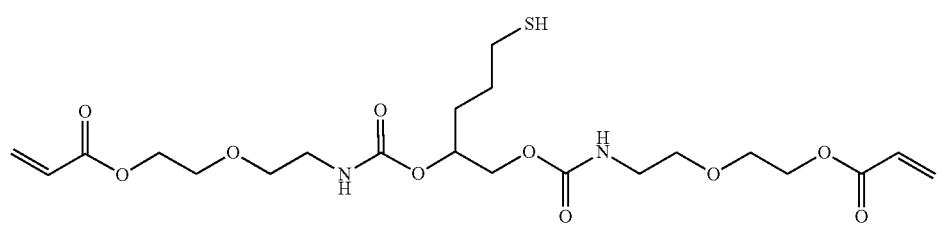
L27

-continued
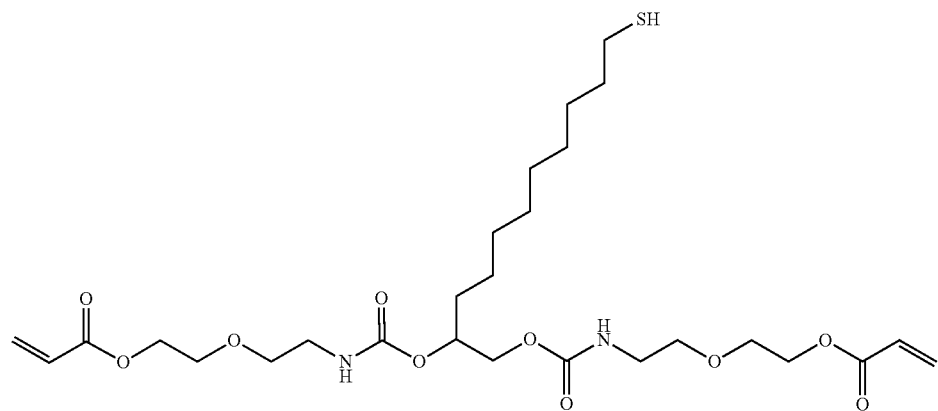
L28
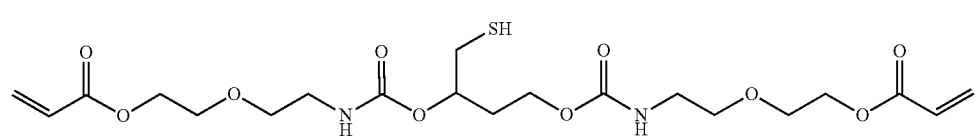
L29
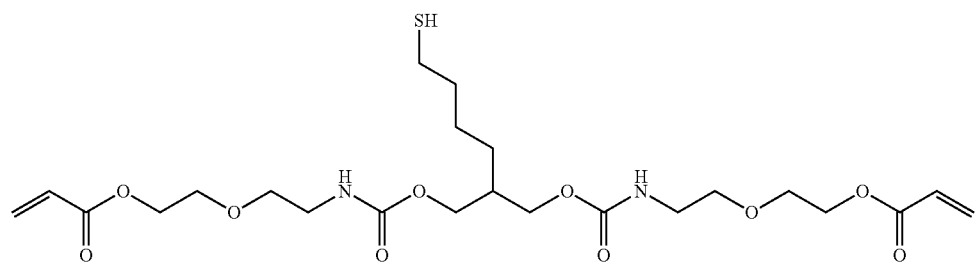
L30
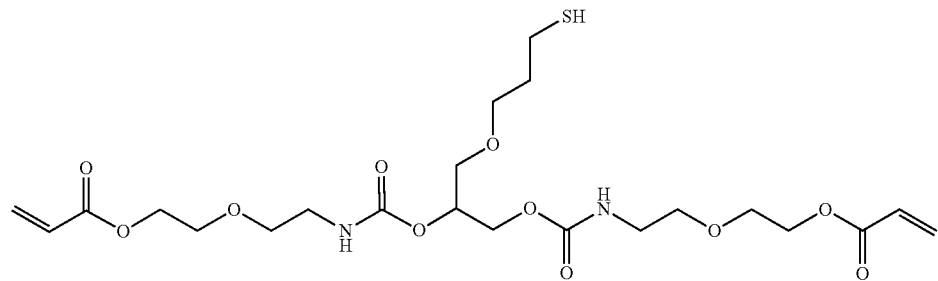
L31
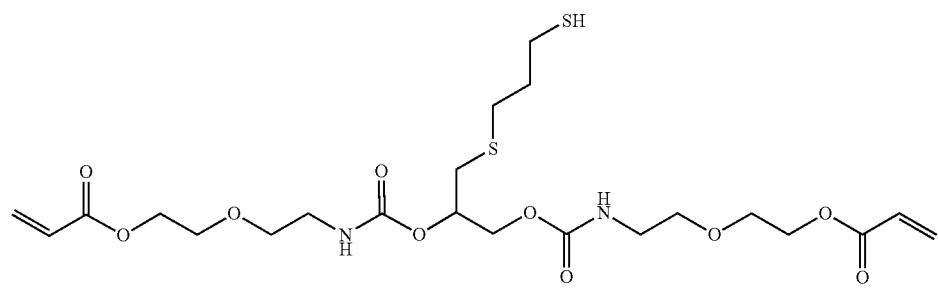
L32

-continued
L33
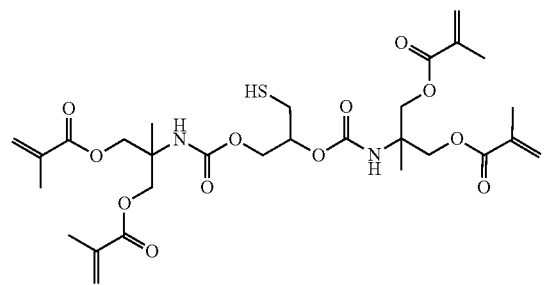
L34
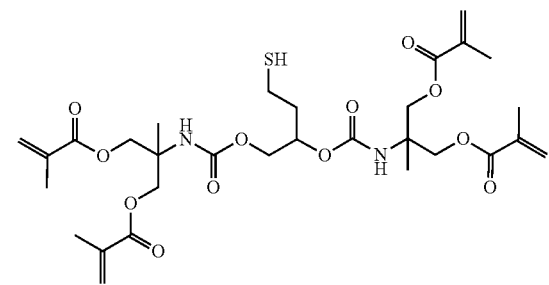
L35
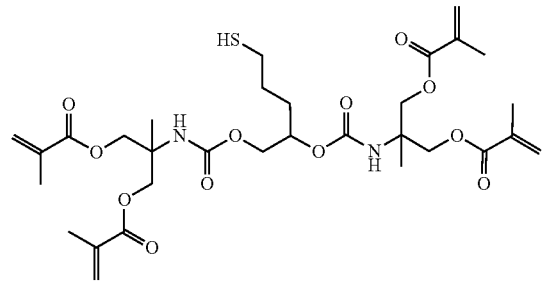
L36
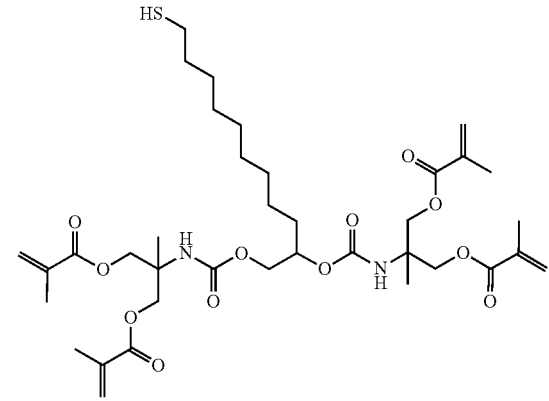
L37
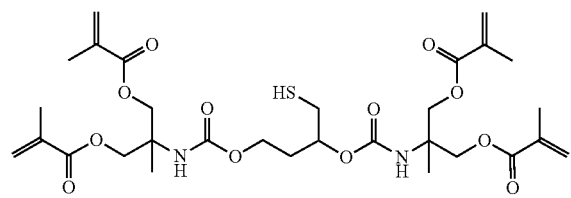
L38
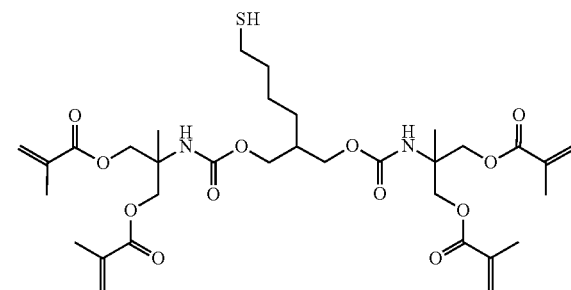
L39
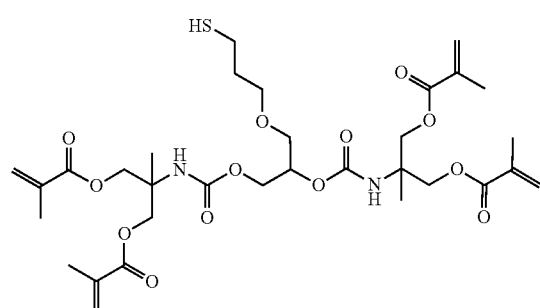
L40
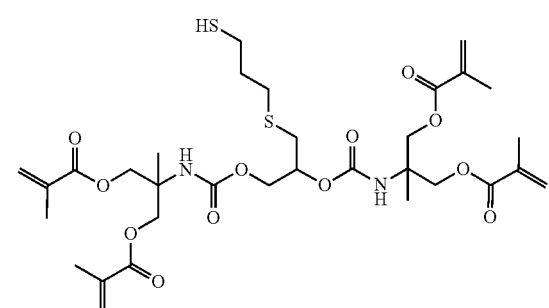
L41
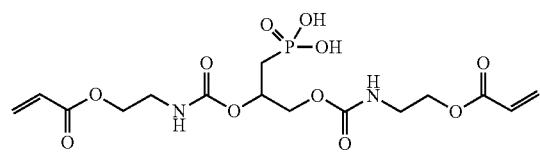
L42
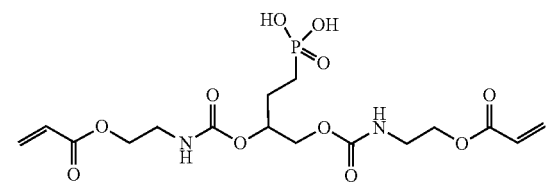

-continued
L43
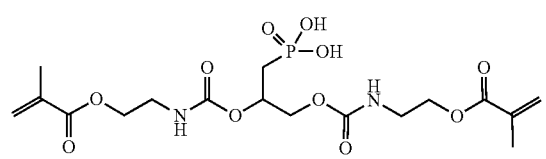
L44
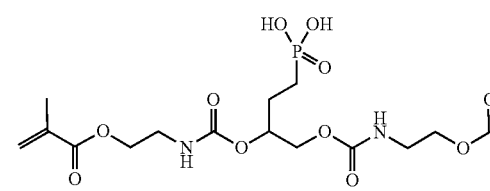
L45
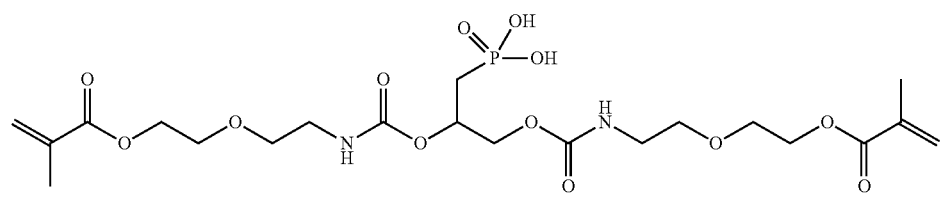
L46
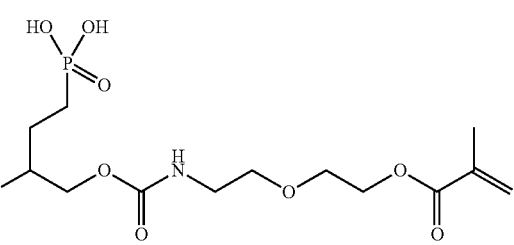
L47
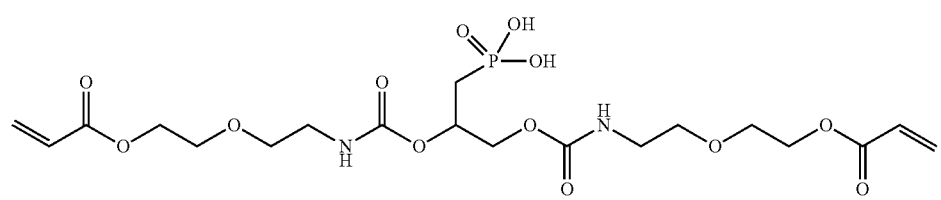
L48
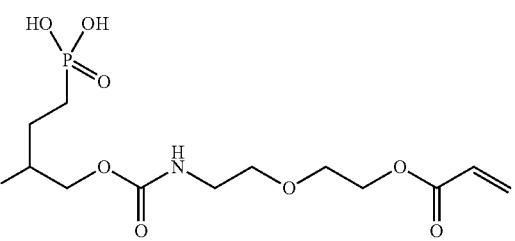
L49
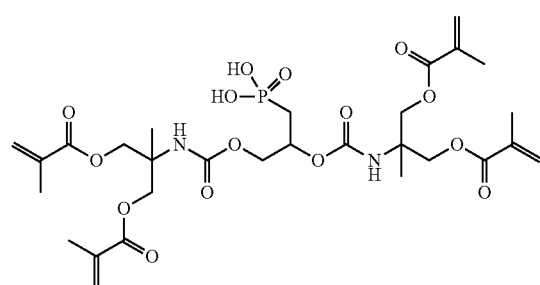
L50
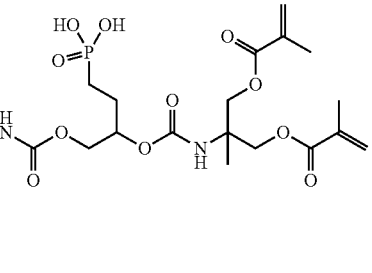
L51
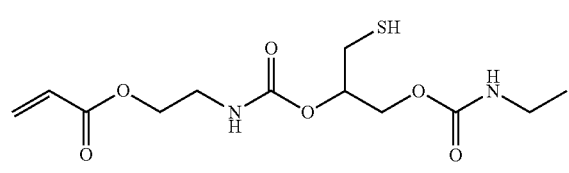
L52
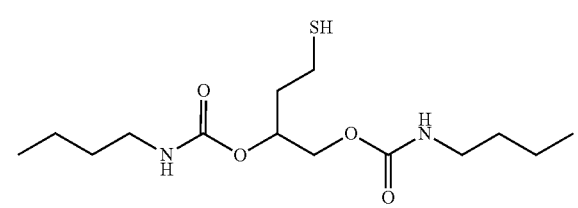

-continued
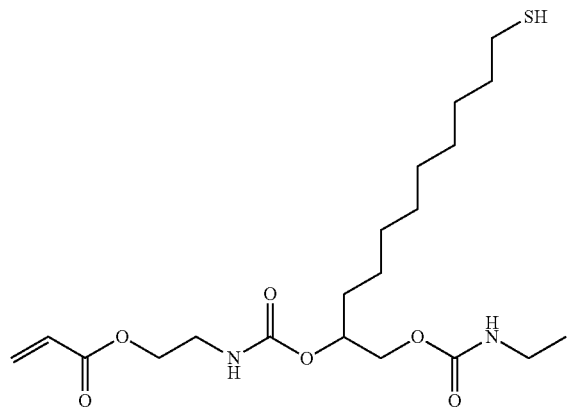
L53
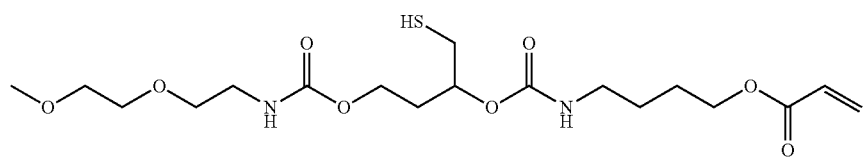
L54
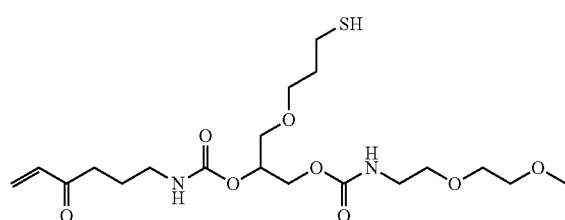
L55
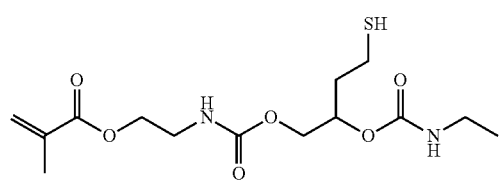
L56
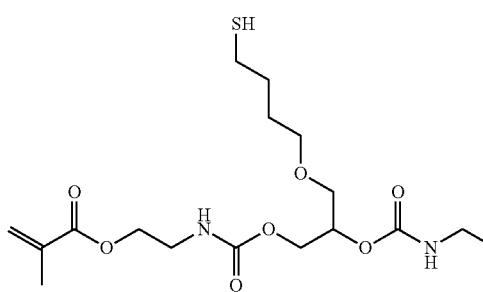
L57
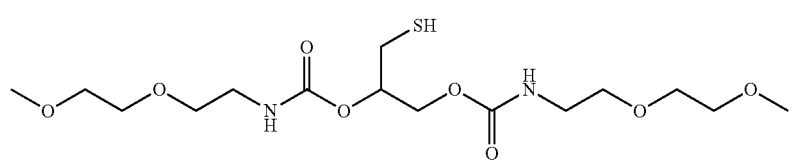
L58
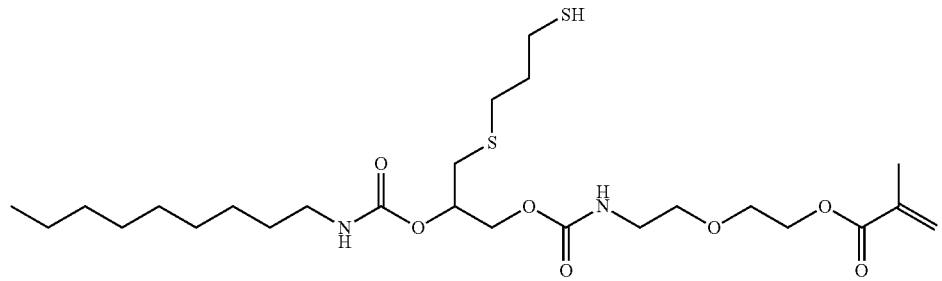
L59
L60

-continued
| L61 | L62 |
|---|---|
| 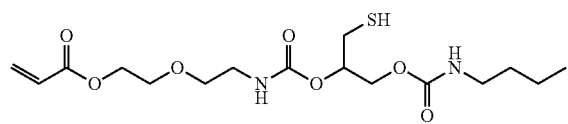 | 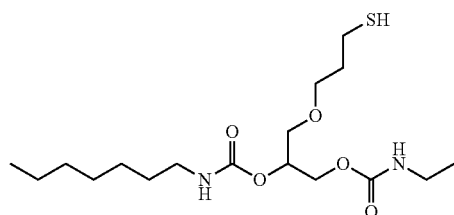 |
L63
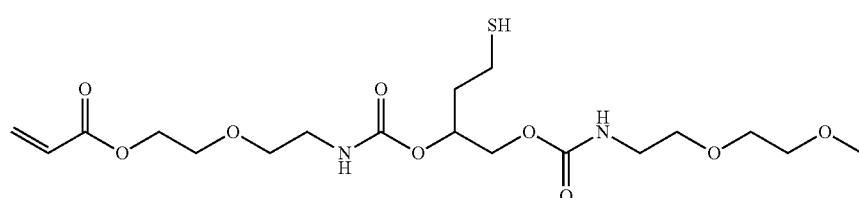
| L64 | L65 |
|---|---|
| 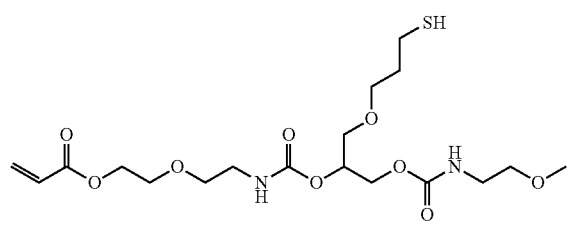 | 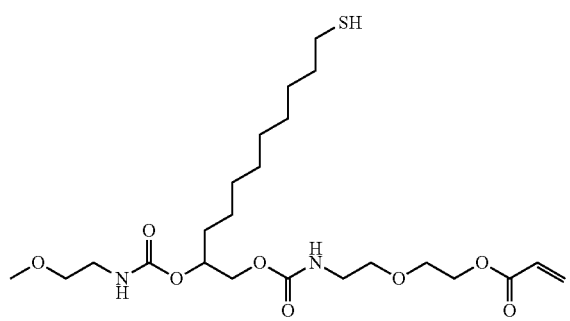 |
| L66 | L67 |
|---|---|
| 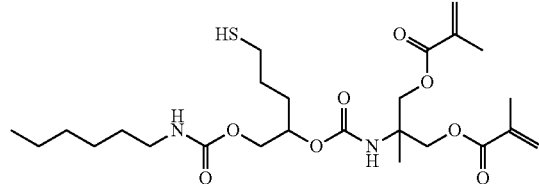 | 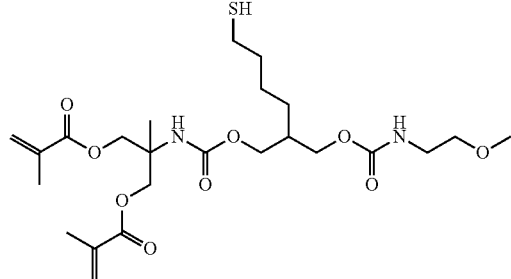 |
| L68 | L69 |
|---|---|
| 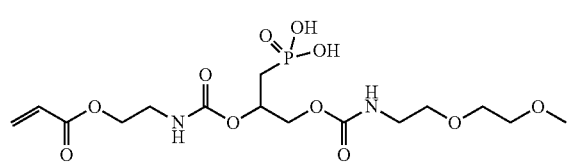 | 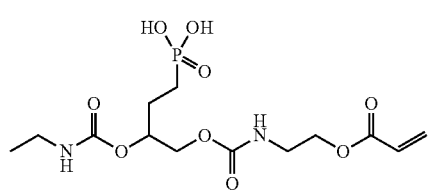 |
| L70 | L71 |
|---|---|
| 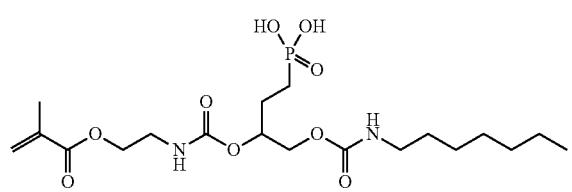 | 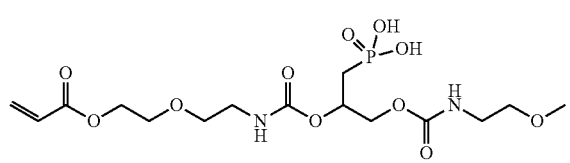 |

-continued
L72
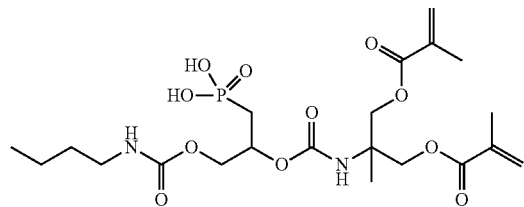
L73
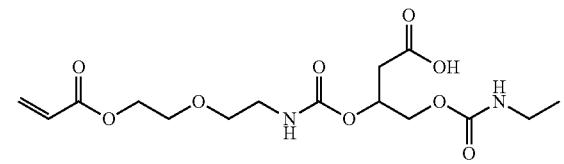
L74
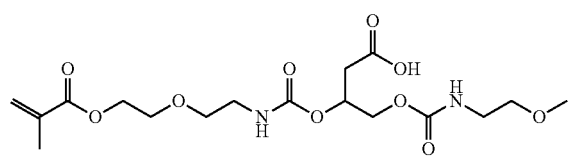
L75
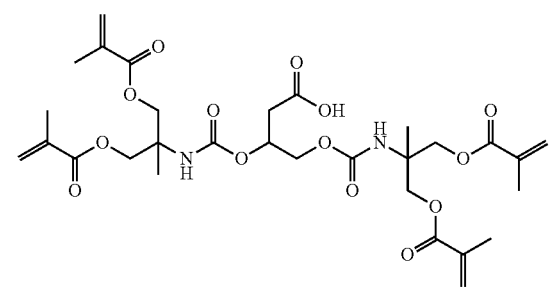
L76
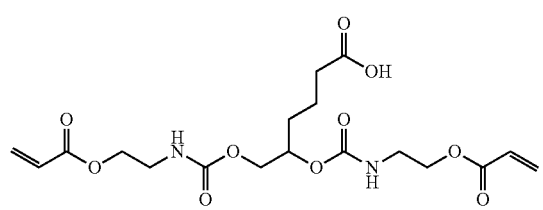
L77
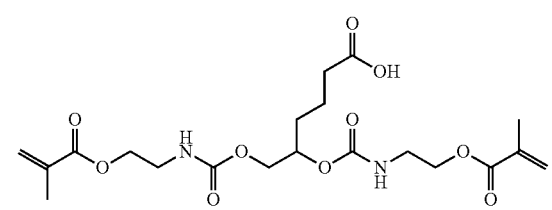
L78
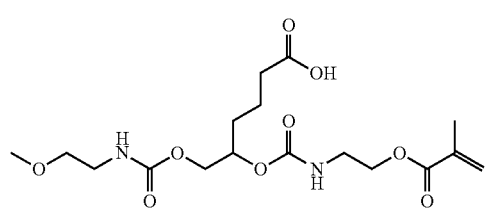
L79
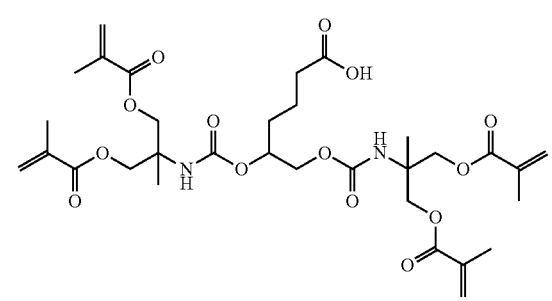
L80
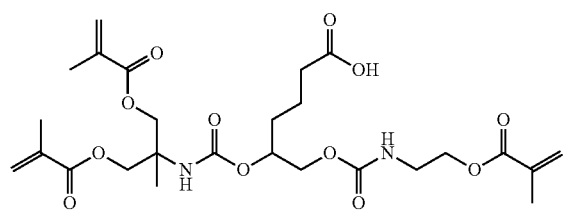
L81
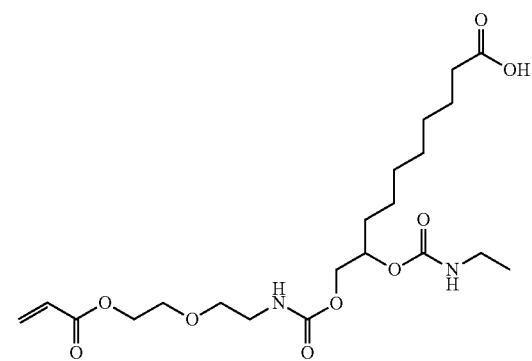

L82

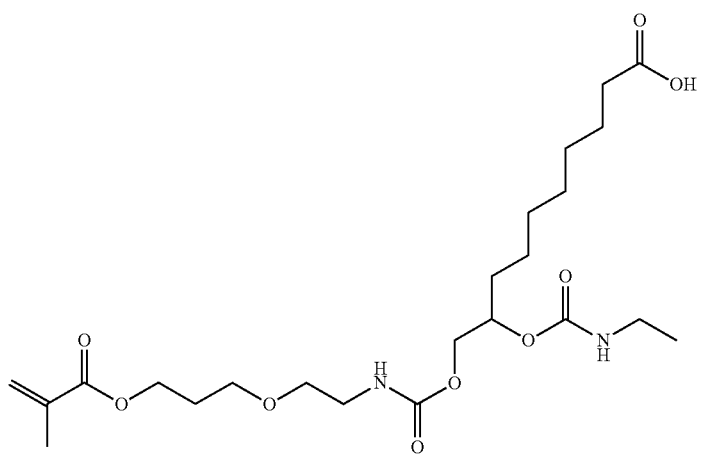

Semiconductor nanoparticles may include central particles. The central particle may have a single-layer or multi-layer structure. The central particle may be composed of a group II-VI compound, a group II-V compound, a group III-V compound, a group III-IV compound, a group III-VI compound, a group IV-VI compound, or a mixture thereof. Further, the central particle may be doped or alloyed with a dopant. The "mixture" includes not only a simple mixture of the compounds, but also a ternary compound, a quaternary compound, and a result produced by doping the mixture with a dopant.

The group II element may be one or more selected from the group consisting of Zn, Cd, Hg, and Mg, and the group III element may be one or more selected from the group consisting of Al, Ga, In, and Ti.

The group IV element may be one or more selected from the group consisting of Si, Ge, Sn, and Pb. The group VI element may be one or more selected from the group consisting of O, S, Se and Te. The group V element may be one or more selected from the group consisting of P, As, Sb, and Bi.

The group II-VI compounds may be, e.g., magnesium sulfide (MgS), magnesium selenide (MgSe), magnesium telluride (MgTe), calcium sulfide (CaS), calcium selenide (CaSe), calcium telluride (CaTe), strontium sulfide (SrS), strontium selenide (SrSe), strontium telluride (SrTe), cadmium sulfide (CdS), cadmium selenide (CdSe), cadmium telluride (CdTe), zinc sulfide (ZnS), zinc selenide (ZnSe), zinc telluride (ZnTe), mercury sulfide (HgS), mercury selenide (HgSe), or mercury telluride (HgTe).

The group II-V compounds may be, e.g., zinc phosphide ($Zn_3P_2$), zinc arsenide ($Zn_3As_2$), cadmium phosphide ($Cd_3P_2$), cadmium arsenide ($Cd_3As_2$), cadmium nitride ($Cd_3N_2$), or zinc nitride ($Zn_3N_2$).

The group III-V compounds may be, e.g., boron phosphide (BP), aluminum phosphide (AlP), aluminum arsenide (AlAs), aluminum antimonide (AlSb), gallium nitride (GaN), gallium phosphide (GaP), gallium arsenide (GaAs), gallium antimonide (GaSb), indium nitride (InN), indium phosphide (InP), indium arsenide (InAs), indium antimonide (InSb), aluminum nitride (AlN), or boron nitride (BN).

The group III-IV compounds may be, e.g., boron carbide ($B_4C$), aluminum carbide ($Al_4C_3$), or gallium carbide ($Ga_4C$).

The group III-VI compounds may be, e.g., aluminum sulfide ($Al_2S_3$), aluminum selenide ($Al_2Se_3$), aluminum telluride ($Al_2Te_3$), gallium sulfide ($Ga_2S_3$), gallium selenide ($Ga_2Se_3$), indium sulfide ($In_2S_3$), indium selenide ($In_2Se_3$), gallium telluride ($Ga_2Te_3$), or indium telluride ($In_2Te_3$).

The group IV-VI compounds may be, e.g., lead sulfide (PbS), lead selenide (Pb Se), lead telluride (PbTe), tin sulfide (SnS), tin selenide (SnSe), or tin telluride (SnTe).

When the central particle has a multilayer structure, e.g., the central particle may include a core/shell structure. In this case, the core and shell of the central particle may be formed of a group II-IV compound, a group II-V compound, a group III-V compound, a group III-IV compound, a group III-VI compound, a group IV-VI compound, or a mixture thereof. The core or shell of the central atom may be doped or alloyed with a dopant, and the compound constituting the core and the compound constituting the shell may be different from each other. For example, the central particle may have a CdZnS/ZnS (core/shell) structure having a core containing CdZnS and a shell containing ZnS. As another example, the central particle may have an InZnP/ZnSeS (core/shell) structure having a core containing InZnP and a shell containing ZnSeS.

From another point of view, when the central particle has a multi-layer structure, e.g., the central particle may have a core/multi-shell structure having at least two or more shells. In this case, the core and shell of the central particle may be formed of a group II-IV compound, a group II-V compound, a group III-V compound, a group III-IV compound, a group III-VI compound, a group IV-VI compound, or a mixture thereof. The core or shell of the central atom may be doped or alloyed with a dopant, and the compound constituting the core and the compound constituting the shell may be different from each other. For example, the central particle may have a CdZnS/ZnS/ZnS (core/first shell/second shell) structure having a core containing CdZnS, a first shell surrounding the surface of the core and containing ZnS, and a second shell surrounding the surface of the first shell and containing ZnS.

The central particle may have a single layer rather than a multilayer structure (core/shell structure) and, as an example, may be formed of only group II-IV compounds.

The central particle may further include a cluster molecule as a seed. The cluster molecule is a compound serving as a seed during the process of preparing the central particle, and the central particle may be formed by growing precursors of compounds constituting the central particle on the cluster molecule.

The particle size of the semiconductor nanoparticles may be 1 nm to 30 nm, or 5 nm to 15 nm.

The semiconductor nanoparticle-ligand complex according to embodiments of the present invention may further include other ligands in addition to the ligand represented by chemical formula 1. For example, an alkyl having 6 to 30 carbon atoms, (poly)ethyleneoxy, an amine compound having an aryl group, a thiol compound, a carboxylic acid compound, or the like may be included as a ligand. Examples of the amine compound having an alkyl group include hexadecylamine or octylamine. Another example of the ligand may be an amine-based compound or a carboxylic acid compound having an alkenyl group having 6 to 30 carbon atoms. Alternatively, other examples of the ligand may include phosphine compounds including trioctylphosphine, triphenolphosphine, t-butylphosphine, and the like; phosphine oxides, such as trioctylphosphine oxide; and pyridine or thiophene.

The types of ligands that may be used together with the ligands proposed in the present invention are not limited to those exemplified above.

The ligand of the semiconductor nanoparticle-ligand complex may prevent adjacent central particles from being aggregated and quenched. The ligand binds to the central particle and may have a hydrophobic property.

In another aspect, according to embodiments of the present invention, a method for preparing a semiconductor nanoparticle-ligand complex may be provided.

A method for preparing a semiconductor nanoparticle-ligand complex may include a first surface modification step of surface-modifying semiconductor nanoparticles and a second surface-modifying step of surface-modifying the semiconductor nanoparticles surface-modified by the first surface-modifying step.

In the description of the method for manufacturing a semiconductor nanoparticle-ligand complex according to embodiments of the present invention, unless otherwise specified, the semiconductor nanoparticles are the same as the semiconductor nanoparticles described above in connection with the semiconductor nanoparticle-ligand complex according to embodiments of the present invention, and are thus omitted from the description.

The first surface modification step is the step of surface-modifying the surface of the semiconductor nanoparticles with a compound represented by chemical formula 6 below.

[Chemial formula 6]

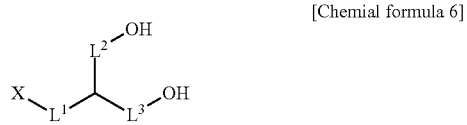

Hereinafter, chemical formula 6 is described.

X is a functional group bonded to the surface of semiconductor nanoparticles, and is —S(H), —P=O(OH)$_2$ or —COOH.

$L^1$ is selected from the group consisting of: an arylene group of $C_6$-$C_{30}$; a heterocyclic group of $C_2$-$C_{30}$ including at least one heteroatom selected from the group consisting of O, N, S, Si, and P; an alkylene group of $C_1$-$C_{20}$; an alkoxyl group of $C_1$-$C_{20}$; an alkylthio group of $C_1$-$C_{20}$; and a combination thereof.

When $L^1$ is selected as a combination thereof, it means that a plurality of combinations of the aforementioned divalent radicals are selected, and may refer to a form in which two or more independently selected radicals, e.g., first radical-second radical, are connected to each other.

The arylene group in $L^1$ may be, e.g., an arylene group of $C_6$-$C_{20}$ or an arylene group of $C_6$-$C_{18}$. For example, the arylene group may be phenyl, biphenyl, naphthyl, and terphenyl.

The heterocycle in $L^1$ may be, e.g., a heterocyclic group of $C_2$-$C_{20}$ or a heterocyclic group of $C_2$-$C_{18}$. For example, the heterocyclic group may be pyridine, pyrimidine, benzofuran, benzothiophene, dioxin, dibenzofuran, dibenzothiophene, naphthobenzothiophene, and naphthobenzofuran.

The alkylene group in $L^1$ may be, e.g., an alkylene group of $C_1$-$C_{10}$. For example, the alkylene group may be a methylene group, an ethylene group, and a t-butylene group.

In $L^1$, the alkoxyl group may be, e.g., an alkoxyl group of $C_1$-$C_{10}$. For example, the alcoholyl group may be methoxy, t-butoxy, and the like.

In $L^1$, the alkylthio group may be, e.g., an alkylthio group of $C_1$-$C_{10}$. For example, the alkylthio group may be a methylthio group and a t-butylthio group.

$L^2$ and $L^3$ are, independently of each other, selected from the group consisting of a single bond; an arylene group of $C_6$-$C_{20}$; a heterocyclic group of $C_2$-$C_{20}$ including at least one heteroatom selected from the group consisting of O, N, S, Si, and P; an aliphatic ring group of $C_3$-$C_{20}$; an alkylene group of $C_1$-$C_{10}$; an alkoxyl group of $C_1$-$C_{10}$; an alkylthio group of $C_1$-$C_{10}$; and a combination thereof.

When $L^2$ and $L^3$ are selected as a combination thereof, it means that a plurality of combinations of the aforementioned divalent radicals are selected, and may refer to a form in which two or more independently selected radicals, e.g., first radical-second radical, are connected to each other.

In $L^2$ and $L^3$, the arylene group may be, e.g., an arylene group of $C_6$-$C_{18}$. For example, the arylene group may be phenyl, biphenyl, naphthyl, and terphenyl.

In $L^2$ and $L^3$, the heterocyclic group may be, e.g., a heterocyclic group of $C_2$-$C_{18}$.

For example, the heterocyclic group may be pyridine, pyrimidine, benzofuran, benzothiophene, dioxin, dibenzofuran, dibenzothiophene, naphthobenzothiophene, and naphthobenzofuran.

In $L^2$ and $L^3$, the alkylene group may be, e.g., an alkylene group of $C_1$-$C_5$. For example, the alkylene group may be a methylene group, an ethylene group, and a t-butylene group.

In $L^2$ and $L^3$, the alkoxyl group may be, e.g., an alkoxyl group of $C_1$-$C_5$. For example, the alcoholyl group may be methoxy, t-butoxy, and the like.

In $L^2$ and $L^3$, the alkylthio group may be, e.g., an alkylthio group of $C_1$-$C_5$. For example, the alkylthio group may be a methylthio group and a t-butylthio group.

The second surface modification step is the step of performing surface modification by reacting the alcohol group (—OH) of chemical formula 6 of the semiconductor nanoparticles surface-modified with the compound represented by chemical formula 6 with an acrylic compound.

The acrylic compound may be represented by chemical formula 7 to chemical formula 9 below.

[Chemical formula 7]

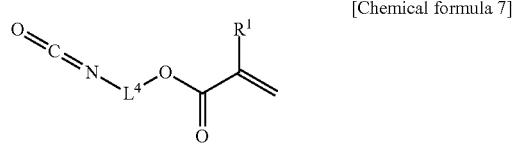

Hereinafter, chemical formula 7 is described.

$R^1$ is a hydrogen or methyl group.

$L^4$ is selected from the group consisting of an alkylene group of $C_1$-$C_{20}$; an alkoxyl group of $C_1$-$C_{20}$; an alkylthio group of $C_1$-$C_{20}$; and chemical formula 10 below.

When $L^4$ is an alkylene group, $L^4$ may be, e.g., an alkylene group of $C_1$-$C_{10}$. For example, $L^4$ may be a methylene group, an ethylene group, and a t-butylene group.

When $L^4$ is an alkoxyl group, $L^4$ may be, e.g., an alkoxyl group of $C_1$-$C_{10}$. For example, $L^4$ may be methoxy, t-butoxy, and the like.

When $L^4$ is an alkylthio group, $L^4$ may be, e.g., an alkylthio group of $C_1$-$C_{10}$. For example, $L^4$ may be a methylthio group and a t-butylthio group.

In $L^4$ above, each of the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$.

[Chemical formula 8]

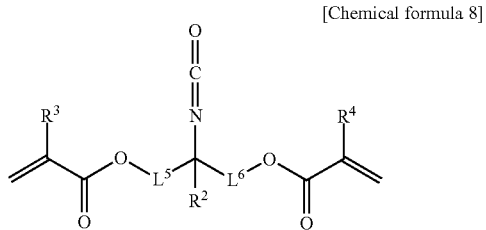

Chemical formula 8 is described.

$R^2$ to $R^4$ are, independently of each other, a hydrogen or methyl group.

$L^5$ and $L^6$ are, independently of each other, selected from the group consisting of an alkylene group of $C_1$-$C_{20}$; an alkoxyl group of $C_1$-$C_{20}$; an alkylthio group of $C_1$-$C_{20}$; and chemical formula 10.

When $L^5$ and $L^6$ are alkylene groups, $L^5$ and $L^6$ may be, independently of each other, alkylene groups of $C_1$-$C_{10}$. For example, $L^5$ and $L^6$ may be, independently of each other, a methylene group, an ethylene group, and a t-butylene group.

When $L^5$ and $L^6$ are alkoxyl groups, $L^5$ and $L^6$ may be, independently of each other, alkoxyl groups of $C_1$-$C_{10}$. For example, $L^5$ and $L^6$ may be, independently of each other, methoxy, t-butoxy, and the like.

When $L^5$ and $L^6$ are alkylthio groups, $L^5$ and $L^6$ may be, independently of each other, alkylthio groups of $C_1$-$C_{10}$. For example, $L^5$ and $L^6$ may be, independently of each other, a methylthio group, a t-butylthio group, or the like.

In $L^5$ and $L^6$ above, each of the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$.

[Chemical formula 9]

Chemical formula 9 is described.

$R^5$ is hydrogen or an alkyl group of $C_1$-$C_{10}$.

$L^7$ is selected from the group consisting of a single bond, an alkylene group of $C_1$-$C_{20}$; an alkoxyl group of $C_1$-$C_{20}$; an alkylthio group of $C_1$-$C_{20}$; and chemical formula 10 below.

In $L^7$ above, each of the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$.

[Chemical formula 10]

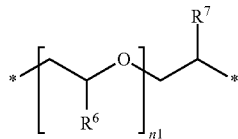

Hereinafter, chemical formula 10 is described.

n1 is an integer from 1 to 12.

$R^6$ and $R^7$ are, independently of each other, a hydrogen or methyl group.

In another aspect, according to embodiments of the present invention, a photosensitive resin composition may be provided.

The photosensitive resin composition includes (A) a semiconductor nanoparticle-ligand complex, (B) a photocrosslinkable monomer, and (C) an initiator.

In the description of the photosensitive resin composition according to embodiments of the present invention, unless otherwise specified, the semiconductor nanoparticle-ligand complex is the same as the semiconductor nanoparticle-ligand complex described above in connection with the semiconductor nanoparticle-ligand complex according to embodiments of the present invention, and is thus omitted from the description.

The photosensitive resin composition may include 10 wt % to 60 wt % of the semiconductor nanoparticle-ligand complex with respect to the total amount of the photosensitive resin composition. The lower limit of the content of the semiconductor nanoparticle-ligand complex may be 20 wt % or more or 30 wt % or more. The upper limit of the content of the semiconductor nanoparticle-ligand complex may be 50 wt % or less. When the photosensitive resin composition includes the above-described content of semiconductor nanoparticle-ligand composite, it may have a viscosity suitable for coating and inkjetting while having a sufficient light emitting effect.

The photocrosslinkable monomer may be a monofunctional ester of (meth)acrylic acid having one ethylenically unsaturated double bond or a multifunctional ester of (meth)acrylic acid having at least two ethylenically unsaturated double bonds. The multifunctional ester may be, e.g., a bifunctional ester, a trifunctional ester, or a tetrafunctional ester.

In the present invention, one type of photocrosslinkable monomer may be used or two or more types may be used in combination.

Since the photocrosslinkable monomer has the ethylenically unsaturated double bond, sufficient polymerization occurs during exposure in the pattern formation process, forming a pattern having excellent heat resistance, light resistance, and chemical resistance.

Specific examples of the photocrosslinkable monomer may include monofunctional esters, such as ethylene glycol methacrylate, methyl methacrylate, ethyl methacrylate, isopropyl methacrylate, N-butyl methacrylate, T-butyl methacrylate, hexyl methacrylate, ethylhexyl methacrylate, lauryl methacrylate, octyl methacrylate, cyclohexyl methacrylate, benzyl methacrylate, tetracyclodecyl methacrylate, N-phenylmaleimide, N-cyclohexyl maleimide, methacrylic acid, isobornyl methacrylate, styrene, vinyl acetic acid, or vinyl pyrrolidone, or multifunctional esters, such as ethylene glycol diacrylate, ethylene glycol dimethacrylate, diethylene glycol diacrylate, triethylene glycol diacrylate, triethylene glycol dimethacrylate, 1,6-hexanediol diacrylate, 1,6-hexanediol dimethacrylate, propylene glycol diacrylate, propylene glycol dimethacrylate, dipropylene glycol diacrylate, dipropylene glycol dimethacrylate, tripropylene glycol diacrylate, tripropylene glycol, dimethacrylate pentaerythritol triacrylate, dipentaerythritol pentaacrylate, dipentaerythritol hexaacrylate, bisphenol A epoxy acrylate, ethylene glycol monomethyl ether acrylate, or trimethylolpropane triacrylate, or multi-acrylates in which ethyleneoxy groups or γ or ε-lactone chains are linked thereto, but are not limited thereto.

Examples of commercially available products of the photocrosslinkable monomer are as follows.

Examples of the bifunctional ester of (meth)acrylic acid may include Aronix M-210, M-240, and M-6200 from Toagosei Kagaku Kogyo Co., Ltd., KAYARAD HDDA, HX-220, and R-604 from Nippon Kayaku Co., Ltd., and V-260, V-312, V-335 HP, V-1000, and V-802 from Osaka Yuki Kagaku Kogyo Co., Ltd.

Examples of the trifunctional ester of (meth)acrylic acid may include Aronix M-309, M-400, M-405, M-450, M-7100, M-8030, M-7100, M-8030, and M-8060 from Toagosei Kagaku Kogyo Co., Ltd., KAYARAD TMPTA, DPCA-20, DPCA-60, and DPCA-120 from Nippon Kayaku Co., Ltd., and V-295, V-300, and V-360 from Osaka Yuki Kayaku Kogyo Co., Ltd.

The photocrosslinkable monomer may be represented by chemical formula I below.

[Chemical formula I]

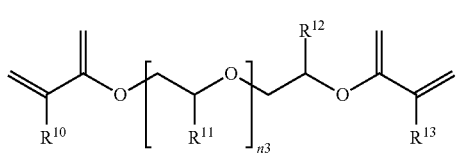

In chemical formula I above, $R^{10}$ to $R^{13}$ are, independently of each other, a hydrogen or methyl group.

In chemical formula I above, n3 is an integer from 1 to 15.

Specifically, the compound represented by chemical formula I may be one of M-1 to M-10 below, but is not limited thereto.

M-1

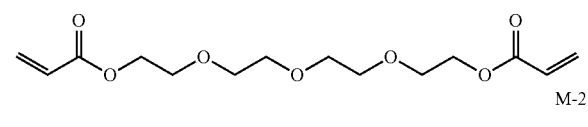

M-2

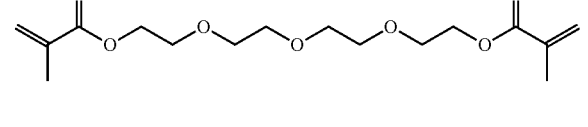

M-3

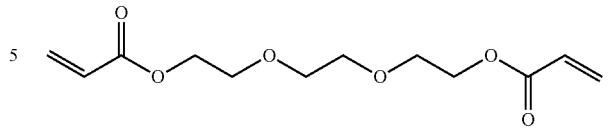

M-4

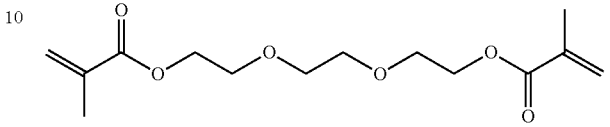

M-5

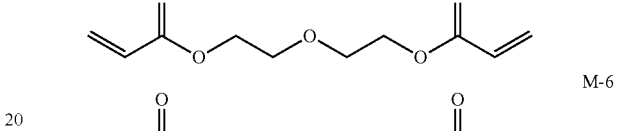

M-6

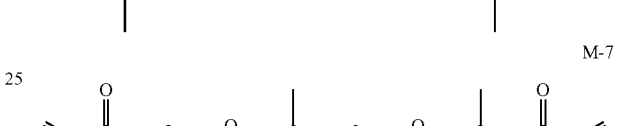

M-7

M-8

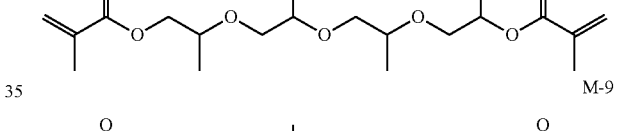

M-9

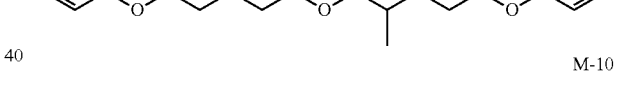

M-10

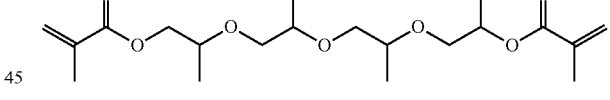

The photocrosslinkable monomer may be treated with an acid anhydride to impart better developability. The photocrosslinkable monomer may be included in 30 wt % to 90 wt %, or wt % to 85 wt %, with respect to the total amount of the photosensitive resin composition. When the photocrosslinkable monomer is included in the above range, semiconductor nanoparticles and an initiator may be sufficiently added, exhibiting a sufficient amount of light emission and high reliability.

The photosensitive resin composition may further include a binder resin.

The binder resin may be at least one selected from the group consisting of acrylic resins and epoxy resins.

The initiator may use at least one of a photopolymerization initiator and a thermal polymerization initiator.

The photopolymerization initiator may be, e.g., at least one of an acetophenone-based compound, a benzophenone-based compound, a thioxanthone-based compound, a benzoin-based compound, an oxime ester-based compound, a phosphorus-based compound, and a triazine-based compound.

Examples of the acetophenone-based compound may include 2,2'-diethoxy acetophenone, 2,2'-dibutoxy acetophenone, 2-hydroxy-2-methylpropiophenone, p-t-butyltrichloro acetophenone, p-t-butyldichloroacetophenone, 4-chloroacetophenone, 2,2'-dichloro-4-phenoxy acetophenone, 2-methyl-1-(4-(methylthio)phenyl)-2-morpholinopropane-1-one, and 2-benzyl-2-dimethylamino-1-(4-morpholinophenyl)-butan-1-one.

Examples of the benzophenone-based compound may include benzophenone, benzoyl benzoic acid, methyl benzoyl benzoate, 4-phenyl benzophenone, hydroxy benzophenone, acrylated benzophenone, 4,4'-bis(dimethylamino)benzophenone, 4,4'-bis(diethylamino)benzophenone, 4,4'-dimethylaminobenzophenone, 4,4'-dichlorobenzophenone, and 3,3'-dimethyl-2-methoxybenzophenone.

Examples of the thioxanthone-based compound may include thioxanthone, 2-chlorothioxanthone, 2-methylthioxanthone, isopropyl thioxanthone, 2,4-diethyl thioxanthone, 2,4-diisopropyl thioxanthone, and 2-chlorothioxanthone.

Examples of the benzoin-based compound may include benzoin, benzoin methyl ether, benzoin ethyl ether, benzoin isopropyl ether, benzoin isobutyl ether, and benzyldimethylketal.

Examples of the oxime ester-based compound may include 2-(o-benzoyloxime)-1-[4-(phenylthio)phenyl]-1,2-octanedione, 1-(o-acetyloxime)-1-[9-ethyl-6-(2-methylbenzoyl)-9H-carbazol-3-yl]ethanone, O-ethoxycarbonyl-α-oxyamino-1-phenylpropan-1-one, 2-dimethylamino-2-(4-methylbenzyl)-1-(4-morpholin-4-yl-phenyl)-butan-1-one, 1-(4-phenyl sulfanylphenyl)-butane-1,2-di one 2-oxime-O-benzoate, 1-(4-phenyl sulfanylphenyl)-octane-1,2-di one 2-oxime-O-benzoate, 1-(4-phenyl sulfanylphenyl)-octan-1-one oxime-O-acetate and 1-(4-phenyl sulfanylphenyl)-butan-1-one oxime-O-acetate, 1-(4-methyl sulfanyl-phenyl)-butan-1-one oxime-O-acetate, hydroxyimino-(4-methyl sulfanyl-phenyl)-acetate ethyl ester-O-acetate, and hydroxyimino-(4-methyl sulfanyl-phenyl)-acetate ethyl ester-O-benzoate.

Examples of the phosphorus-based compound may include diphenyl (2,4,6-trimethylbenzoyl) phosphine oxide, benzyl (diphenyl) phosphine oxide, and diphenyl (2,4,6-trimethylbenzoyl) phosphine oxide.

Examples of the triazine-based compound may include 2,4,6-trichloro-s-triazine, 2-phenyl 4,6-bis(trichloromethyl)-s-triazine, 2-(3',4'-dimethoxystyryl)-4,6-bis (trichloromethyl)-s-triazine, 2-(4'-methoxynaphthyl)-4,6-bis (trichloromethyl)-s-triazine, 2-(p-methoxyphenyl)-4,6-bis (trichloromethyl)-s-triazine, 2-(p-tolyl)-4,6-bis (trichloromethyl)-s-triazine, 2-biphenyl 4,6-bis (trichloromethyl)-s-triazine, bis(trichloromethyl)-6-styryl-s-triazine, 2-(naphthol-yl)-4,6-bis(trichloromethyl)-s-tri azine, 2-(4-methoxynaphthol-yl)-4,6-s(trichloromethyl)-s-triazine, 2-4-tri chloromethyl (piperonyl)-6-triazine, and 2-4-trichloromethyl (4'-m ethoxy styryl)-6-triazine.

As the photopolymerization initiator, a carbazole-based compound, a diketone compound, a sulfonium borate-based compound, a diazo-based compound, an imidazole-based compound, or a biimidazole-based compound may be used in addition to the above-described compound.

As the thermal polymerization initiator, a peroxide-based compound or an azobis-based compound may be used.

Examples of the peroxide-based compounds may include ketone peroxides, such as methyl ethyl ketone peroxide, methylisobutyl ketone peroxide, cyclohexanone peroxide, methylcyclohexanone peroxide, and acetylacetone peroxide; diacyl peroxides, such as isobutyryl peroxide, 2,4-dichlorobenzoyl peroxide, o-methylbenzoyl peroxide, and bi s-3,5,5-trimethylhexanoyl peroxide; hydroperoxides, such as 2,4,4,-trimethylpentyl-2-hydroperoxide, diisopropylbenzene hydroperoxide, cumene hydroperoxide, and t-butyl hydroperoxide; dialkyl peroxides, such as di cumyl peroxide, 2,5-dim ethyl-2,5-di (t-butylperoxy)hexane, 1,3-bis(t-butyloxyisopropyl)benzene, t-butylperoxyvaleric acid n-butyl ester; alkyl peresters, such as 2,4,4-trimethylpentyl peroxyphenoxyacetate, α-cumyl peroxyneodecanoate, t-butyl peroxybenzoate, di-t-butyl peroxytrimethyl adipate; and percarbonates, such as di-3-methoxybutyl peroxydicarbonate, di-2-ethylhexyl peroxydicarbonate, bi s-4-t-butylcyclohexyl peroxydicarbonate, diisopropyl peroxydicarbonate, acetylcyclohexylsulfonyl peroxide, and t-butyl peroxyarylcarbonate.

Examples of the azobis-based compound may include 1,1'-azobiscyclohexane-1-carbonitrile, 2,2'-azobis(2,4-dimethylvaleronitrile), 2,2-azobis(methylisobutyrate), 2,2'-azobis (4-methoxy-2,4-dimethylvaleronitrile), a, a'-azobis (isobutylnitrile) and 4,4'-azobis (4-cyanobalic acid).

The initiator may be used with a photosensitizer that absorbs light, becomes excited, and transfers the energy to initiate a chemical reaction.

Examples of the photosensitizer may include tetraethylene glycol bis-3-mercapto propionate, pentaerythritol tetrakis-3-mercapto propionate, and dipentaerythritol tetrakis-3-mercapto propionate.

The amount of the initiator may be 0.1 wt % to 10 wt %, or 0.1 wt % to 8 wt % with respect to the total amount of the photosensitive resin composition. When the content of the initiator meets the aforementioned range, excellent reliability may be obtained due to sufficient curing during exposure or heating in the pattern forming process using the photosensitive resin composition. The heat resistance, light resistance and chemical resistance of the pattern may be excellent, the resolution and adhesion may be excellent, and the decrease in transmittance due to the unreacted initiator may be prevented.

The photosensitive resin composition may further include a light diffuser. For example, the light diffuser may include barium sulfate, calcium carbonate, titanium dioxide, zirconia, or combinations thereof.

In this case, the content of the light diffuser may be 0.1 wt % to 10 wt %, or 0.1 wt % to 8 wt % with respect to the total amount of the photosensitive resin composition. When the content of the light diffuser meets the aforementioned range, it may have a viscosity suitable for coating and inkjetting while having a sufficient light diffusing effect.

In another aspect, according to embodiments of the present invention, an optical film including a semiconductor nanoparticle-ligand composite may be provided.

In the description of the optical film according to embodiments of the present invention, unless otherwise specified, the semiconductor nanoparticle-ligand complex is the same as the semiconductor nanoparticle-ligand complex described above in connection with the semiconductor nanoparticle-ligand complex according to embodiments of the present invention, and is thus omitted from the description.

The optical film may be, e.g., a wavelength conversion film or color filter that converts light of a specific wavelength into light of another specific wavelength. For example, an optical film according to embodiments of the present invention may be used as a color filter for converting the wavelength of light emitted from a backlight including a light emitting diode, but the optical film according to embodiments of the present invention is not limited to a color filter or a wavelength conversion film.

For example, the optical film may be used as a layer that is positioned between the cathode and anode electrodes of the electroluminescent diode to emit light by electrons and holes arriving from the cathode and anode electrodes.

The optical film may be formed on bare glass using a photosensitive resin composition through spin coating, exposure, or heating. In this case, the spin coating, exposure, or heating process is merely an example, and the optical film may be formed through any method capable of forming a film without being limited to the spin coating, exposure, or heating process.

In the description of the optical film according to embodiments of the present invention, unless otherwise specified, the photosensitive resin composition is the same as the photosensitive resin composition described above according to embodiments of the present invention, and is thus omitted from the description.

The thickness of the optical film may be 0.005 µm to 500 µm, or 1 µm to 11 µm.

In another aspect, according to embodiments of the present invention, an electroluminescent diode including an optical film may be provided. An electroluminescent diode may include, e.g., a cathode electrode, an anode electrode, and an optical film disposed between the cathode electrode and the anode electrode. The electroluminescent diode may further include one or more of functional layers, such as a hole injection layer, a hole transport layer, an electron injection layer, and an electron transport layer.

In the description of the electroluminescent diode according to embodiments of the present invention, unless otherwise specified, the optical film is the same as the optical film described above according to embodiments of the present invention, and is thus omitted from the description.

Since the optical film according to embodiments of the present invention is formed by a semiconductor nanoparticle-ligand complex having excellent compatibility, the electroluminescent diode may have excellent quantum efficiency.

In another aspect, according to embodiments of the present invention, an electronic device including a display device including an optical film and a controller driving the display device may be provided.

In the description of the electronic device according to embodiments of the present invention, unless otherwise specified, the optical film is the same as the optical film described above according to embodiments of the present invention, and is thus omitted from the description.

The electronic device may use the optical film as a wavelength conversion film or color filter that converts wavelength. Since the optical film according to embodiments of the present invention is formed by a semiconductor nanoparticle-ligand complex having excellent compatibility, the electronic device according to embodiments of the present invention may have excellent quantum efficiency.

In another aspect, according to embodiments of the present invention, an electronic device including a display device including an electroluminescent diode and a controller driving the display device may be provided.

In the description of the electronic device according to embodiments of the present invention, unless otherwise specified, the electroluminescent diode is the same as the electroluminescent diode described above according to embodiments of the present invention, and is thus omitted from the description.

Hereinafter, an example of synthesizing a compound and an example of manufacturing an electric element according to the present invention are described in detail with reference to embodiments, but the present invention is not limited to the following embodiments.

SYNTHESIS EXAMPLE

The semiconductor nanoparticle-ligand complex (final product) represented by chemical formula 1 according to embodiments of the present invention may be synthesized by reacting Sub1 and Sub2 as in the following reaction formula 1, but is not limited thereto.

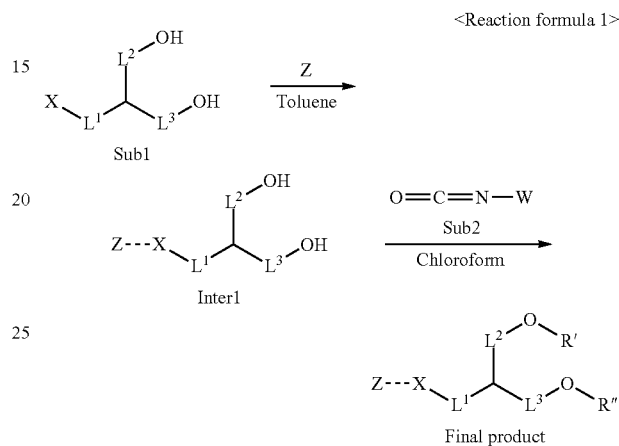

<Reaction formula 1>

Z is the surface of the semiconductor nanoparticles (Z) to be described below, X, R', R'' and $L^1$ to $L^3$ are the same as those defined in chemical formula 1 above, and Sub2 is an acrylic compound represented by chemical formulas 7 to 9.

Synthesis of Semiconductor Nanoparticles (Z)

1. Synthesis of Semiconductor Nanoparticle Z-1 (InZnP/ZnSeS)

0.05 g of indium acetate, 1.14 g of zinc acetate, 3.7 g of oleic acid, and 15 mL of 1-octadecene are put in a 50 mL three-necked round flask equipped with a refluxer and heated to 110° C. and maintained at 0.1 torr for 1 hour using a vacuum pump. The vacuum is removed, and $N_2$ gas is injected while heating to 280° C. 0.43 g of tris(trimethylsilyl)phosphine is put at once. After addition, it is stirred for 10 minutes. 0.17 g of selenium and 0.07 g of sulfur are dissolved in mL of trioctyl phosphine and put in the reactor and stirred for 30 minutes. 0.07 g of sulfur is dissolved in 2 mL of trioctyl phosphine, put it back into the reactor and stirred for 10 minutes. The temperature was lowered to 240° C., left for 3 hours, cooled to room temperature, and 100 ml of ethanol was added, stirred for 5 minutes, and the precipitate was centrifuged, preparing semiconductor nanoparticles Z-1.

2. Synthesis of Semiconductor Nanoparticle Z-2 (CdZnSe/ZnSe/ZnS)

0.097 g of cadmium acetate (Sigma-Aldrich), 1.878 g of Zn acetate (Sigma-Aldrich), 21 ml of oleic acid (Sigma-Aldrich), and 45 ml of 1-octadecene (Sigma-Aldrich) are put in a 3-necked round bottom reactor equipped with a refluxer, the temperature is raised to 110° C., and it is left at 0.1 torr for 1 hour by a vacuum pump. Then, the inside of the reactor is changed into $N_2$ atmosphere, and the temperature is raised to 290° C. 0.65 g of selenium (Sigma-Aldrich) and 0.16 g of sulfur (Sigma-Aldrich) are dissolved in 6 ml of trioctylphosphine (Sigma-Aldrich), and then put in the reactor at once and left for 20 minutes. 0.15 g of sulfur (from Sigma- Aldrich) is dissolved in 6 ml of trioctylphosphine, put in the reactor at once and left for 20 minutes. 1.6 g of Zn acetate and 5.4 g of oleic acid and 24 ml of 1-octadecene are put in a 50 ml three-necked round bottom reactor equipped with a refluxer, heated to 110° C., then left at 0.1 torr for 1 hour by a vacuum pump, and then, the solution is put into the reactor at once and left for 20 minutes. After cooling the reactor to room temperature, 100 ml of ethanol (Sigma-Aldrich) was added to the reaction solution, and semiconductor nanoparticles Z-2 were prepared through a centrifugal separator.

II. Synthesis of Sub1

Sub1 of reaction formula 1 is synthesized by the reaction path of reaction formula 2 or reaction formula 3 below, but is not limited thereto. Hal¹ is I, Br, or Cl.

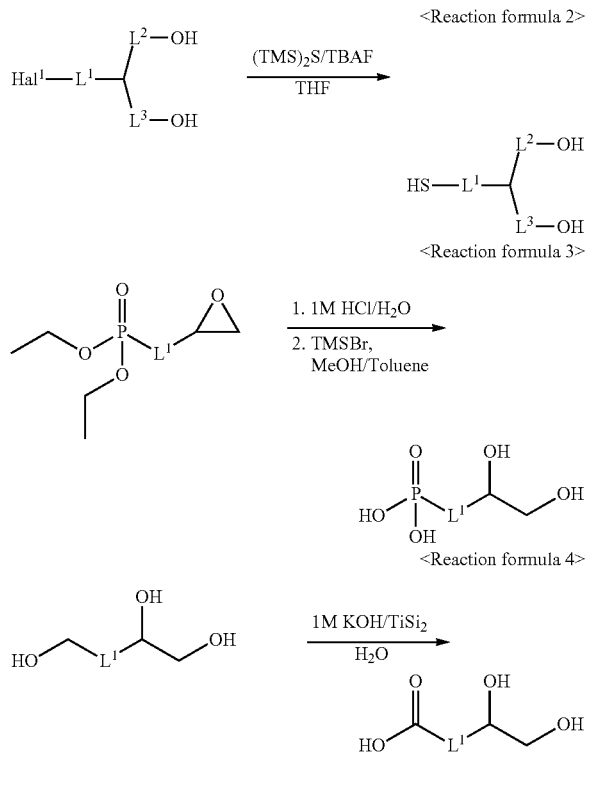

1. Example of Synthesis of Sub1-1-1

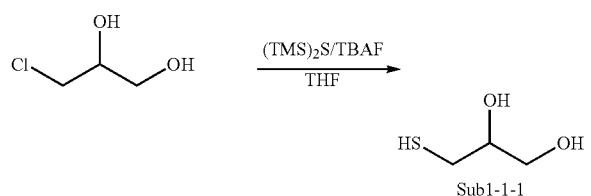

3-chloropropane-1,2-diol (23.0 g, 208 mmol) is dissolved in THF (221 mL) and stirred at −10° C. Then, (TMS) 2 S (44.6 g, 250 mmol) and TBAF 1M solution in THF (229 mL) are added and stirred at room temperature for 30 minutes. If the reaction is complete, it is extracted with a $CH_2Cl_2$ and $NH_4Cl$ aqueous solution, and then the organic layer is dried and concentrated with $MgSO_4$. Thereafter, the resulting compound was passed through a silica gel column to obtain of product (yield: 90%).

2. Example of Synthesis of Sub1-1-3

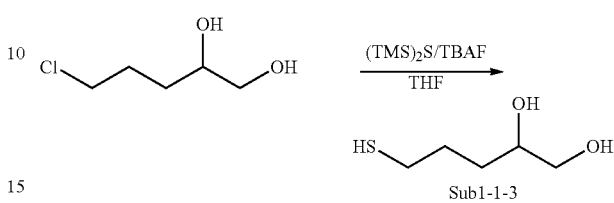

From 5-chloropentane-1,2-diol (23.0 g, 166 mmol), (TMS) 2 S (35.0 g, 199 mmol) and TBAF 1M solution in THF (183 mL), 20.6 g (yield: 91%) of the product was obtained by the Sub1-1-1 synthesis method.

3. Example of Synthesis of Sub1-1-6

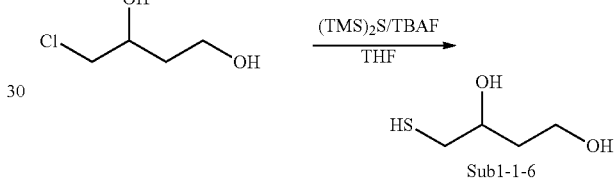

From 4-chloropentane-1,3-diol (23.0 g, 185 mmol), (TMS) 2 S (39.5 g, 222 mmol) and TBAF 1M solution in THF (203 mL), 18.3 g (yield: 89%) of the product was obtained by the Sub1-1-1 synthesis method.

4. Example of Synthesis of Sub1-1-7

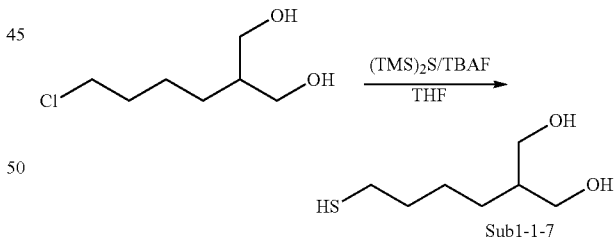

From 2-(4-chlorobutyl)propane-1,3-diol (23.0 g, 151 mmol), (TMS) 2 S (32.3 g, 181 mmol) and TBAF 1M solution in THF (166 mL), 20.4 g (yield: 90%) of the product was obtained by the Sub1-1-1 synthesis method.

5. Example of Synthesis of Sub1-2-2

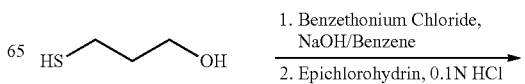

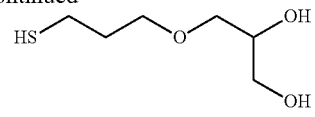

Sub1-2-2

(1) 3-mercapto-1-propanol (19.4 g, 210 mmol), benzethonium chloride (5.6 g, 12.5 mmol), NaOH (15 g, 375 mmol), and benzene (28.5 mL) are put in a round bottom flask and stirred at 30° C.

(2) Epichlorohydrin (35 g, 400 mmol) was added dropwise to the solution for 30 minutes, cooled to room temperature, and then, 25 mL of 0.1N hydrochloric acid was added to obtain 26.3 g of a product. (yield: 75%)

6. Example of Synthesis of Sub1-2-6

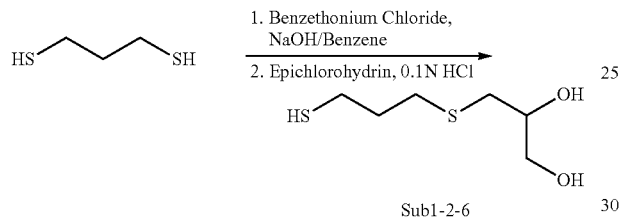

Sub1-2-6

From 1,3-propanedithiol (22.7 g, 210 mmol), benzethonium chloride (5.6 g, 12.5 mmol), NaOH (15 g, 375 mmol), benzene (28.5 mL), epichlorohydrin (35 g, 400 mmol), and of 0.1N hydrochloric acid 25 mL, 29.5 g of product was obtained by the Sub1-2-2 synthesis method. (yield: 77%)

7. Example of Synthesis of Sub1-3-1

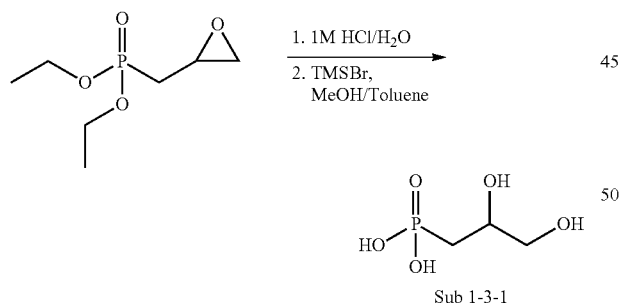

Sub 1-3-1

(1) Diethyl oxiran-2-ylmethylphosphonate (36.7 g, 189 mmol) and $H_2O$ (200 mL) were put in a 500 mL flask, then 1M HCl (18.4 mL) was added, and it was stirred for 4 hours, and $H_2O$ was removed at room temperature through vacuum and washed with $H_2O$ (150 mL). The resulting product was put in a round bottom flask.

(2) TMSBr (58.7 mL, 385 mmol), MeOH (2 mL), and toluene (200 mL) were put in a round bottom flask, stirred overnight, and then reduced in pressure at 55° C. for 1 hour and 30 minutes, obtaining 23.9 g of product. (yield: 81%)

8. Example of Synthesis of Sub1-5-1

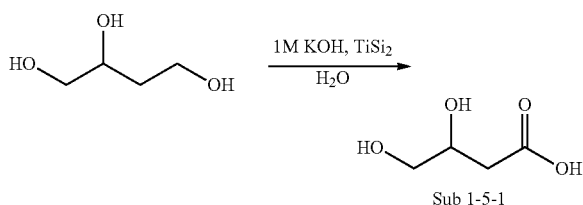

Sub 1-5-1

Glycerol (20.0 g, 832 mmol), 1M KOH (200 ml), and $TiSi_2$ (1 wt %, 2 g) are put in a round bottom flask and stirred for 12 hours in an air atmosphere. Then, after centrifugation with the addition of 12N HCl, the excess $H_2O$ was removed by reduced pressure distillation, and then, of the product (yield: 98%) was obtained by a membrane filter.

Meanwhile, the compounds belonging to Sub1 may be, but are not limited to, the following compounds, and Table 1 shows the Field Desorption-Mass Spectrometry (FD-MS) values of the following compounds.

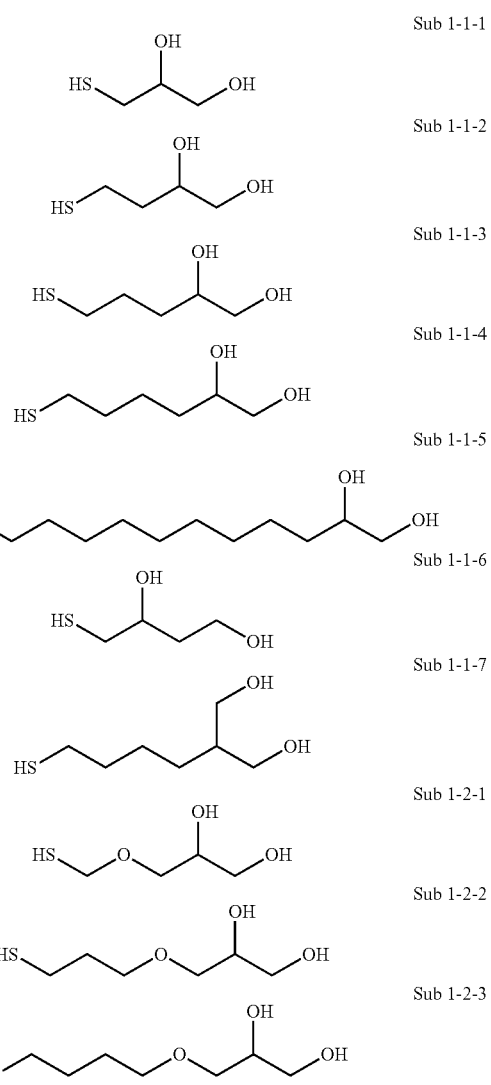

-continued

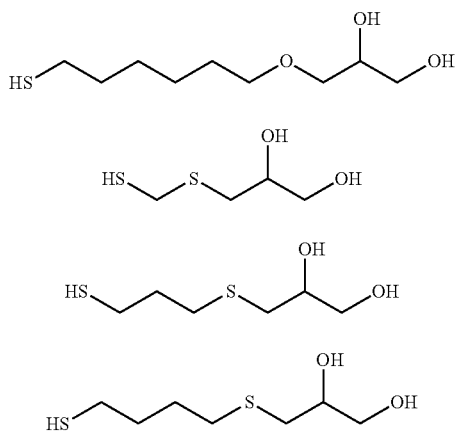

Sub 1-2-4

Sub 1-2-5

Sub 1-2-6

Sub 1-2-7

-continued

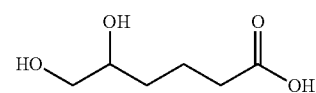

Sub1-5-3

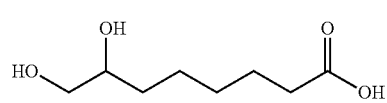

Sub1-5-4

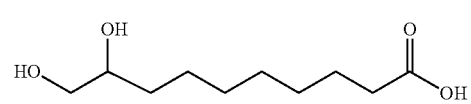

Sub1-5-5

TABLE 1

| compound | FD-MS | compound | FD-MS |
|---|---|---|---|
| Sub1-1-1 | m/z = 108.02($C_3H_8O_2S$ = 108.16) | Sub1-1-2 | m/z = 122.04($C_4H_{10}O_2S$ = 122.18) |
| Sub1-1-3 | m/z = 136.06($C_5H_{12}O_2S$ = 136.21) | Sub1-1-4 | m/z = 150.07($C_6H_{14}O_2S$ = 150.24) |
| Sub1-1-5 | m/z = 220.15($C_{11}H_{24}O_2S$ = 220.37) | Sub1-1-6 | m/z = 122.04($C_4H_{10}CO_2S$ = 122.18) |
| Sub1-1-7 | m/z = 166.65($C_7H_{16}O_2S$ = 164.26) | Sub1-2-1 | m/z = 138.04($C_4H_{10}CO_3S$ = 138.18) |
| Sub1-2-2 | m/z = 166.07($C_6H_{14}O_3S$ = 166.24) | Sub1-2-3 | m/z = 180.08($C_7H_{16}O_3S$ = 180.26) |
| Sub1-2-4 | m/z = 208.11($C_9H_{20}O_3S$ = 208.32) | Sub1-2-5 | m/z = 154.01($C_4H_{10}O_2S$ = 154.24) |
| Sub1-2-6 | m/z = 182.04($C_6H_{14}O_2S_2$ = 182.30) | Sub1-2-7 | m/z = 196.06($C_7H_{16}O_2S_2$ = 154.24) |
| Sub1-2-8 | m/z = 224.09($C_9H_{20}O_2S_2$ = 224.38) | Sub1-3-1 | m/z = 156.02($C_3H_9O_5P$ = 156.07) |
| Sub1-3-2 | m/z = 170.03($C_4H_{11}O_5P$ = 170.10) | Sub1-4 | m/z = 230.04($C_6H_{15}O_5PS$ = 230.21) |
| Sub1-5-1 | m/z = 120.10($C_4H_8O_4$ = 120.04) | Sub1-5-2 | m/z = 134.13($C_5H_{10}O_4$ = 134.06) |
| Sub1-5-3 | m/z = 148.16($C_6H_{12}O_4$ = 148.07) | Sub1-5-4 | m/z = 176.21($C_8H_{16}O_4$ = 176.10) |
| Sub1-5-5 | m/z = 204.14($C_{10}H_{20}O_4$ = 204.14) | | |

-continued

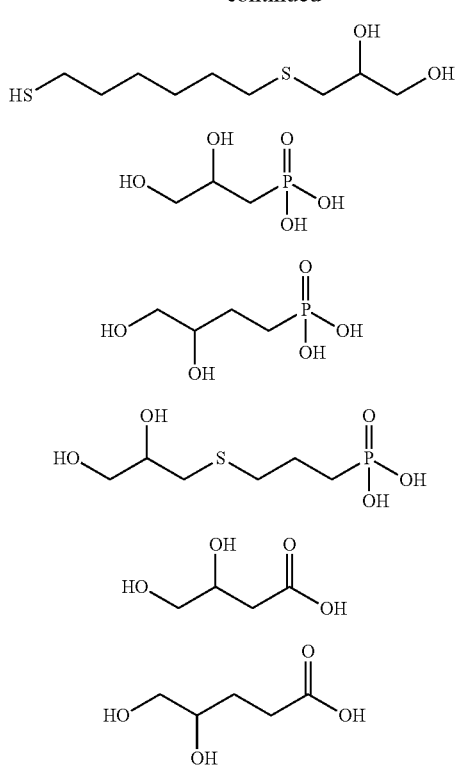

Sub 1-2-8

Sub 1-3-1

Sub 1-3-2

Sub 1-4

Sub1-5-1

Sub1-5-2

III. Synthesis of Sub2

Sub2 of reaction formula 1 above may be synthesized by the reaction path suggested in Showa Denko's Korean Patent No. 10-1140086 (published on Apr. 19, 2012), Japanese Patent No. 5165815 (published on Dec. 28, 2012) and Trivedi P., et al. Eur J Pharm Sci. 2019, but the Sub2 synthesis method is not limited thereto.

Meanwhile, the compounds belonging to Sub2 may be, but are not limited to, the following compounds, and Table 2 shows the Field Desorption-Mass Spectrometry (FD-MS) values of the following compounds.

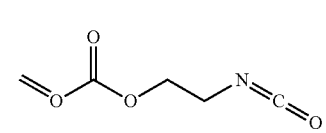

Sub 2-1

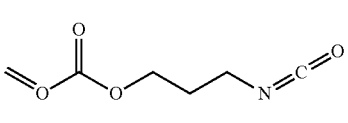

Sub 2-2

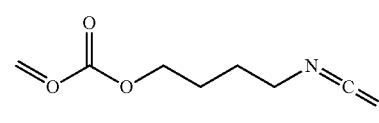

Sub 2-3

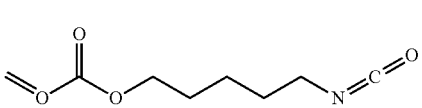

Sub 2-4

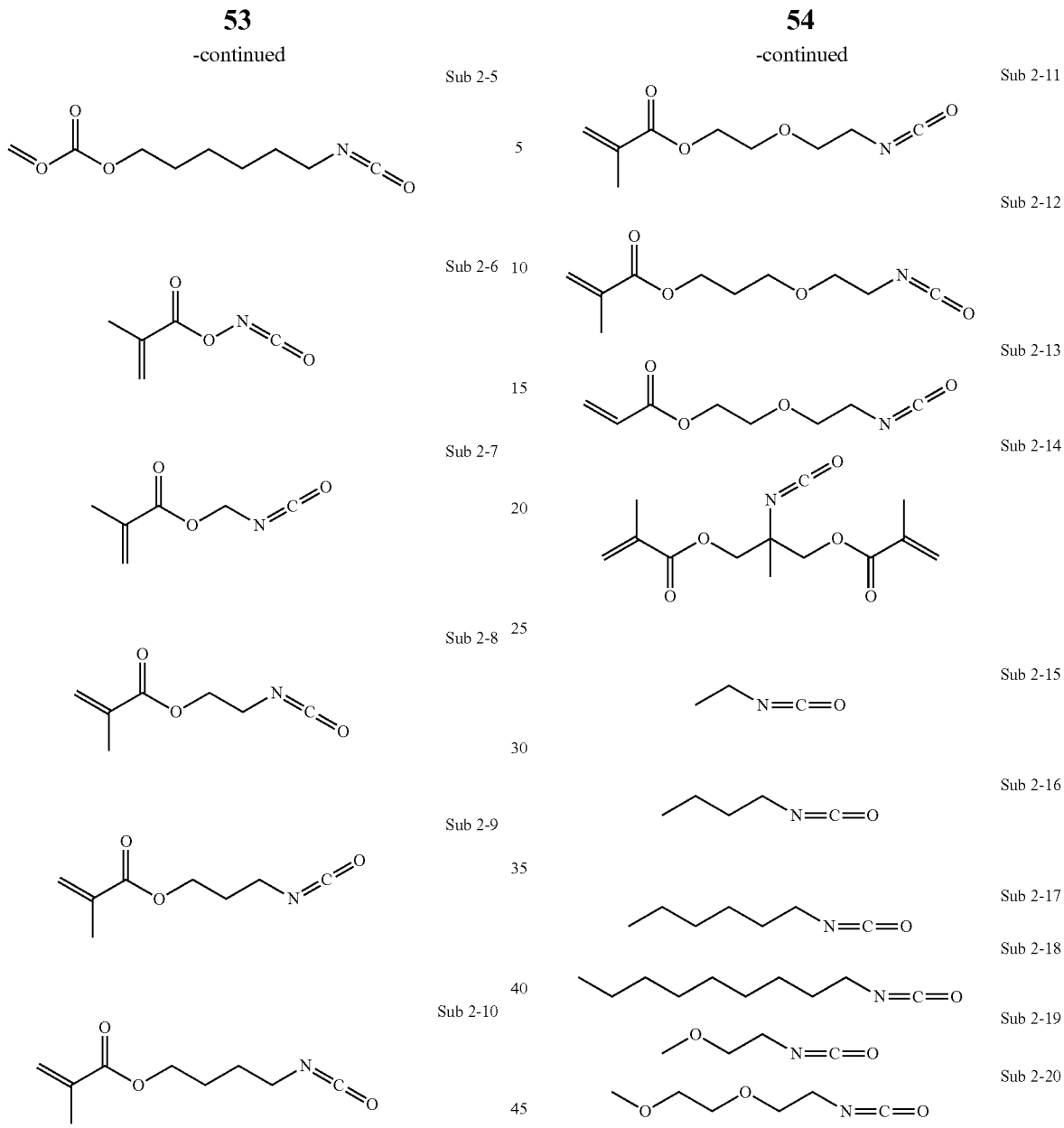

TABLE 2

| compound | FD-MS | compound | FD-MS |
| --- | --- | --- | --- |
| Sub2-1 | m/z = 141.04($C_6H_7NO_3$ = 141.13) | Sub2-2 | m/z = 155.06($C_7H_9NO_3$ = 155.15) |
| Sub2-3 | m/z = 169.07($C_8H_{11}NO_3$ = 169.18) | Sub2-4 | m/z = 183.09 ($C_9H_{13}NO_3$ = 183.21) |
| Sub2-5 | m/z = 197.11 ($C_{10}H_{15}NO_3$ = 197.23) | Sub2-6 | m/z = 127.03 ($C_5H_5NO_3$ = 127.10) |
| Sub2-7 | m/z = 141.04 ($C_6H_7NO_3$ = 141.13) | Sub2-8 | m/z = 155.06($C_7H_9NO_3$ = 155.15) |
| Sub2-9 | m/z = 169.07($C_8H_{11}NO_3$ = 169.18) | Sub2-10 | m/z = 183.09 ($C_9H_{13}NO_3$ = 183.21) |
| Sub2-11 | m/z = 199.08($C_9H_{13}NO_4$ = 199.21) | Sub2-12 | m/z = 213.10($C_{10}H_{15}NO_4$ = 199.21) |
| Sub2-13 | m/z = 185.07($C_8H_{11}NO_4$ = 185.18) | Sub2-14 | m/z = 267.11($C_{13}H_{17}NO_5$ = 267.28) |
| Sub2-15 | m/z = 71.04($C_3H_5NO$ = 71.08) | Sub2-16 | m/z = 99.07($C_5H_9NO$ = 99.13) |
| Sub2-17 | m/z = 127.10($C_7H_{13}NO$ = 127.19) | Sub2-18 | m/z = 169.15($C_{10}H_{19}NO$ = 169.27) |
| Sub2-19 | m/z = 101($C_3H_5NO_2$ = 71.08) | Sub2-20 | m/z = 145.07($C_6H_{11}NO_3$ = 145.16) |

IV. Synthesis of Final Product

Example of Synthesis of P1

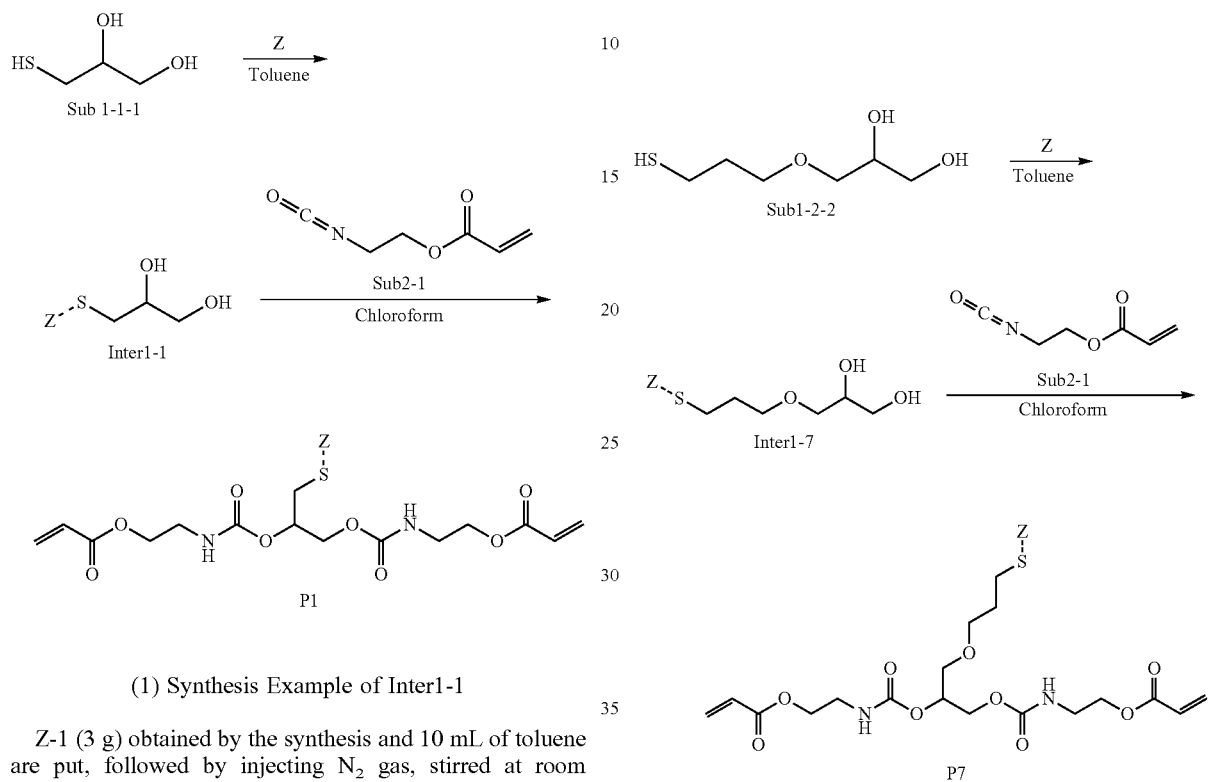

(1) Synthesis Example of Inter1-1

Z-1 (3 g) obtained by the synthesis and 10 mL of toluene are put, followed by injecting $N_2$ gas, stirred at room temperature until it is completely dissolved, followed by adding Sub1-1-1 (0.3 g), and stirred at room temperature for 10 minutes. Then, it is raised to 100° C., followed by reacting for 4 hours, first surface-modifying the surface of the semiconductor nanoparticles. Toluene and dimethyl sulfoxide were added to the solution of the first surface-modified semiconductor nanoparticles, and the precipitate was extracted by a centrifuge, obtaining 2.95 g of the product.

(2) Synthesis Example of P1

Inter1-1 (0.8 g) obtained in the above synthesis was dissolved in 10 mL of chloroform, Sub2-1 (0.20 g, Showa Denko, AOI-VM) was put in a 50 mL 3-necked round flask, followed by $N_2$ gas, and reacted at room temperature for 15 hours, second surface-modifying it. Thereafter, acetone and hexane were added to the second surface-modified solution and centrifuged to obtain 0.78 g of the product. $^1$H-NMR (JEOL Co.) was measured, identifying that the reaction proceeded to exhibit three peaks in the 6-6.5 ppm area.

2. Example of Synthesis of P7

(1) Synthesis Example of Inter1-7

2.88 g of Inter1-7 was obtained using the Inter1-1 synthesis method on Z-1 (3 g) and Sub1-2-2 (0.45 g) obtained in the above synthesis.

(2) Synthesis Example of P7

0.78 g of the product was obtained using the P1 synthesis method on Inter1-7 (0.8 g) and Sub2-1 (0.20 g, Showa Denko, AOI-VM) obtained in the above synthesis. $^1$H-NMR was measured, identifying that the reaction proceeded to exhibit three peaks in the 6-6.5 ppm area. 3. Example of synthesis of P11

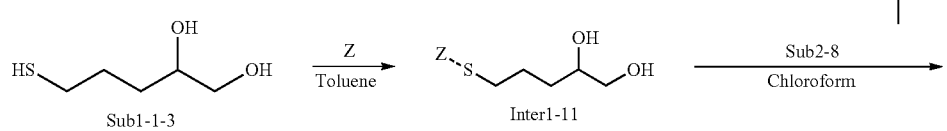

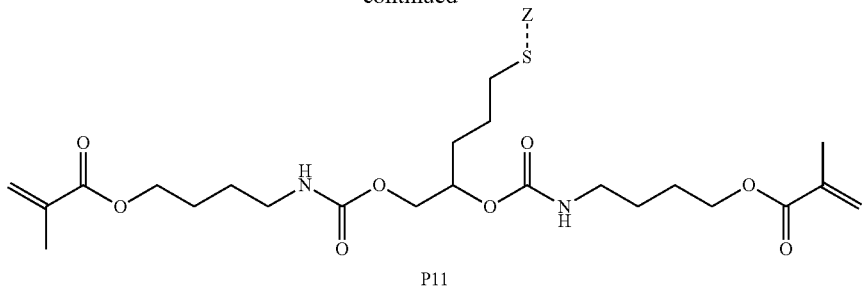

P11

(1) Synthesis Example of Inter1-11

2.90 g of Inter1-11 was obtained using the Inter1-1 synthesis method on Z-1 (3 g) and Sub1-1-3 (0.39 g) obtained in the above synthesis.

(2) Synthesis Example of P11

0.76 g of the product was obtained using the P1 synthesis method on Inter1-11 (0.8 g) and Sub2-8 (0.22 g, Showa Denko, Karenz MOI) obtained in the above synthesis. $^1$H-NMR was measured, identifying that the reaction proceeded to exhibit two peaks in the 3.5-4.0 ppm area and two peaks in 5.5-6.0 ppm.

4. Example of Synthesis of P17

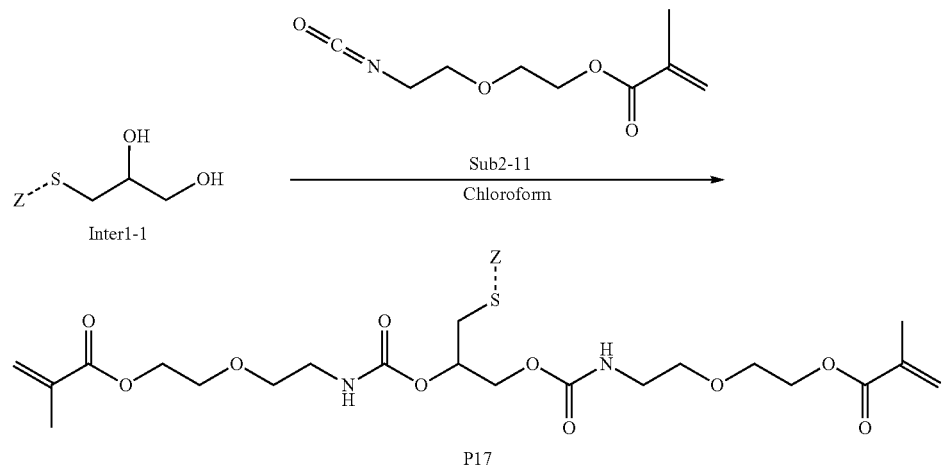

P17

0.77 g of the product was obtained using the P1 synthesis method on Inter1-1 (0.8 g) and Sub2-11 (0.29 g, Showa Denko, MOI-EG) obtained in the above synthesis. 1H-NMR was measured, identifying that the reaction proceeded to exhibit two peaks in the 5.5-6.0 ppm area.

5. Example of Synthesis of P24

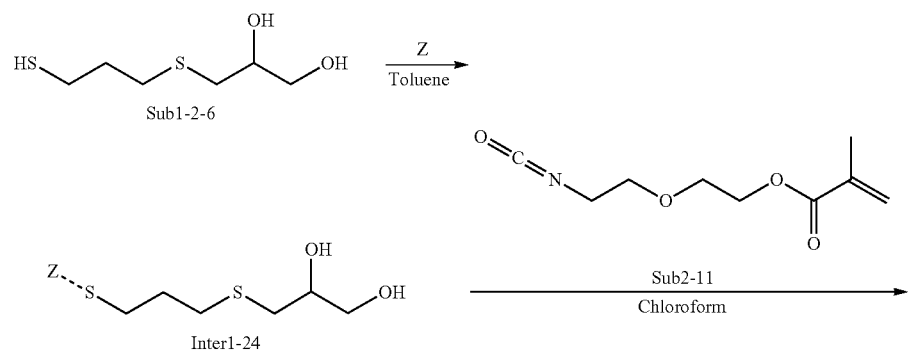

-continued

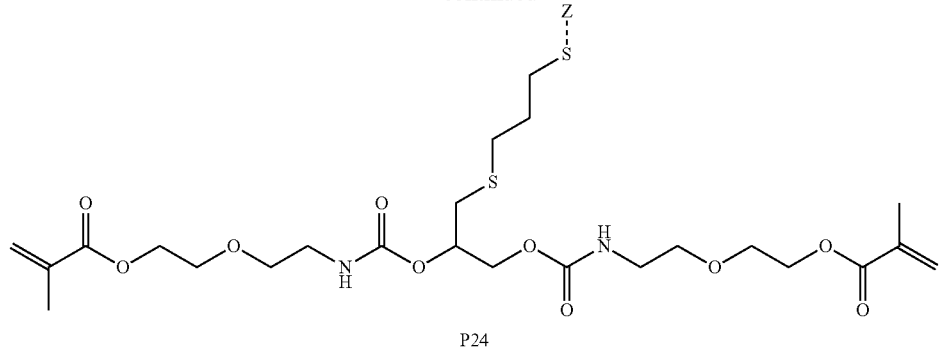

P24

(1) Synthesis Example of Inter1-24

2.80 g of Inter1-24 was obtained using the Inter1-1 synthesis method on Z-1 (3 g) and Sub1-2-6 (0.51 g) obtained in the above synthesis.

(2) Synthesis Example of P24

0.76 g of the product was obtained using the P1 synthesis method on Inter1-24 (0.8 g) and Sub2-11 (0.29 g, Showa Denko, MOI-EG) obtained in the above synthesis. 1H-NMR was measured, identifying that the reaction proceeded to exhibit two peaks in the 5.5-6.0 ppm area.

6. Example of Synthesis of P31

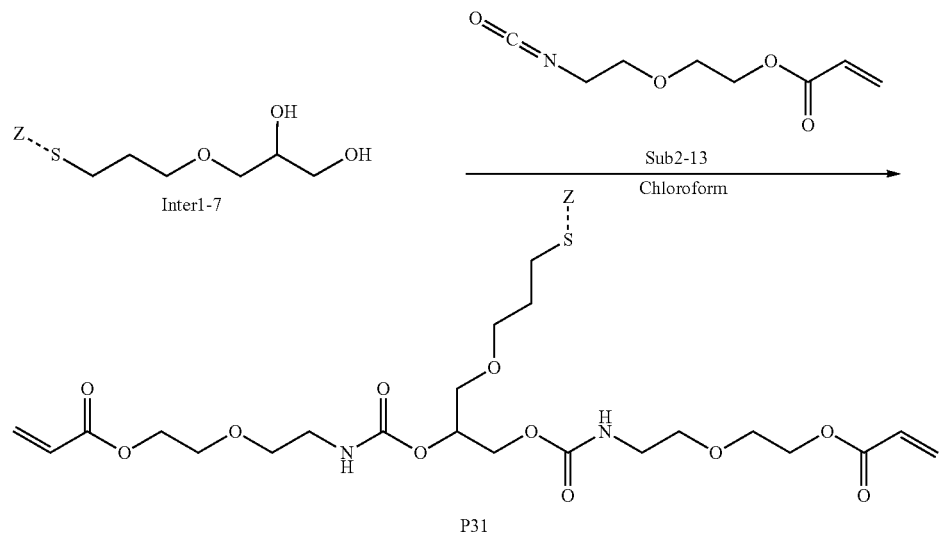

P31

0.77 g of the product was obtained using the P1 synthesis method on Inter1-7 (0.8 g) and Sub2-13 (0.27 g, Showa Denko, AOI-EG) obtained in the above synthesis. 1H-NMR was measured, identifying that the reaction proceeded to exhibit three peaks in the 6.0-6.5 ppm area.

7. Example of Synthesis of P35

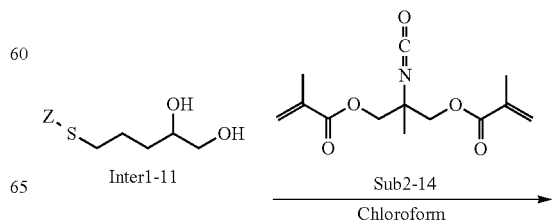

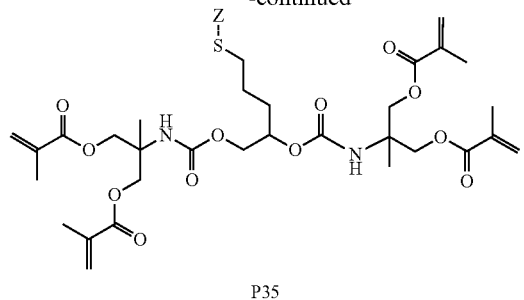

P35

0.74 g of the product was obtained using the P1 synthesis method on Inter1-11 (0.8 g) and Sub2-14 (0.34 g, Showa Denko, Karenz BEI) obtained in the above synthesis. 1H-NMR was measured, identifying that the reaction proceeded to exhibit two peaks in the 5.5-6.0 ppm area.

8. Example of Synthesis of P39

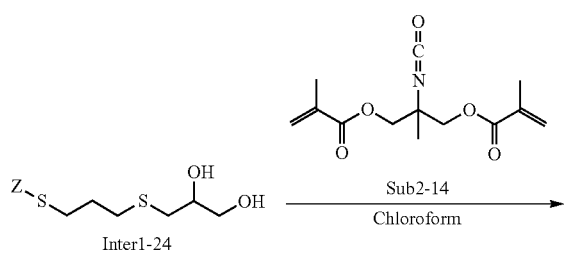

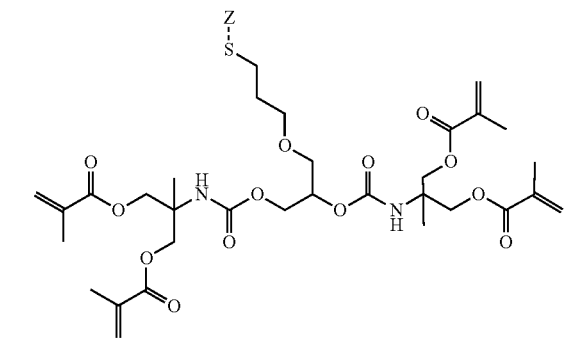

P39

0.75 g of the product was obtained using the P1 synthesis method on Inter1-24 (0.8 g) and Sub2-14 (0.34 g, Showa Denko, Karenz BEI) obtained in the above synthesis. 1H-NMR was measured, identifying that the reaction proceeded to exhibit two peaks in the 5.5-6.0 ppm area.

9. Example of Synthesis of P41

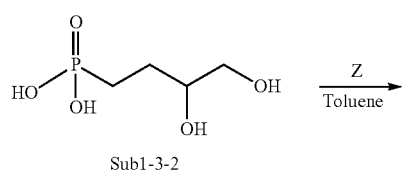

Sub1-3-2

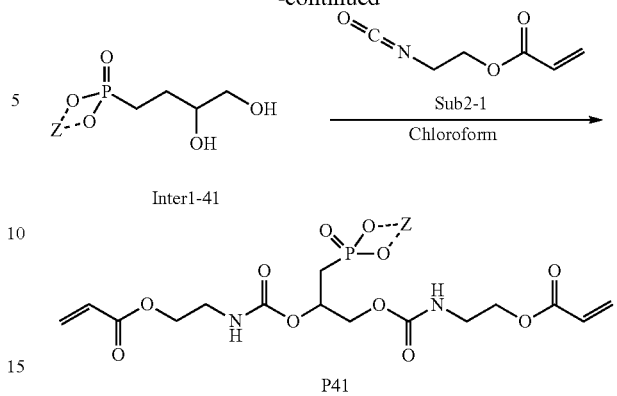

Inter1-41

P41

(1) Synthesis Example of Inter1-41

2.40 g of Inter1-41 was obtained using the Inter1-1 synthesis method on Z-1 (3 g) and Sub1-3-2 (0.48 g) obtained in the above synthesis.

(2) Synthesis Example of P41

0.76 g of the product was obtained using the P1 synthesis method on Inter1-41 (0.8 g) and Sub2-1 (0.20 g, Showa Denko, AOI-VM) obtained in the above synthesis. 41-NMR was measured, identifying that the reaction proceeded to exhibit three peaks in the 6-6.5 ppm area.

10. Example of Synthesis of P43

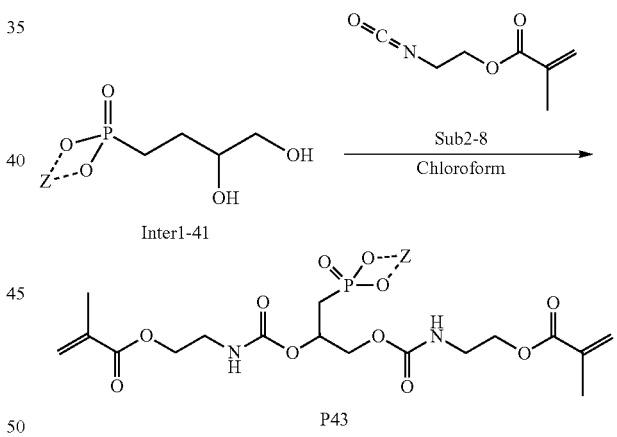

Inter1-41

P43

0.75 g of the product was obtained using the P1 synthesis method on Inter1-41 (0.8 g) and Sub2-8 (0.20 g, Showa Denko, Karenz MOI) obtained in the above synthesis. 1H-NMR was measured, identifying that the reaction proceeded to exhibit two peaks in the 5.5-6.0 ppm area.

11. Example of Synthesis of P49

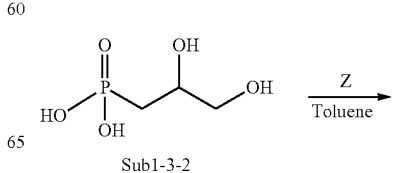

Sub1-3-2

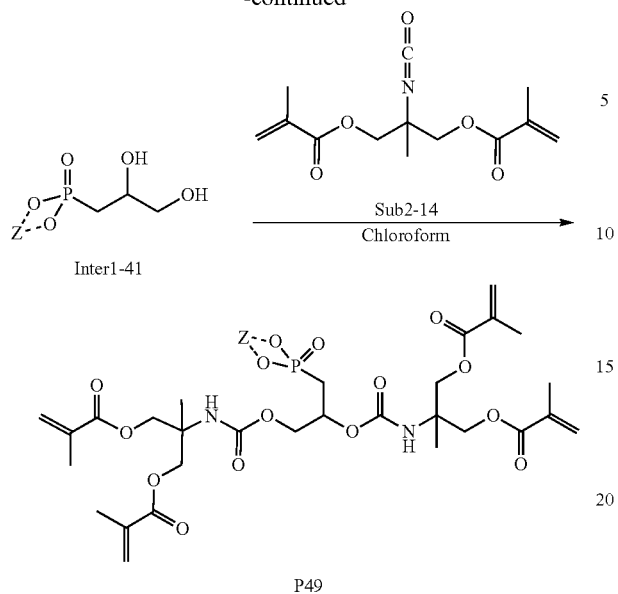

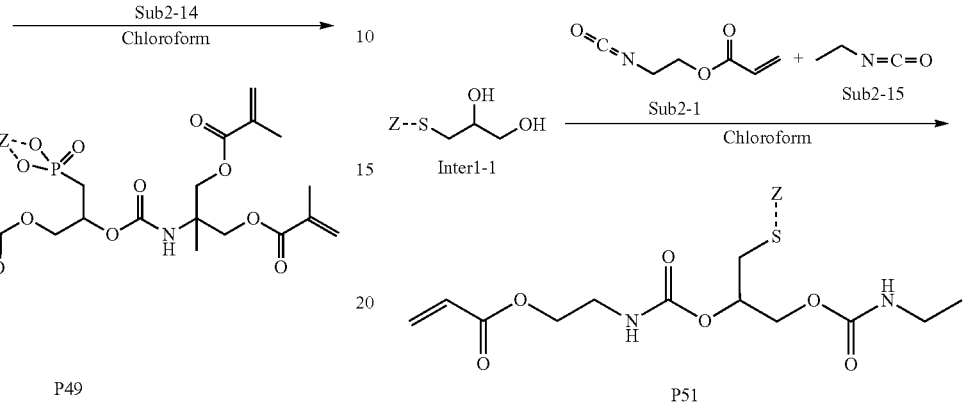

(1) Synthesis Example of Inter1-41

2.50 g of Inter1-41 was obtained using the Inter1-1 synthesis method on Z-1 (3 g) and Sub1-3-2 (0.42 g) obtained in the above synthesis.

(2) Synthesis Example of P41

0.74 g of the product was obtained using the P1 synthesis method on Inter1-41 (0.8 g) and Sub2-14 (0.34 g, Showa Denko, Karenz BEI) obtained in the above synthesis. 1H-NMR was measured, identifying that the reaction proceeded to exhibit two peaks in the 5.5-6.0 ppm area.

12. Example of Synthesis of P51

0.77 g of the product was obtained using the P1 synthesis method on Inter1-1 (0.8 g), Sub2-1 (0.10 g, Showa Denko, AOI-VM), and Sub2-15 (0.05 g, isocyanatoethane) obtained in the above synthesis. 1H-NMR was measured, identifying that the reaction proceeded to exhibit three peaks in the 6.0-6.5 ppm area and one peak in 0.5-1.0 ppm.

13. Example of Synthesis of P64

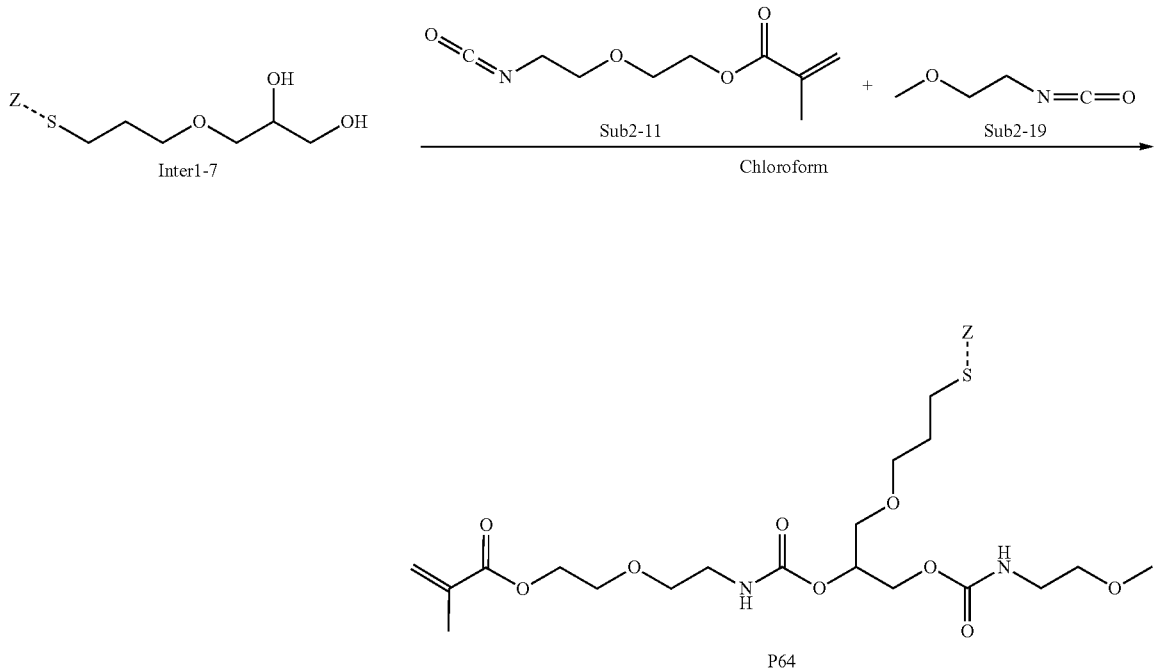

0.76 g of the product was obtained using the P1 synthesis method on Inter1-7 (0.8 g), Sub2-11 (0.15 g, Showa Denko, MOI-EG), and Sub2-19 (0.05 g, 1-isocyanato-2-methoxyethane) obtained in the above synthesis. 1H-NMR was measured, identifying that the reaction proceeded to exhibit two peaks in the 5.5-6.0 ppm area and one peak in 3.2-3.3 ppm.

14. Example of Synthesis of P75

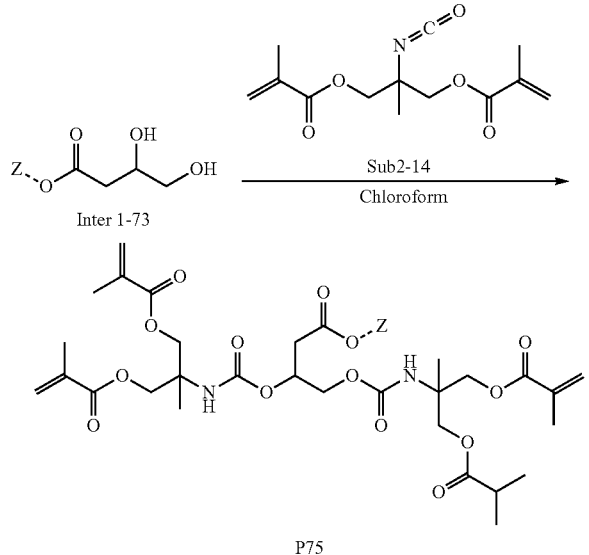

0.73 g of the product was obtained using the P1 synthesis method on Inter1-73 (0.8 g) and Sub2-14 (0.34 g, Showa Denko, Karenz BEI) obtained in the above synthesis. $^1$H-NMR was measured, identifying that the reaction proceeded to exhibit two peaks in the 5.5-6.0 ppm area.

15. Example of Synthesis of P76

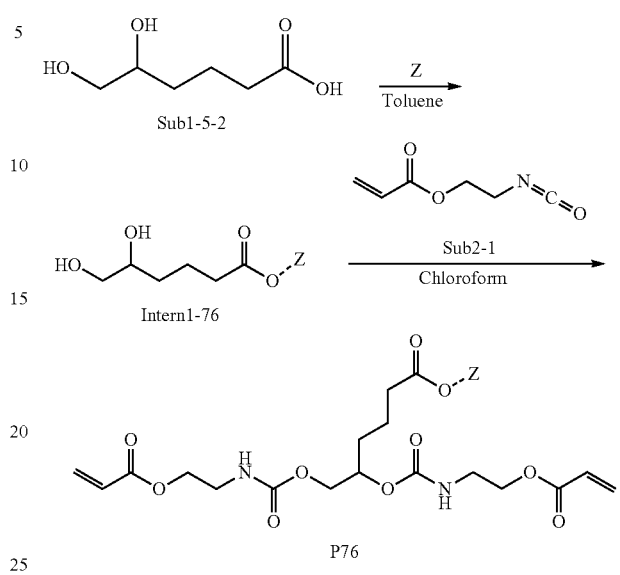

(1) Synthesis Example of Inter1-5-2

2.85 g of Inter1-76 was obtained using the Inter1-1 synthesis method on Z-1 (3 g) and Sub1-5-2 (0.42 g) obtained in the above synthesis.

(2) Synthesis Example of P76

0.78 g of the product was obtained using the P1 synthesis method on Inter1-76 (0.8 g) and Sub2-1 (0.20 g, Showa Denko, AOI-VM) obtained in the above synthesis. $^1$H-NMR was measured, identifying that the reaction proceeded to exhibit three peaks in the 6-6.5 ppm area.

16. Example of Synthesis of P80

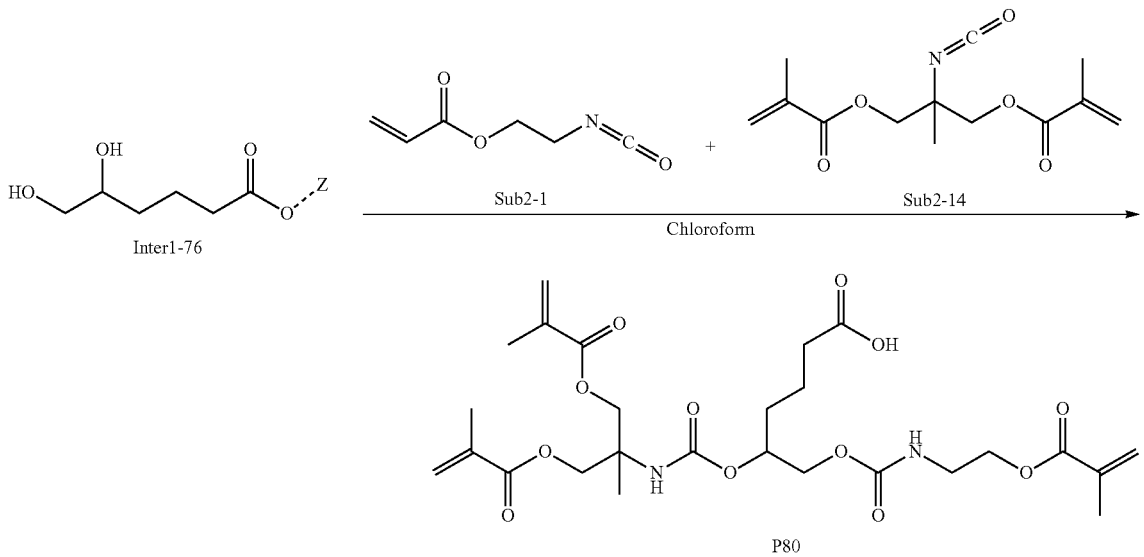

0.70 g of the product was obtained using the P1 synthesis method on Inter1-76 (0.8 g), Sub2-14 (0.17 g, Showa Denko, Karenz BEI), and Sub2-1 (0.10 g, Showa Denko, AOI-VM) obtained in the above synthesis. ¹H-NMR was measured, identifying that the reaction proceeded to exhibit two peaks in the 5.5-6.0 ppm area.

Referring to the above synthesis methods, semiconductor nanoparticle-ligand complexes, such as P1 to P82 described below, may be prepared, but the semiconductor nanoparticle-ligand complexes according to embodiments of the present invention are not limited to P1 to P82 described below. In P1 to P82 described below, Z means the surface of the semiconductor nanoparticle. P1 to P82 described below are shown as one ligand being coordinately bonded with Z for convenience, but as described above, a ligand according to embodiments of the present invention or other ligands may be coordinately bonded with Z, which is the surface of semiconductor nanoparticles.

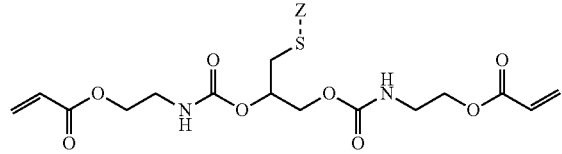

P1

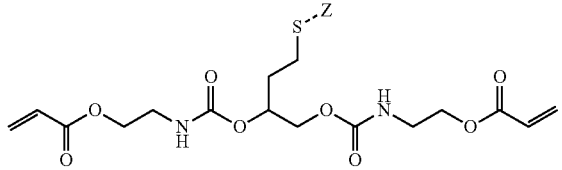

P2

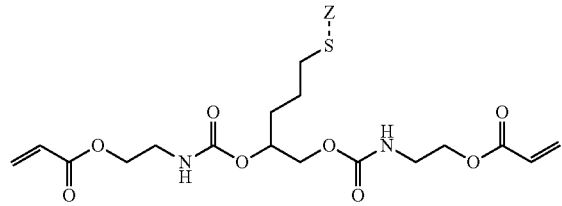

P3

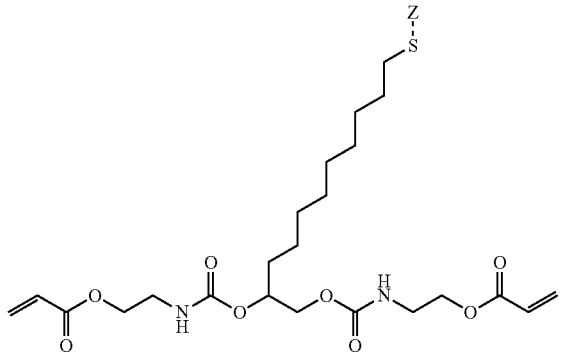

P4

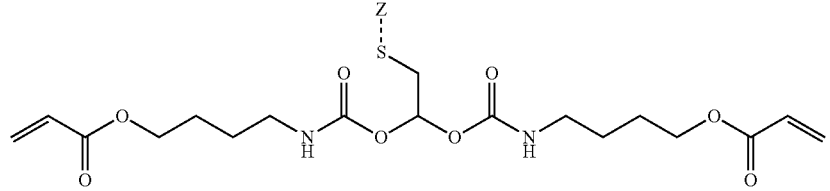

P5

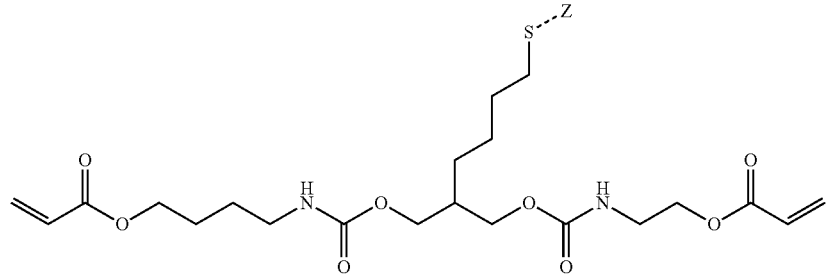

P6

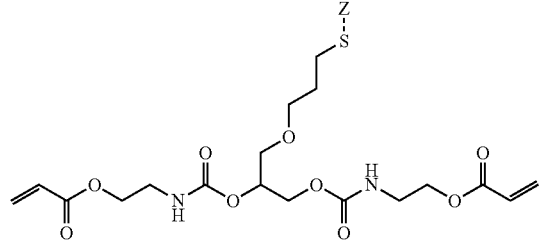

P7

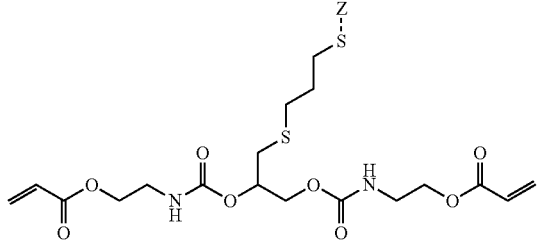

P8

-continued
P9
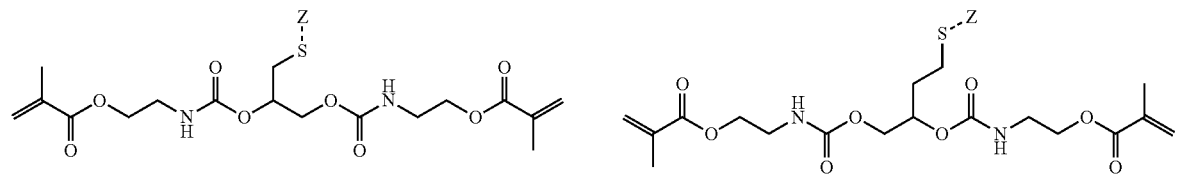
P10
P11
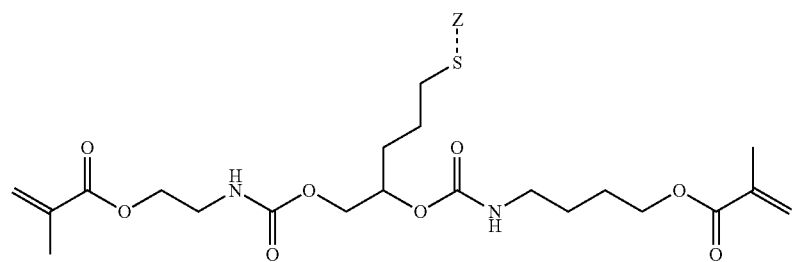
P12
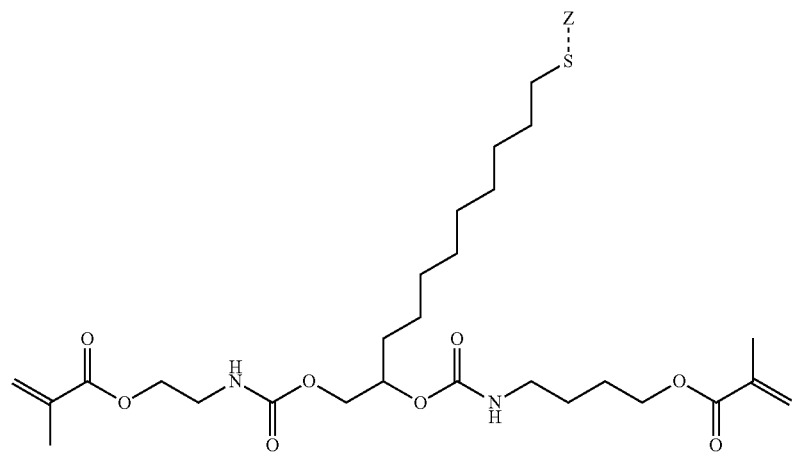
P13
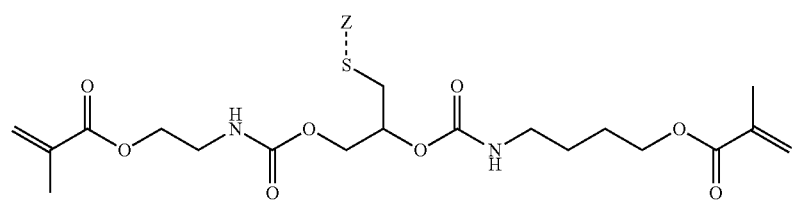
P14
P15
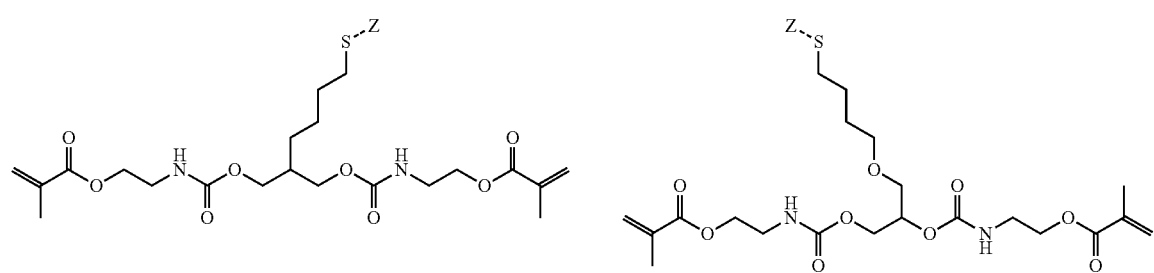

-continued
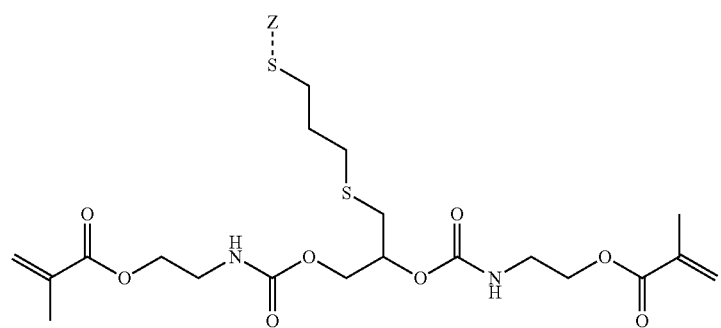
P16
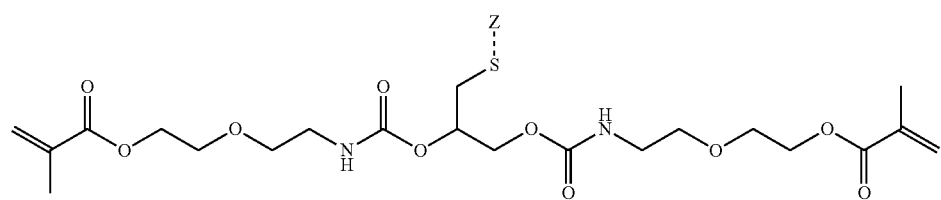
P17
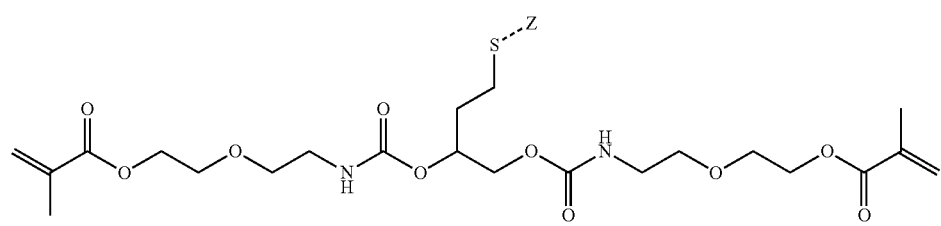
P18
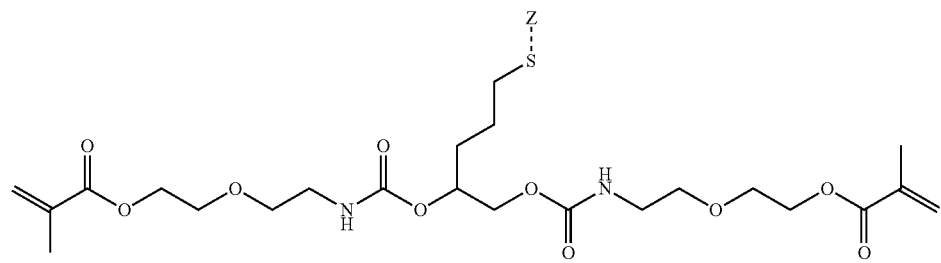
P19
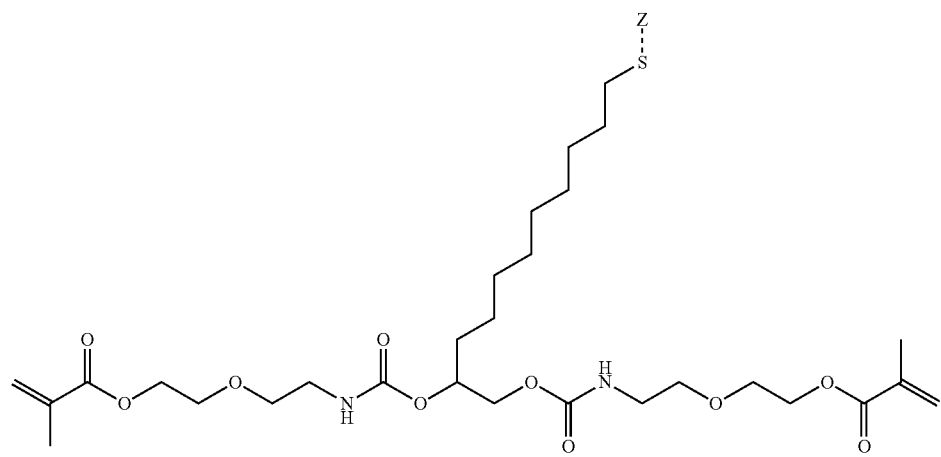
P20

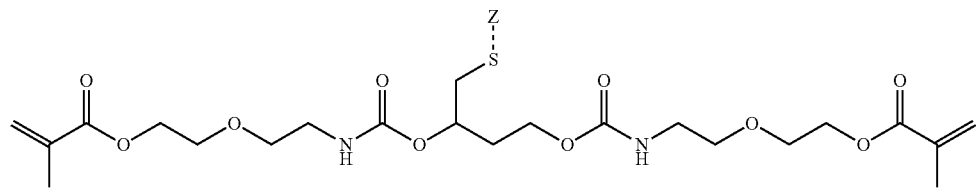
P21
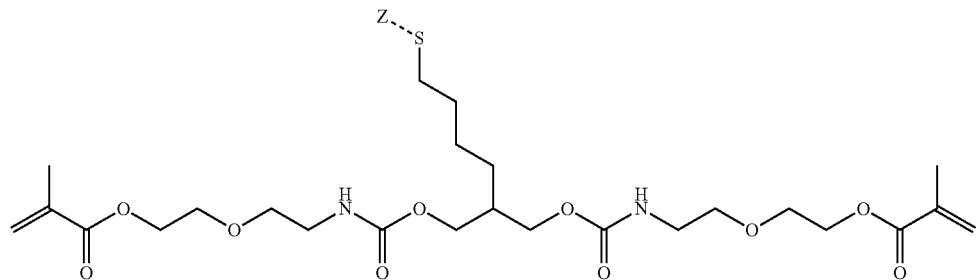
P22
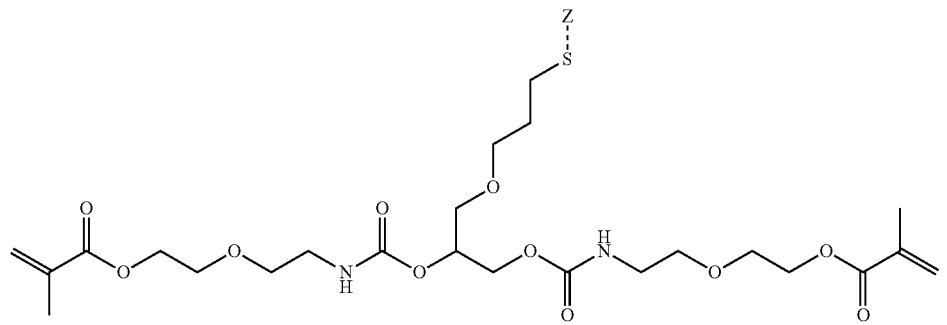
P23
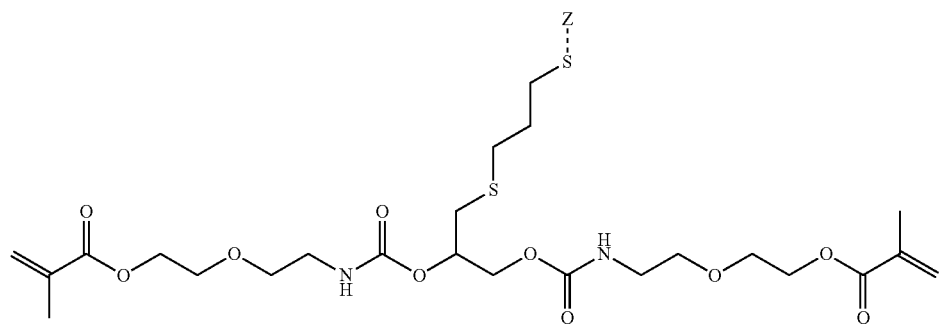
P24
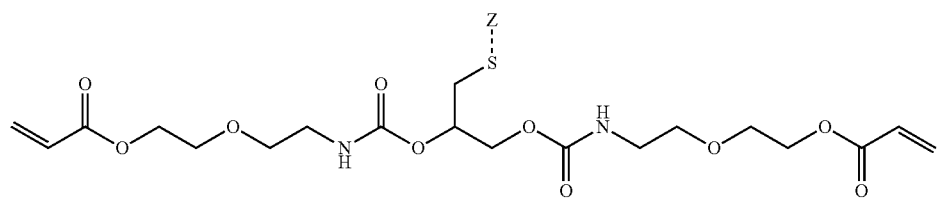
P25
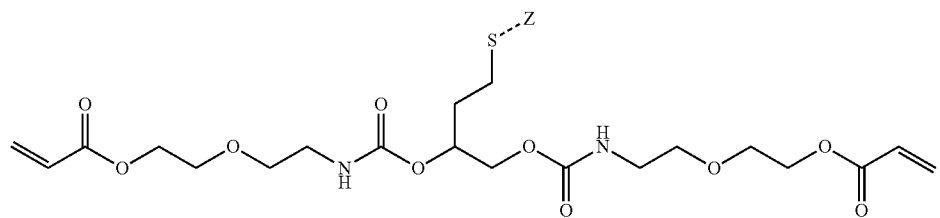
P26

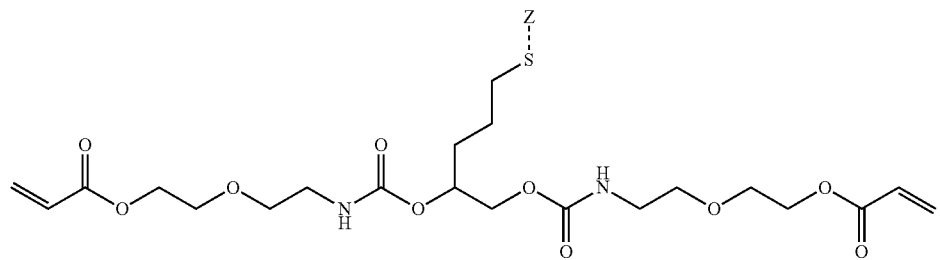
P27
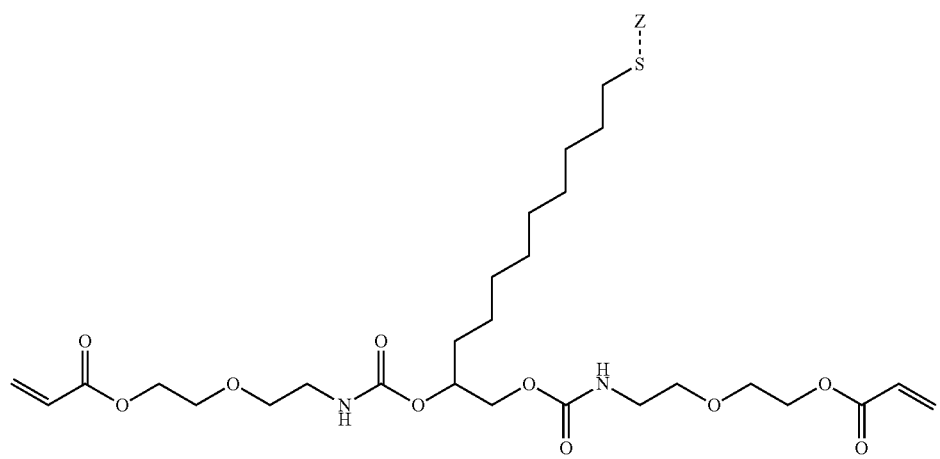
P28
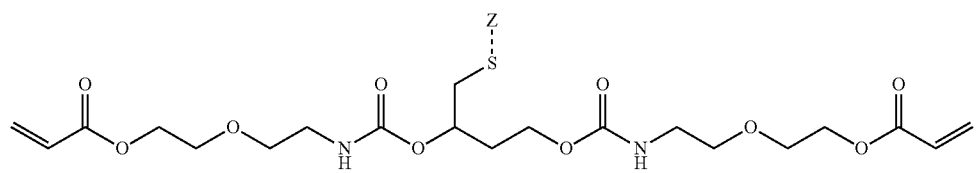
P29
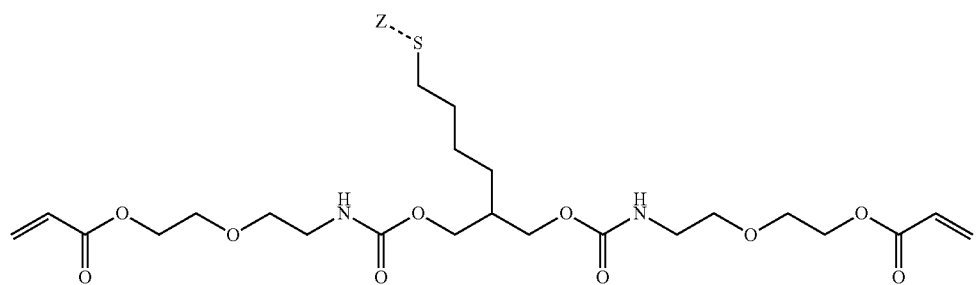
P30
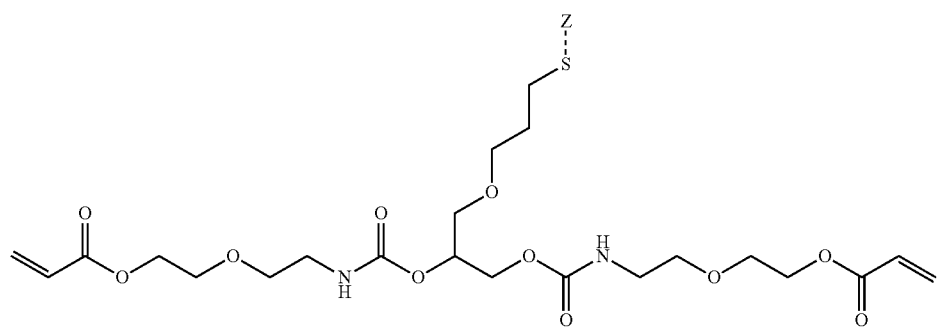
P31

-continued
P32
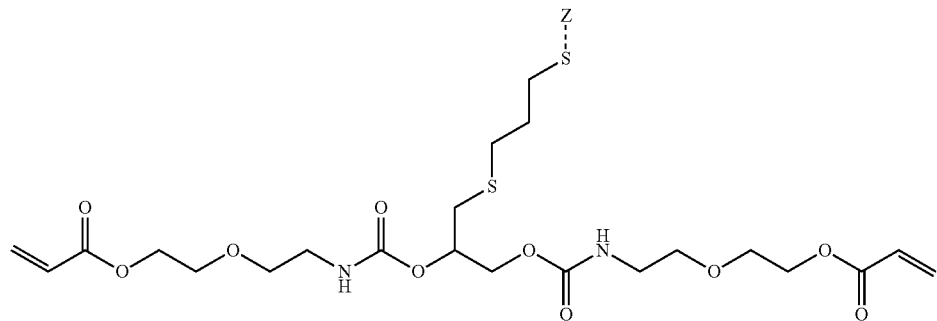
P33
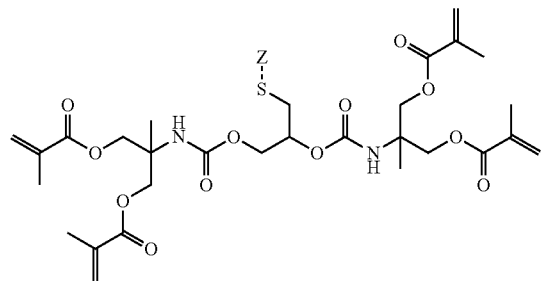
P34
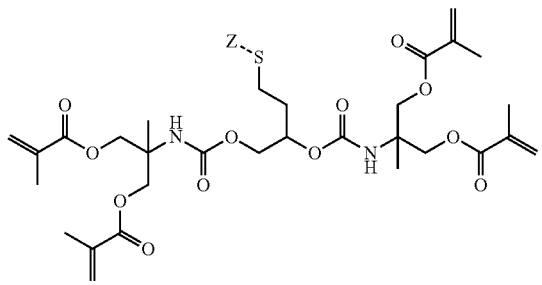
P35
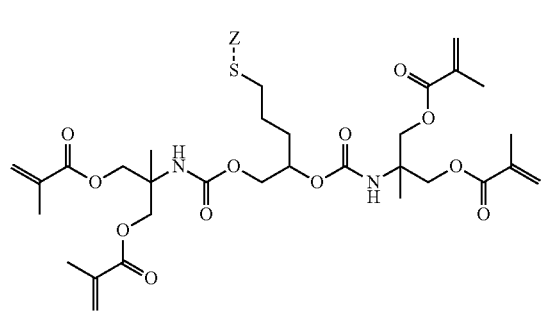
P36
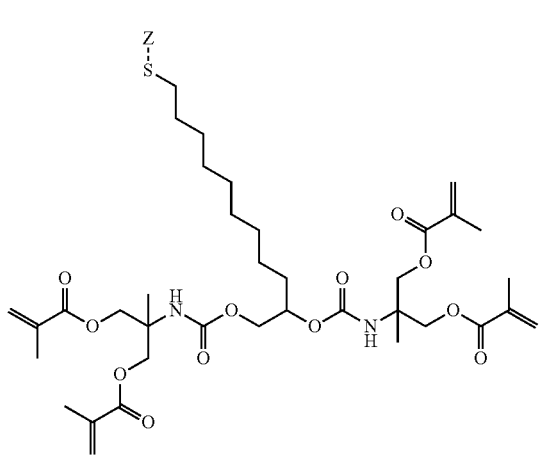
P37
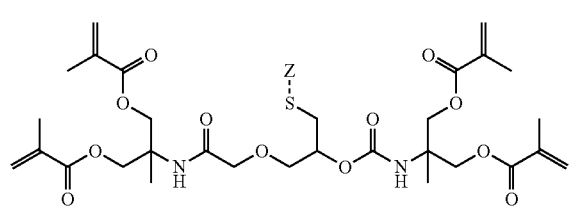
P38
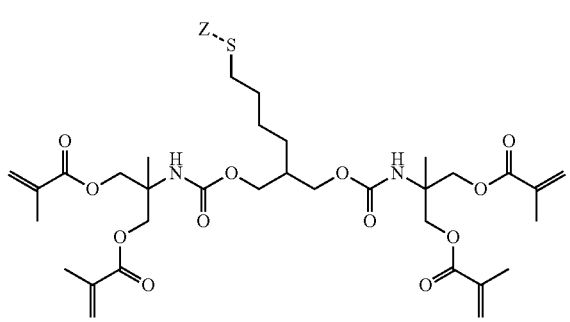

-continued
P39
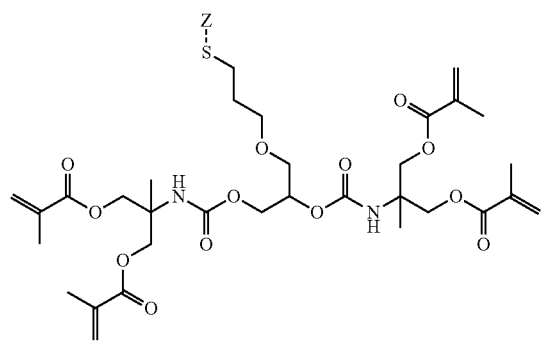
P40
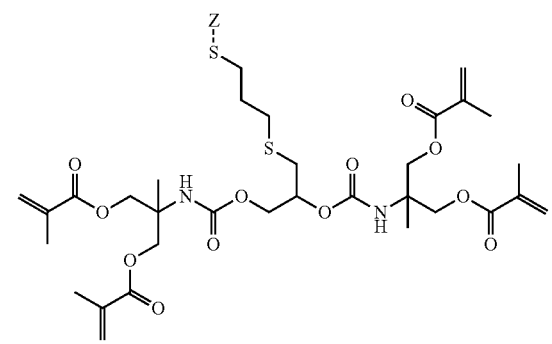
P41
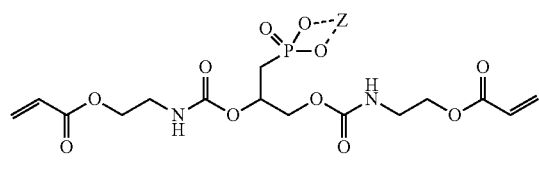
P42
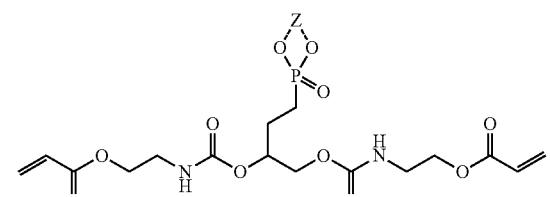
P43
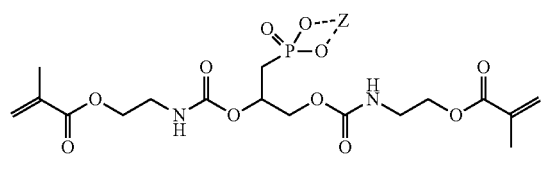
P44
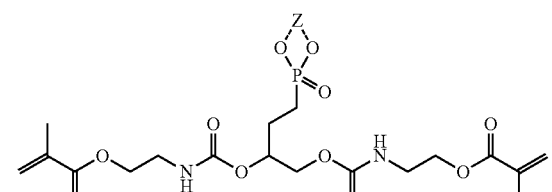
P45
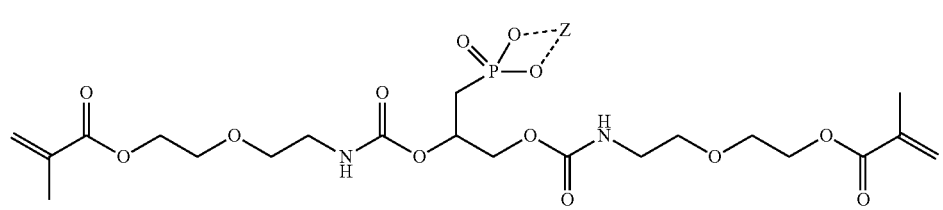
P46
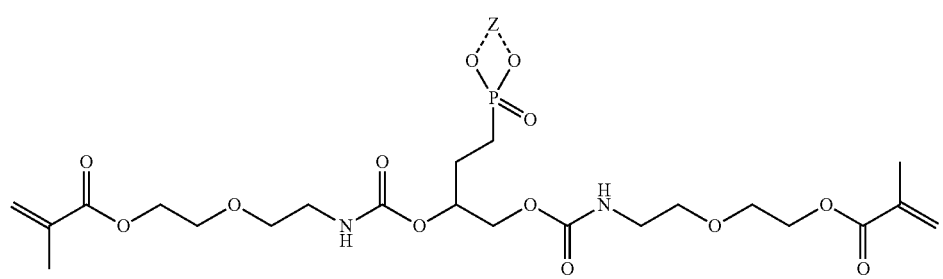
P47
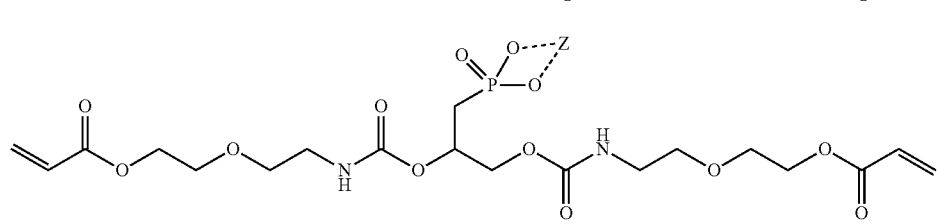

P48
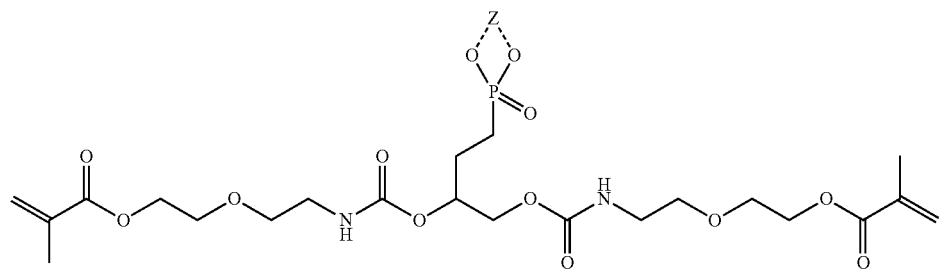
P49
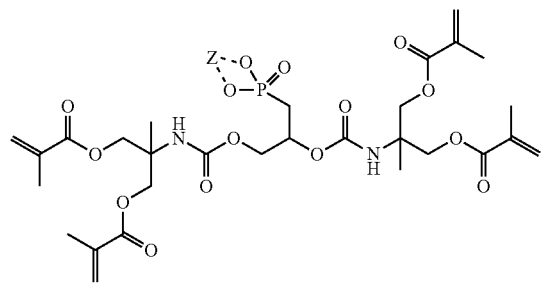
P50
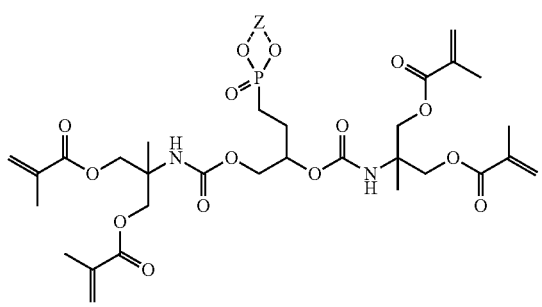
P51
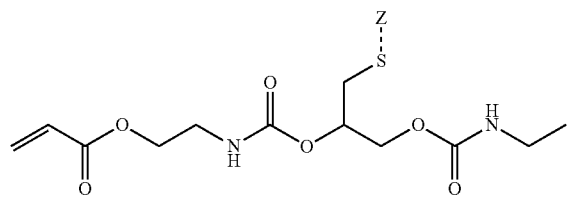
P52
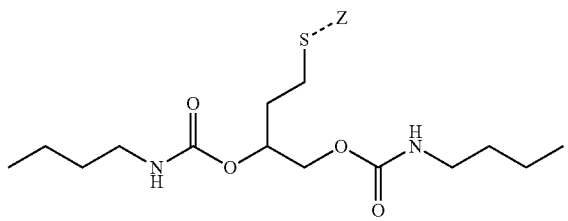
P53
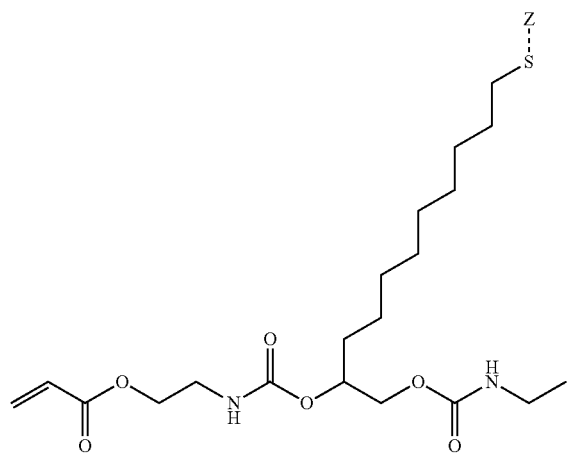
P54
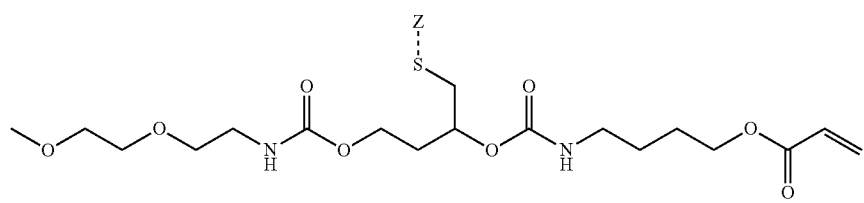

P55
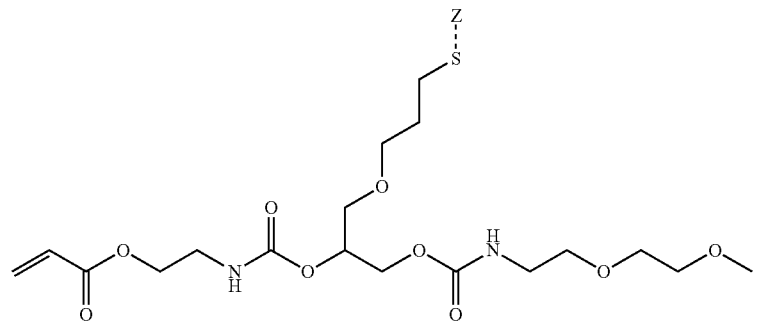
P56
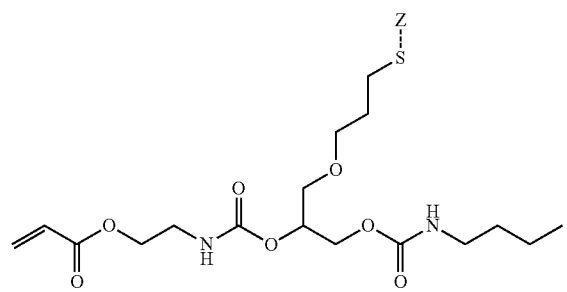
P57
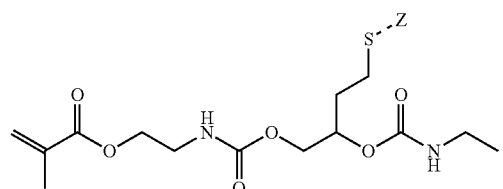
P58
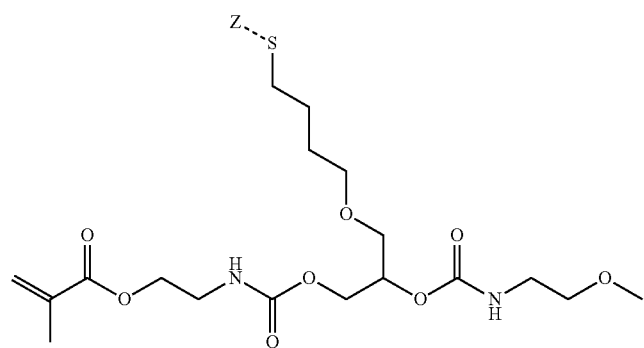
P59
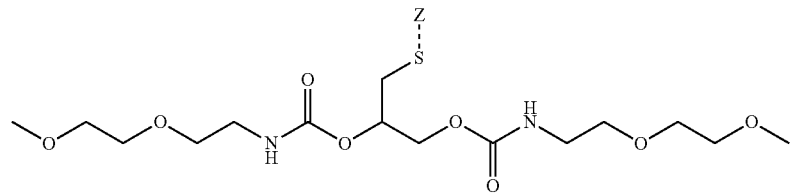
P60
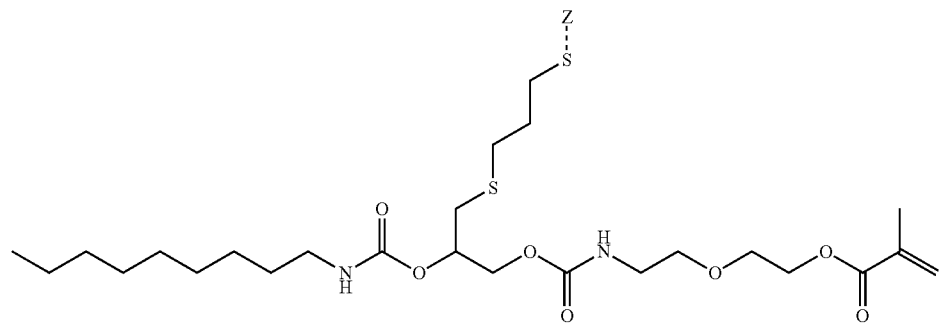

-continued
P61
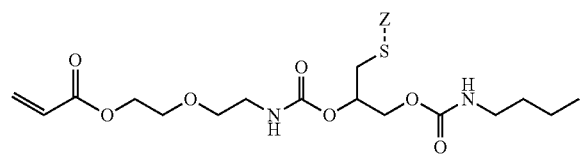
P62
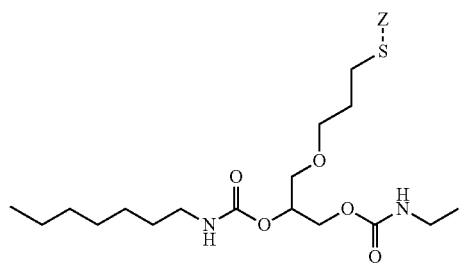
P63
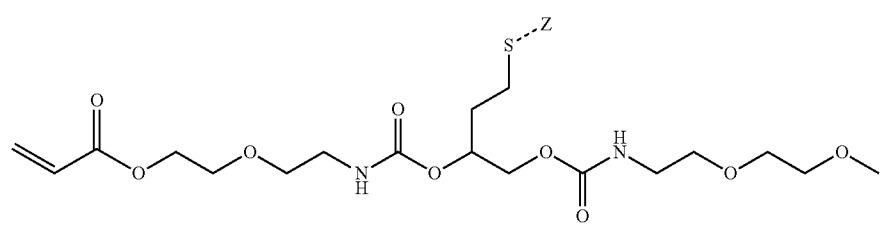
P64
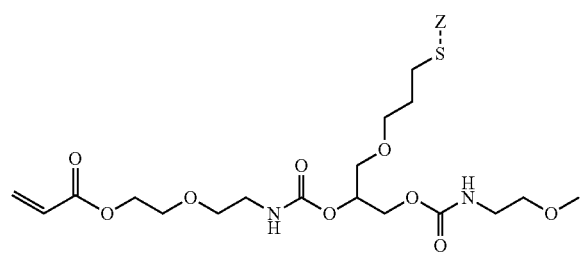
P65
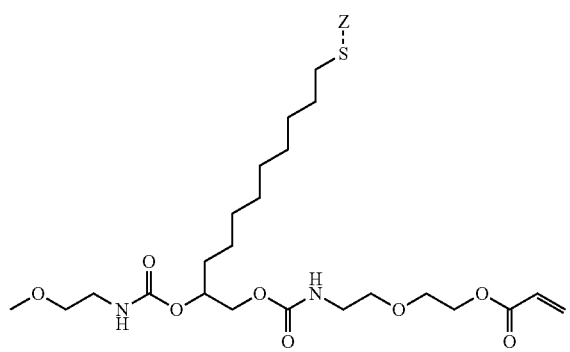
P66
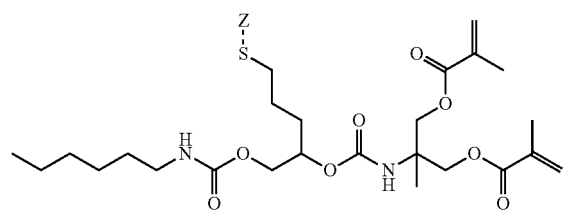
P67
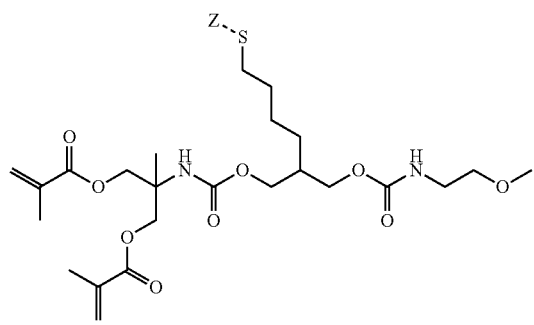
P68
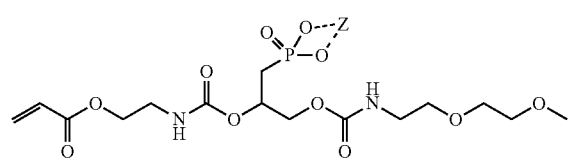
P69
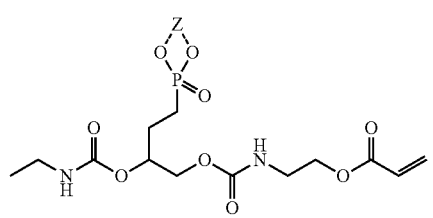

-continued
P70
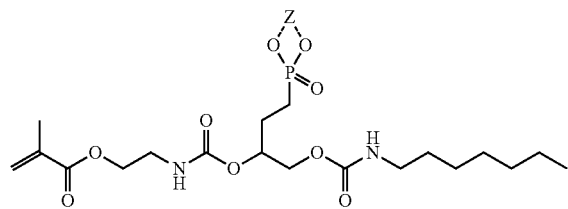
P71
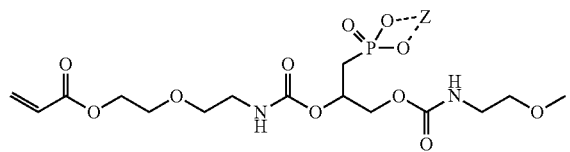
P72
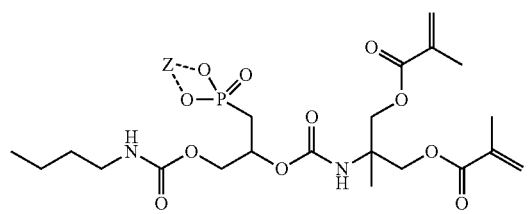
P73
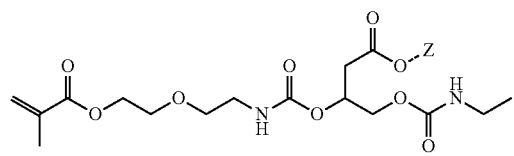
P74
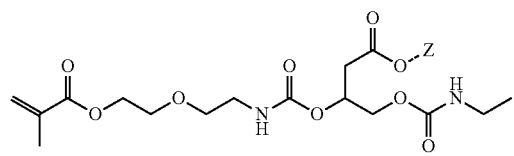
P75
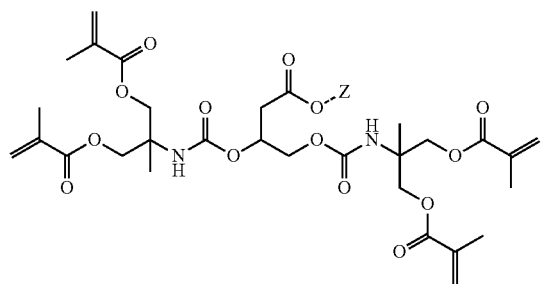
P76
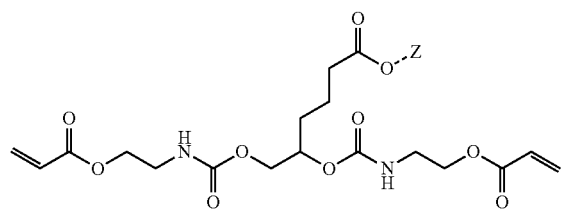
P77
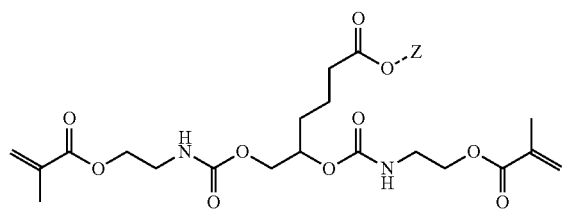
P78
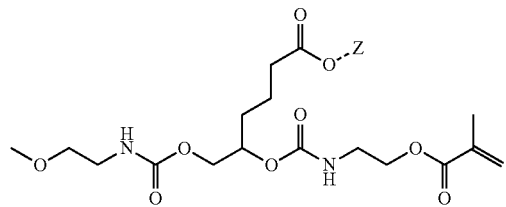
P79
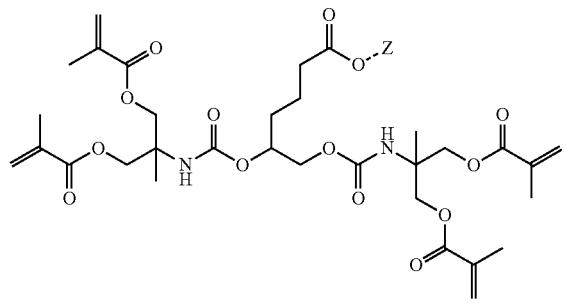

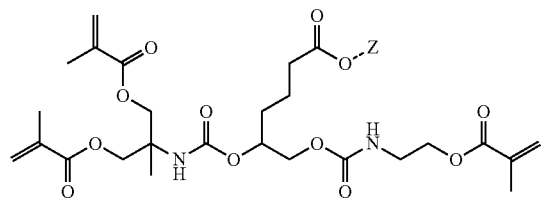

P80

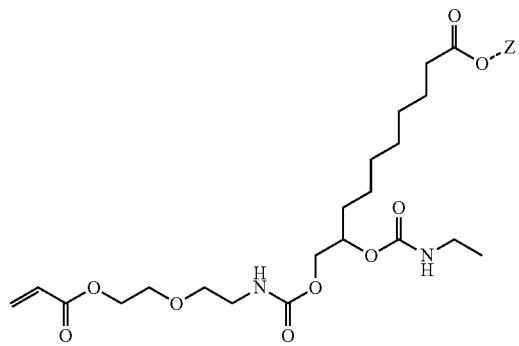

P81

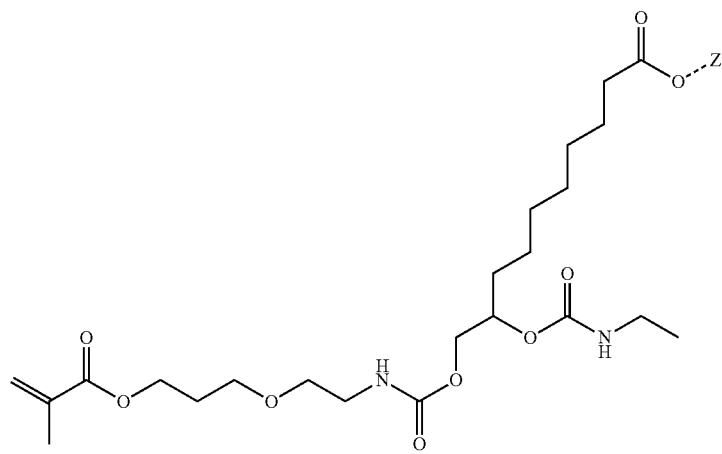

P82

Preparation of Photosensitive Resin Composition

Embodiment 1

In a 20 mL vial, 35 parts by weight of P1 of the present invention as a semiconductor nanoparticle-ligand complex, 60 parts by weight of M-1 (Eternal, EM224) as a photocrosslinkable monomer, and 5 parts by weight of ingacure TPO (Basf) as an initiator, were put and stirred at room temperature for 2 hours, preparing a photosensitive resin composition.

Embodiment 2

In a 20 mL vial, 35 parts by weight of P1 of the present invention as a semiconductor nanoparticle-ligand complex, 57 parts by weight of M-1 as a photocrosslinkable monomer, 5 parts by weight of ingacure TPO as an initiator, and 3 parts by weight of titanium(IV) oxide (SMS) as a light diffuser, were put and stirred at room temperature for 2 hours, preparing a photosensitive resin composition.

Embodiment 3 to Embodiment 20

A photosensitive resin composition was prepared in the same manner as in embodiment 1 or embodiment 2, except that the materials and parts by weight shown in Table 3 are used as the semiconductor nanoparticle-ligand complex, the photocrosslinkable monomer, the initiator, and the light diffuser.

Comparative Example 1

In a 20 mL vial, 35 parts by weight of $C_1$ as a comparative semiconductor nanoparticle-ligand complex, 60 parts by weight of M-1 as a photocrosslinkable monomer, and 5 parts by weight of ingacure TPO as an initiator, were put and stirred at room temperature for 2 hours, preparing a photosensitive resin composition.

Comparative Example 2

In a 20 mL vial, 35 parts by weight of $C_2$ as a comparative semiconductor nanoparticle-ligand complex, 60 parts by weight of M-1 as a photocrosslinkable monomer, and 5 parts by weight of ingacure TPO as an initiator, were put and stirred at room temperature for 2 hours, preparing a photosensitive resin composition.

[Comparative Semiconductor Nanoparticle-Ligand Complex C1]

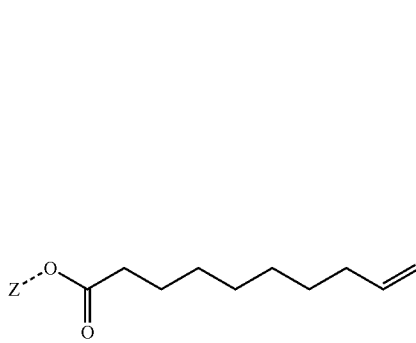

[Comparative Semiconductor Nanoparticle-Ligand Complex C2]

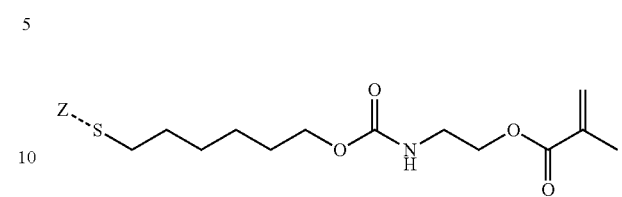

In the structure, Z is a semiconductor nanoparticle (InZnP/ZnSeS).

The composition of the photosensitive resin composition prepared above is summarized in Table 3 below.

TABLE 3

| | Semiconductor nanoparticle-ligand complex | | Photocrosslinkable monomer | | Initiator | | Light diffuser | |
|---|---|---|---|---|---|---|---|---|
| | type | Weight by part | type | Weight by part | type | Weight by part | type | Weight by part |
| Comparative example 1 | C1 | 35 | M-1 | 60 | Ingacure TPO | 5 | TiO$_2$ | 0 |
| Comparative example 2 | C2 | 35 | | 60 | | 5 | | 0 |
| Embodiment 1 | P1 | 35 | | 60 | | 5 | | 0 |
| Embodiment 2 | P1 | 35 | | 57 | | 5 | | 3 |
| Embodiment 3 | P7 | 35 | | 60 | | 5 | | 0 |
| Embodiment 4 | P7 | 35 | | 57 | | 5 | | 3 |
| Embodiment 5 | P11 | 35 | | 60 | | 5 | | 0 |
| Embodiment 6 | P11 | 35 | | 57 | | 5 | | 3 |
| Embodiment 7 | P17 | 35 | | 60 | | 5 | | 0 |
| Embodiment 8 | P17 | 35 | | 57 | | 5 | | 3 |
| Embodiment 9 | P24 | 35 | | 60 | | 5 | | 0 |
| Embodiment 10 | P35 | 35 | | 60 | | 5 | | 0 |
| Embodiment 11 | P43 | 35 | | 60 | | 5 | | 0 |
| Embodiment 12 | P49 | 35 | | 60 | | 5 | | 0 |
| Embodiment 13 | P51 | 35 | | 57 | | 5 | | 0 |
| Embodiment 14 | P51 | 35 | | 60 | | 5 | | 3 |
| Embodiment 15 | P61 | 35 | | 57 | | 5 | | 0 |
| Embodiment 16 | P64 | 35 | | 60 | | 5 | | 3 |
| Embodiment 17 | P74 | 35 | | 57 | | 5 | | 0 |
| Embodiment 18 | P74 | 35 | | 60 | | 5 | | 3 |
| Embodiment 19 | P75 | 35 | | 60 | | 5 | | 0 |
| Embodiment 20 | P76 | 35 | | 60 | | 5 | | 0 |

Viscosity Measurement Method

Under the yellow room condition, 0.5 mL of the photosensitive resin compositions of the embodiment and comparative example prepared above were added dropwise to the specimen holders of a viscometer (Brookfield) and measured at 20 rpm for 1 minute. The measurement results are shown in Table 4 below.

○: No aggregation of the semiconductor nanoparticle-ligand complex

Δ: Aggregation of the semiconductor nanoparticle-ligand complex appears x: Significant aggregation of the semiconductor nanoparticle-ligand complex

TABLE 4

|  | viscosity(cps) | Thickness(μm) | | Film QY (%) | | Compatibility assessment |
|---|---|---|---|---|---|---|
|  |  | Average | Standard deviation | Average | Standard deviation |  |
| Comparative example 1 | unmeasurable | 10.6 | 1.457 | 18.6 | 0.057 | x |
| Comparative example 2 | 32.7 | 11.8 | 0.808 | 29.8 | 0.013 | Δ |
| Embodiment 1 | 17.4 | 10.1 | 0.055 | 33.1 | 0.004 | ○ |
| Embodiment 2 | 18.2 | 10.1 | 0.071 | 33.5 | 0.004 | ○ |
| Embodiment 3 | 16.6 | 10.0 | 0.045 | 33.3 | 0.003 | ○ |
| Embodiment 4 | 17.3 | 10.1 | 0.055 | 33.8 | 0.003 | ○ |
| Embodiment 5 | 17.1 | 10.1 | 0.055 | 33.3 | 0.003 | ○ |
| Embodiment 6 | 19.5 | 10.1 | 0.071 | 33.6 | 0.004 | ○ |
| Embodiment 7 | 16.3 | 10.0 | 0.045 | 33.6 | 0.003 | ○ |
| Embodiment 8 | 17.0 | 10.1 | 0.055 | 34.6 | 0.003 | ○ |
| Embodiment 9 | 16.6 | 10.0 | 0.035 | 34.1 | 0.003 | ○ |
| Embodiment 10 | 17.6 | 10.1 | 0.055 | 33.3 | 0.003 | ○ |
| Embodiment 11 | 18.5 | 10.1 | 0.071 | 32.7 | 0.005 | ○ |
| Embodiment 12 | 18.7 | 10.1 | 0.071 | 32.4 | 0.005 | ○ |
| Embodiment 13 | 18.1 | 10.0 | 0.055 | 32.8 | 0.005 | ○ |
| Embodiment 14 | 19.0 | 10.1 | 0.055 | 33.1 | 0.005 | ○ |
| Embodiment 15 | 16.6 | 10.1 | 0.033 | 34.0 | 0.003 | ○ |
| Embodiment 16 | 17.3 | 10.1 | 0.055 | 34.2 | 0.004 | ○ |
| Embodiment 17 | 17.5 | 10.0 | 0.055 | 33.2 | 0.004 | ○ |
| Embodiment 18 | 18.2 | 10.1 | 0.071 | 33.7 | 0.005 | ○ |
| Embodiment 19 | 18.6 | 10.1 | 0.071 | 33.0 | 0.005 | ○ |
| Embodiment 20 | 17.3 | 10.1 | 0.055 | 33.1 | 0.005 | ○ |

Film Formation Method

Under the $N_2$ condition, the photosensitive resin compositions of the embodiment and comparative example prepared above were dropwise added to 50 mm×50 mm bare glasses, coated for 30 seconds at 500 rpm by a spin coater, and pre-baked for 1 minute on a 100° C. hot plate, forming a film.

Thickness Measurement Method

Figure 3:
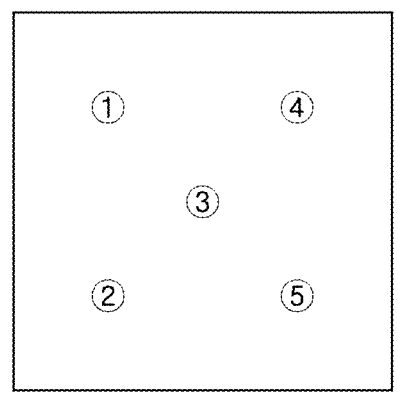
FIG. 3 is a view illustrating the point at which the thickness and optical properties of the film coatings of embodiment 1 and comparative example 2 were evaluated.

The film coatability and thicknesses of the films prepared in the embodiment and comparative example prepared above were measured by a 3D profiler (Nano system) at 5 different points in the same glass as shown in FIG. 3. The measurement results are shown in Table 4 and Table 5 below.

Method for Measuring Film Quantum Efficiency (Film QY)

The film quantum efficiencies of the films prepared in the embodiment and comparative example prepared above were measured by QE-2100 from Otsuka at 5 different points in the same glass as shown in FIG. 3. The measurement results are shown in Table 4 and Table 5 below.

The viscosity, thickness, and film QY measurement results of the photosensitive resin compositions and the films using the photosensitive resin compositions according to the embodiment and comparative example prepared as such are shown in Table 4 below.

Compatibility Assessment of Semiconductor Nanoparticle-Ligand Complex

The photosensitive resin compositions prepared in the embodiment and comparative example were observed with the naked eye to assess the compatibility of the semiconductor nanoparticle-ligand complex according to the following criteria. The results are shown in Table 4 below.

It was identified from the results of Table 4 that the photosensitive resin compositions of comparative examples 1 and 2 prepared from the comparative semiconductor nanoparticle-ligand composites had very high viscosities, whereas the photosensitive resin compositions of the present invention had significantly low viscosity as compared with the photosensitive resin compositions of comparative examples 1 and 2.

Specifically, in comparative example 1 prepared with a comparative semiconductor nanoparticle-ligand complex having a simple alkyl group, the aggregation of the semiconductor nanoparticle-ligand complex was maximized such that viscosity measurement was impossible. In comparative example 2 prepared with a comparative semiconductor nanoparticle-ligand complex having one carbamate-based substituent, viscosity measurement was possible, but was measured as high due to severe aggregation of the semiconductor nanoparticle-ligand complex. Such a high viscosity may cause nozzle clogging in the process if inkjetting is applied and failure to form a uniform film due to poor spreadability on the substrate.

In contrast, in the case of the inorganic nanostructure prepared with the compound of the present invention, adopting at least two carbamate-based substituents, aggregation between the semiconductor nanoparticle-ligand complexes was significantly mitigated, and a low viscosity of 20 cps or less was measured. This low viscosity leads to excellent characteristics in the process.

Figure 2:
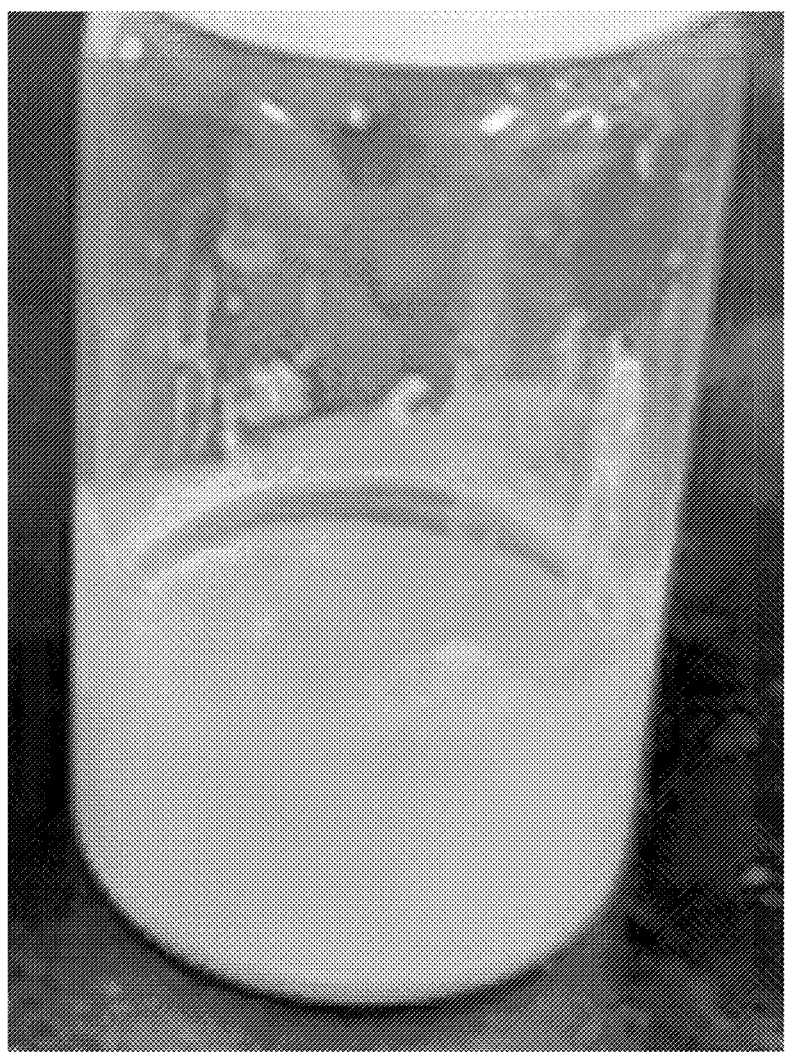
FIG. 2 is a view illustrating the compatibility of the semiconductor nanoparticle-ligand complex of comparative example 2.

Referring to FIGS. 1, 2, and Table 5, it is determined that the semiconductor nanoparticle-ligand complex included in the photosensitive resin composition according to embodiments of the present invention has high compatibility.

Conversely, comparative example 1 has very low compatibility, and comparative example 2 also has low compatibility. As an interaction between the semiconductor nanoparticle-ligand complexes occurs due to an increase in aggregation of the semiconductor nanoparticle-ligand complexes, it is expected to affect the quantum efficiency.

Meanwhile, the thickness and film QY measurement results at five different points in the same glass as shown in FIG. 3 on the films prepared using the photosensitive resin compositions prepared in embodiment 1, embodiment 3, embodiment 4, embodiment 13, embodiment 14, comparative example 1, and comparative example 2 are shown in Table 5.

TABLE 5

|  |  | Embodiment 1 | Embodiment 3 | Embodiment 4 | Embodiment 13 | Embodiment 14 | Comparative example 1 | Comparative example 2 |
| --- | --- | --- | --- | --- | --- | --- | --- | --- |
| Thickness (μm) | ① | 10.0 | 10.0 | 10.0 | 10.0 | 10.1 | 11.2 | 12.6 |
|  | ② | 10.1 | 10.1 | 10.1 | 10.0 | 10.0 | 9.4 | 11.5 |
|  | ③ | 10.0 | 10.0 | 10.1 | 10.1 | 10.1 | 10.4 | 10.6 |
|  | ④ | 10.1 | 10.0 | 10.0 | 10.0 | 10.1 | 12.7 | 12.1 |
|  | ⑤ | 10.1 | 10.0 | 10.0 | 10.1 | 10.0 | 9.1 | 12.4 |
| Film QY (%) | ① | 33.6 | 33.3 | 33.9 | 33.5 | 32.5 | 26.2 | 30.5 |
|  | ② | 32.9 | 32.8 | 34.2 | 32.4 | 33.4 | 13.8 | 27.8 |
|  | ③ | 33.5 | 33.7 | 33.4 | 33.1 | 33.6 | 22.5 | 29.3 |
|  | ④ | 32.7 | 33.4 | 34.0 | 32.3 | 32.7 | 18.0 | 31.0 |
|  | ⑤ | 33.0 | 33.5 | 33.5 | 32.7 | 33.1 | 12.7 | 30.3 |

It may be identified from the results of Table 5 that as compared to the film prepared with the photosensitive resin composition prepared in the present invention, comparative example 1 and comparative example 2 have ununiform coatability and thus low efficiency. It is determined that the result comes from the reason why the photosensitive resin compositions of embodiment 1, embodiment 3, embodiment 4, embodiment 13, and embodiment 14 have higher compatibility than the photosensitive resin compositions of comparative example 1 and comparative example 2. In particular, as compared with comparative example 2, it is determined that the results comes from the reason why the specific gravity of oxygen contained in the ligand of the semiconductor nanoparticle-ligand complex prepared according to the present invention is higher than that of comparative example 2, and compatibility with the photocrosslinkable monomer is relatively excellent.

As a result, a photosensitive resin composition having low viscosity and high compatibility may be prepared with the semiconductor nanoparticle-ligand composite of the present invention, and it is thus determined to have uniform film and remarkably excellent quantum efficiency.

The above description is merely an example description of the present invention, and various changes may be made thereto without departing from the essential features of the present invention by one of ordinary skill in the art. Accordingly, the embodiments set forth herein are provided for illustrative purposes, but not to limit the scope of the present invention, and should be appreciated that the scope of the present invention is not limited by the embodiments. The scope of the present invention should be construed by the following claims, and all technical spirits within equivalents thereof should be interpreted to belong to the scope of the present invention.

The invention claimed is:

1. A semiconductor nanoparticle-ligand complex including a ligand represented by chemical formula 1 below:

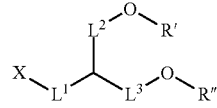

[Chemical formula 1]

in chemical formula 1, wherein X is a functional group bonded to a surface of a semiconductor nanoparticle and is —S(H), —P=O(OH)$_2$ or —COOH, wherein L$^1$ is selected from the group consisting of: an arylene group of C$_6$-C$_{30}$; a heterocyclic group of C$_2$-C$_{30}$ including at least one heteroatom selected from the group consisting of O, N, S, Si, and P; an alkylene group of C$_1$-C$_{20}$; an alkoxyl group of C$_1$-C$_{20}$; an alkylthio group of C$_1$-C$_{20}$; and a combination thereof, wherein L$^2$ and L$^3$ are, independently of each other, selected from the group consisting of a single bond; an arylene group of C$_6$-C$_{20}$; a heterocyclic group of C$_2$-C$_{20}$ including at least one heteroatom selected from the group consisting of O, N, S, Si, and P; an aliphatic ring group of C$_3$-C$_{20}$; an alkylene group of C$_1$-C$_{10}$; an alkoxyl group of C$_1$-C$_{10}$; an alkylthio group of C$_1$-C$_{10}$; and a combination thereof, wherein R' and R" are, independently of each other, represented by one of chemical formulas 2 to 4 below,

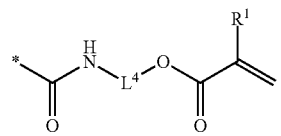

[Chemical formula 2]

in chemical formula 2, wherein R$^1$ is, independently of each other, a hydrogen or methyl group, wherein L$^4$ is, independently of each other, selected from the group consisting of an alkylene group of C$_1$-C$_{20}$; an alkoxyl group of C$_1$-C$_{20}$; an alkylthio group of C$_1$-C$_{20}$; and chemical formula 5 below,

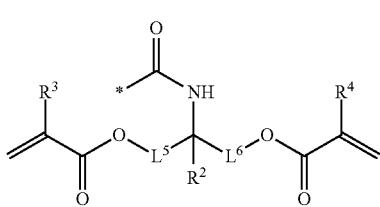

[Chemical formula 3]

in chemical formula 3, wherein $R^2$ to $R^4$ are, independently of each other, a hydrogen or methyl group, wherein $L^5$ and $L^6$ are, independently of each other, selected from the group consisting of an alkylene group of $C_1$-$C_{20}$; an alkoxyl group of $C_1$-$C_{20}$; an alkylthio group of $C_1$-$C_{20}$; and chemical formula 5,

[Chemical formula 4]

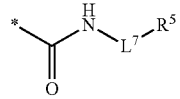

wherein in chemical formula 4 above, $R^5$ is, independently of each other, an alkyl group of $C_1$-$C_{10}$, wherein $L^7$ is, independently of each other, selected from the group consisting of a single bond; an alkylene group of $C_1$-$C_{20}$; an alkoxyl group of $C_1$-$C_{20}$; an alkylthio group of $C_1$-$C_{20}$; and chemical formula 5, wherein in $L^1$ to $L^7$ in chemical formulas 1 to 4, each of the arylene group, the heterocyclic group, the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$,

[Chemical formula 5]

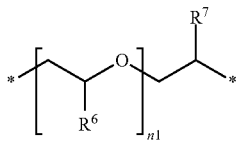

in chemical formula 5, wherein n1 is an integer from 1 to 12, and wherein $R^6$ and $R^7$ are, independently of each other, a hydrogen or methyl group.

2. The semiconductor nanoparticle-ligand complex of claim 1, wherein the ligand represented by chemical formula 1 is represented by any one of chemical formulas below:

[Chemical formula 1-1]

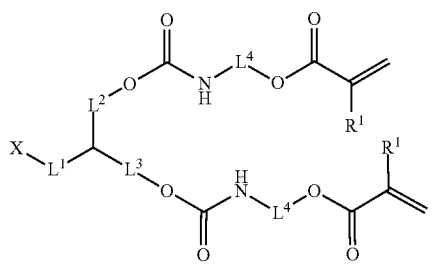

[Chemical formula 1-2]

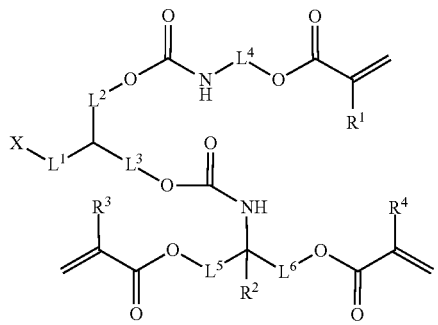

[Chemical formula 1-3]

[Chemical formula 1-4]

[Chemical formula 1-5]

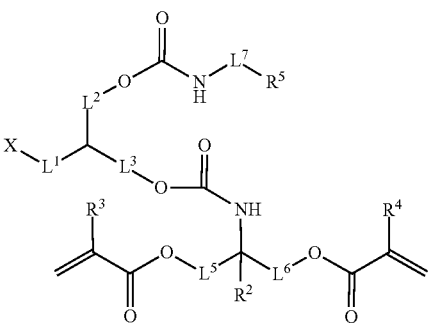

[Chemical formula 1-6]

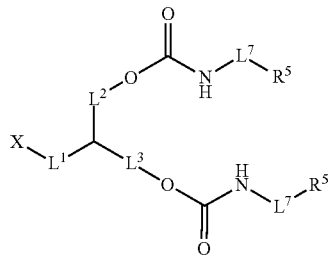

in chemical formula 1-1 to chemical formula 1-6 above,

X, L¹, L² and L³ are the same as those defined in chemical formula 1 above, and R¹ to R⁵ and L⁴ to L⁷ are the same as those defined in chemical formulas 2 to 4 above.

3. The semiconductor nanoparticle-ligand complex of claim 1, wherein the ligand represented by chemical formula 1 is any one of compounds below:

L1

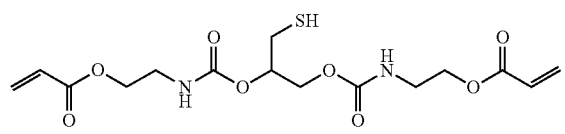

L2

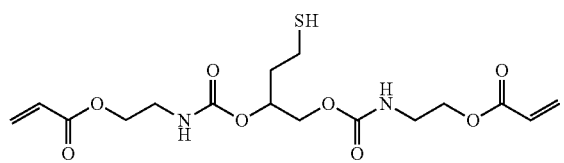

L3

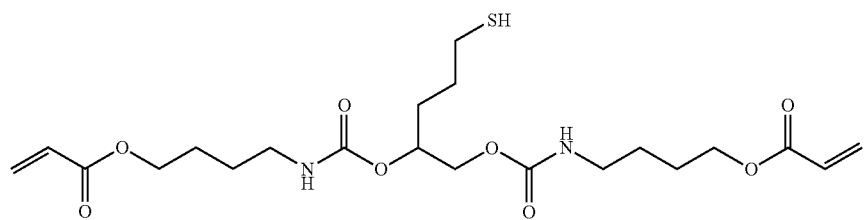

L4

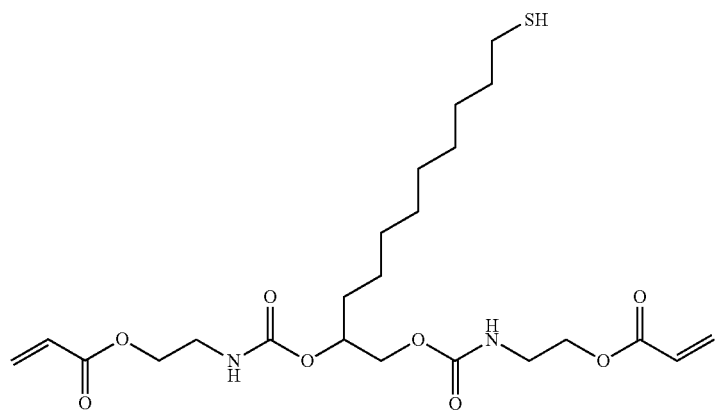

L5

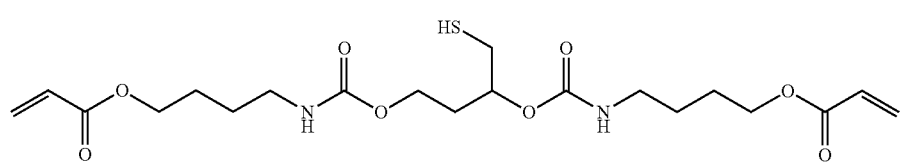

L6

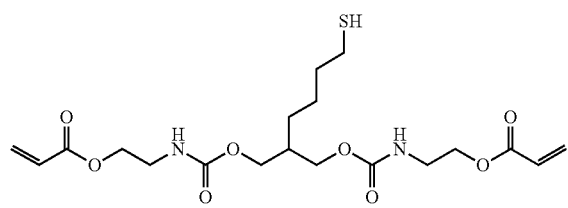

L7

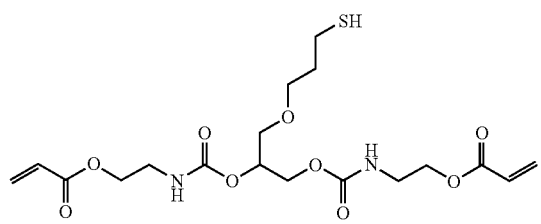

-continued
| | |
|---|---|
| L8 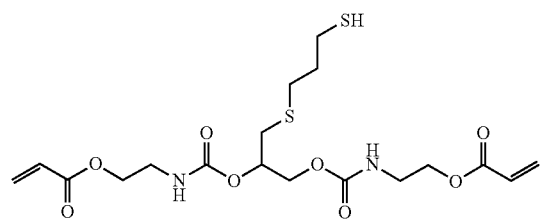 | L9 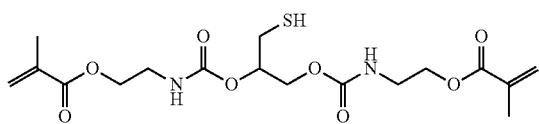 |
| L10 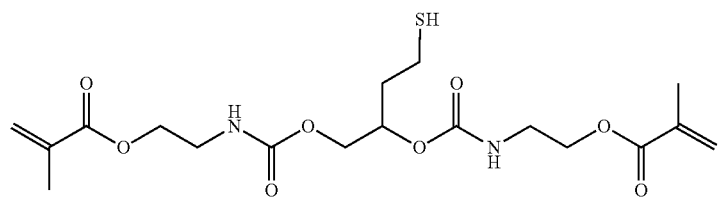 | |
| L11 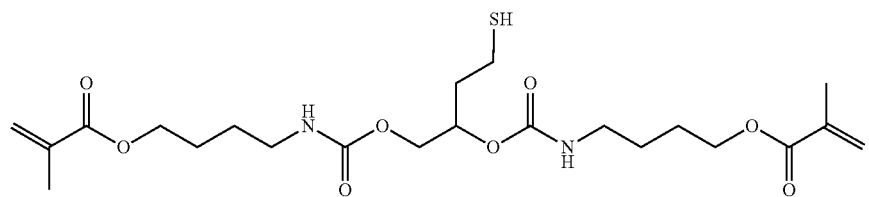 | |
| L12 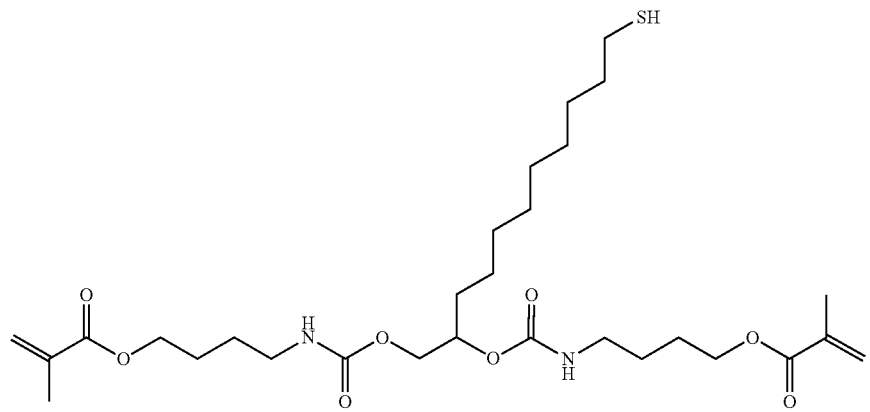 | |
| L13 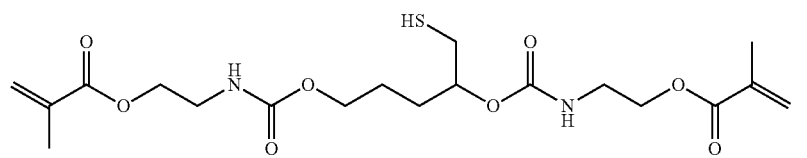 | |
| L14 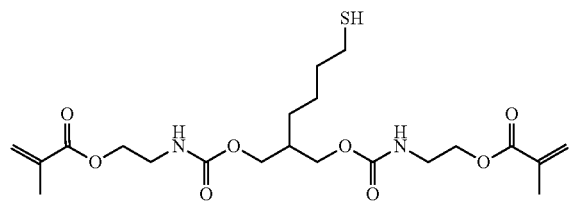 | L15 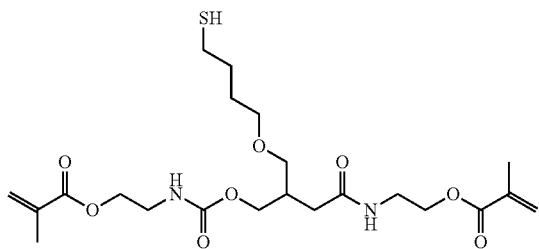 |

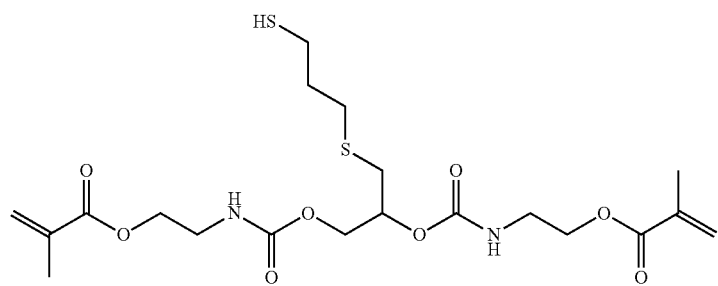 L16
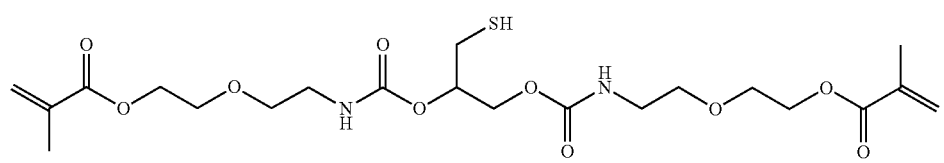 L17
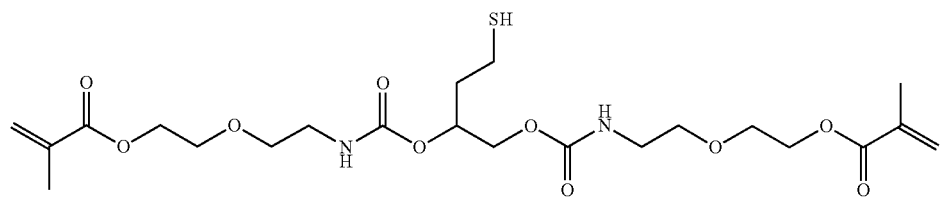 L18
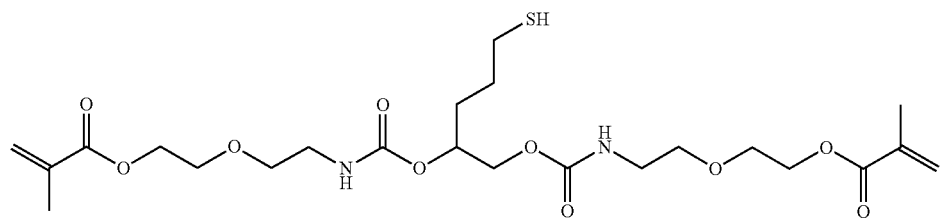 L19
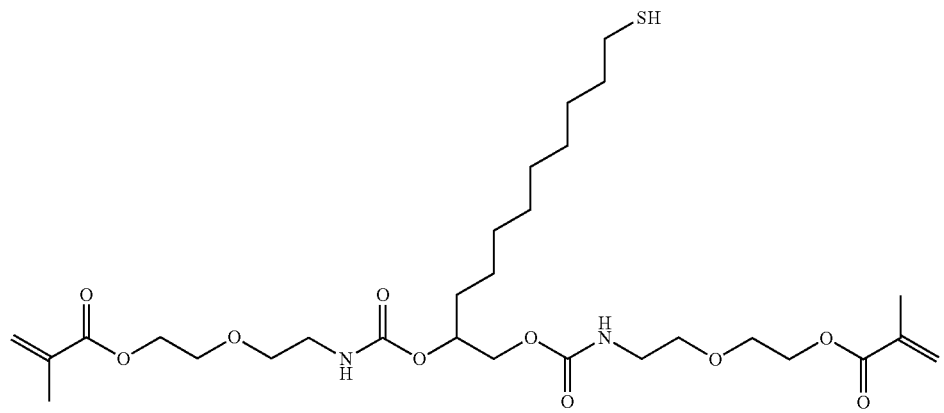 L20
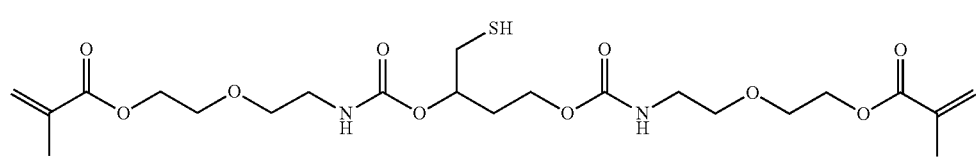 L21

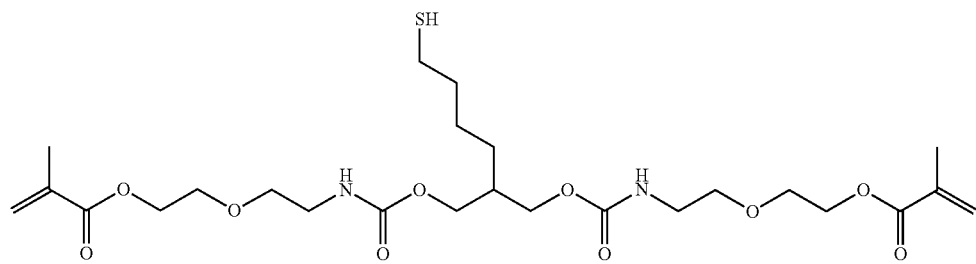
L22
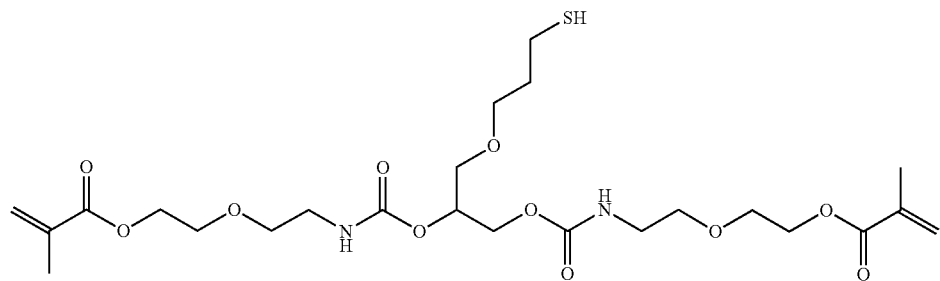
L23
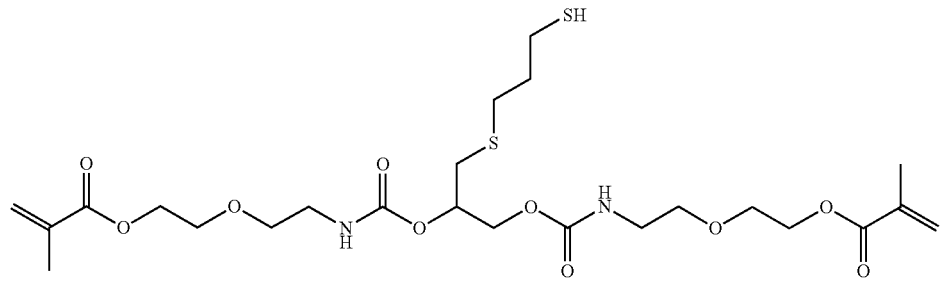
L24
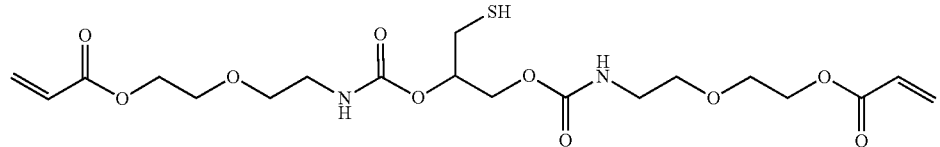
L25
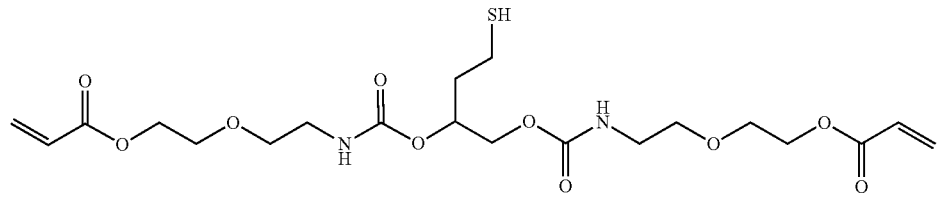
L26
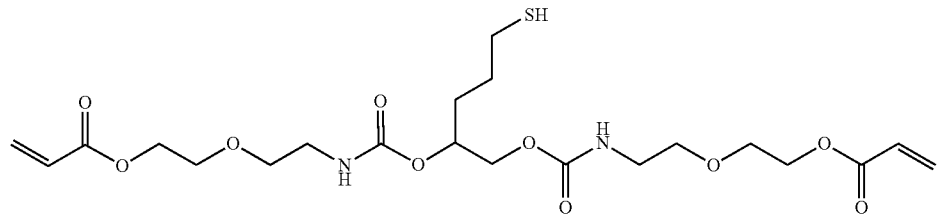
L27

-continued
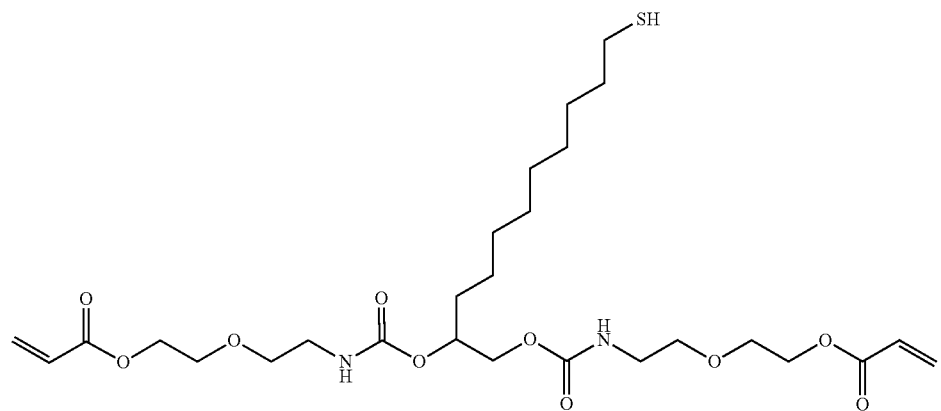
L28
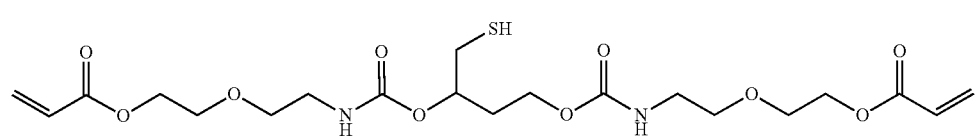
L29
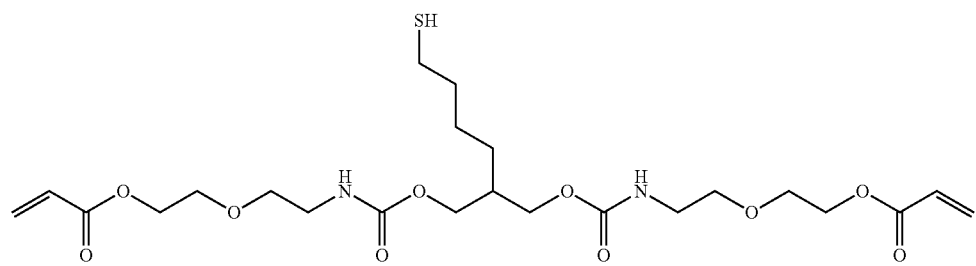
L30
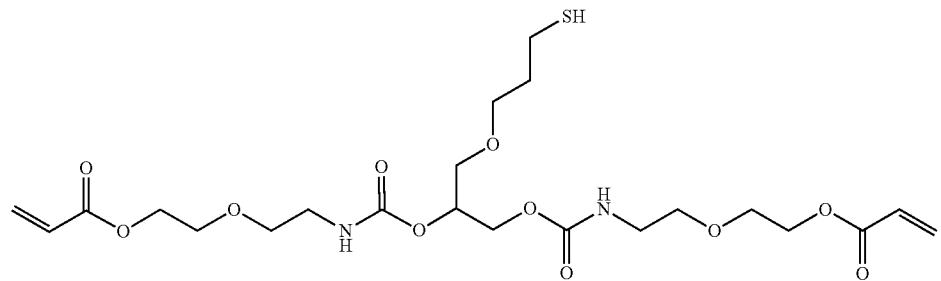
L31
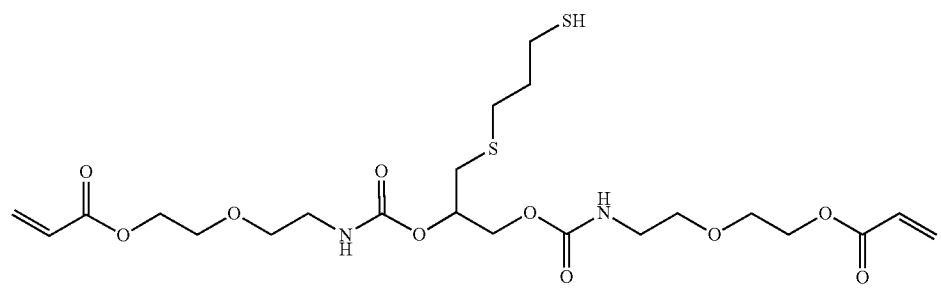
L32

-continued
L33
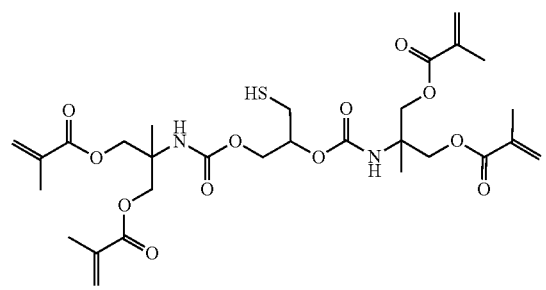
L34
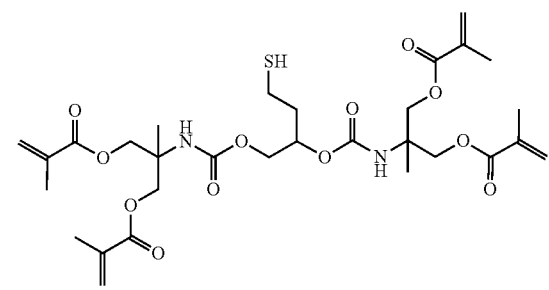
L35
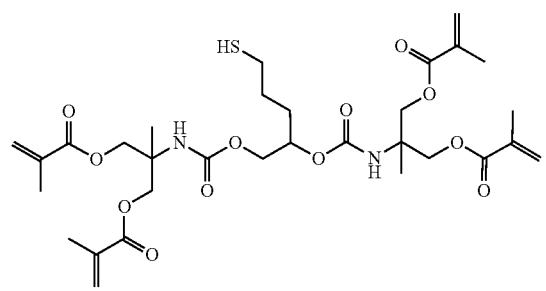
L36
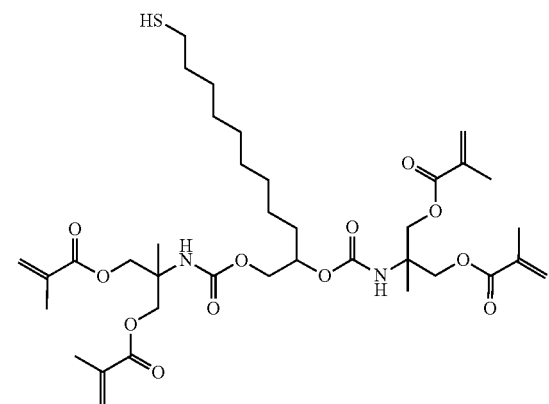
L37
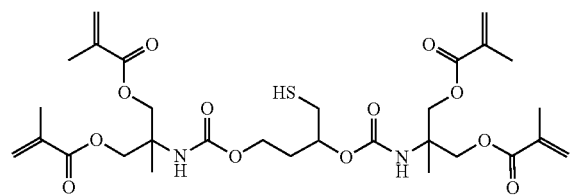
L38
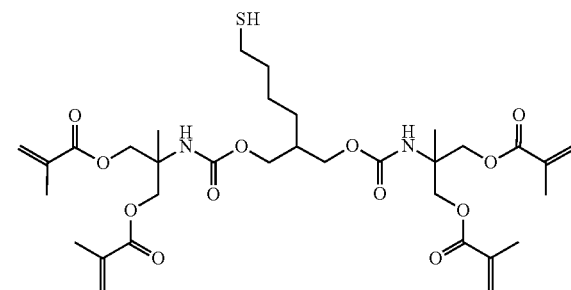
L39
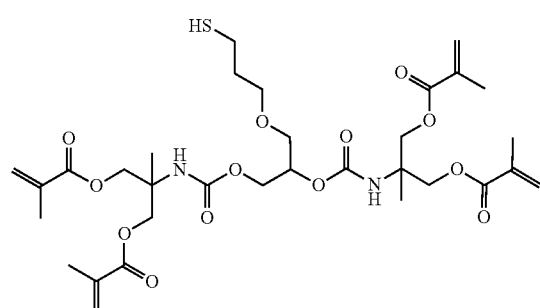
L40
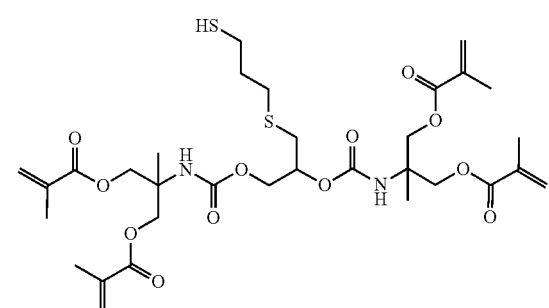
L41
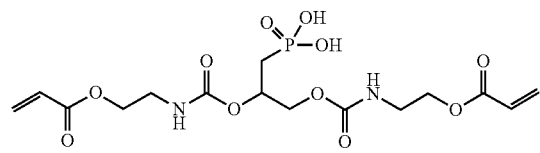
L42
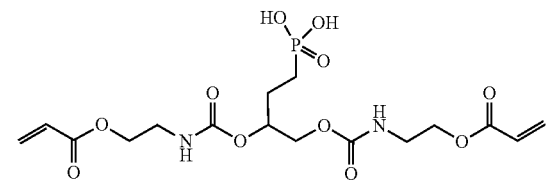

-continued
L43
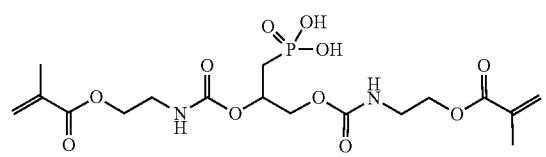
L44
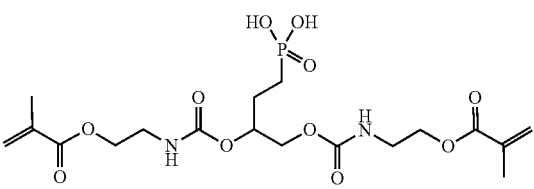
L45
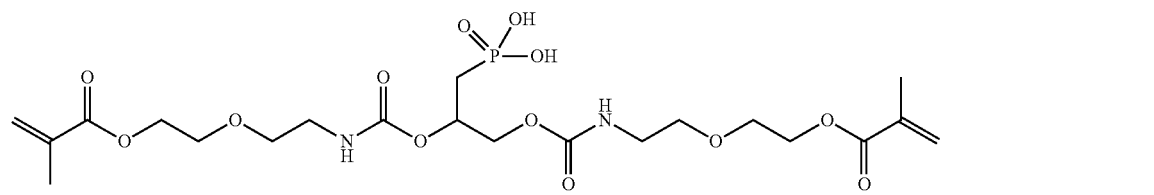
L46
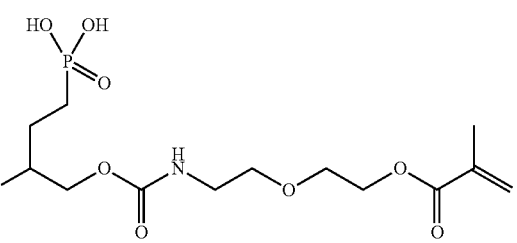
L47
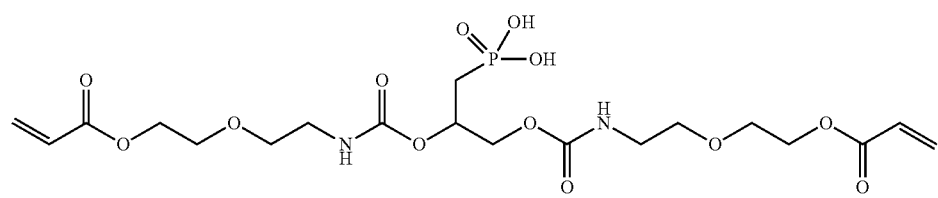
L48
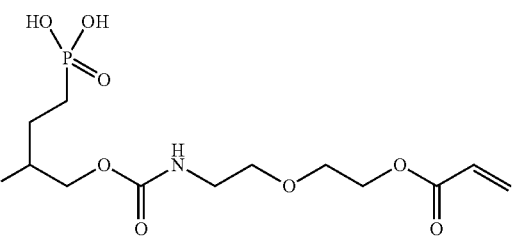
L49
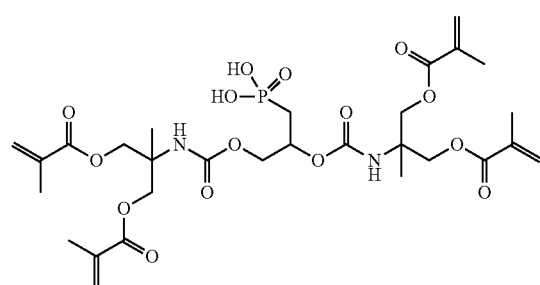
L50
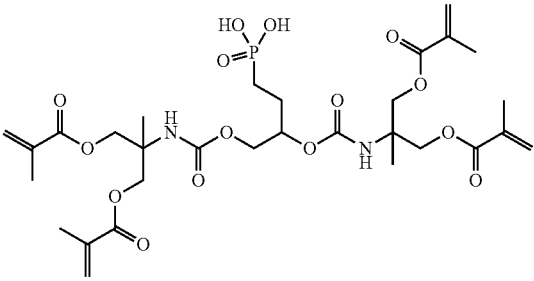
L51
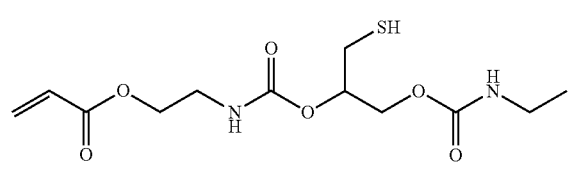
L52
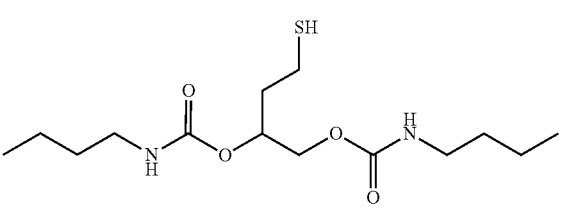

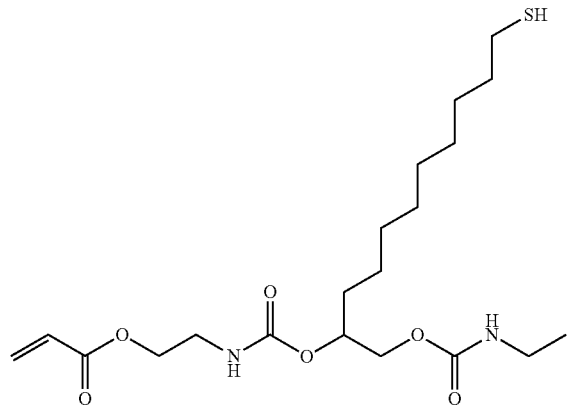
L53
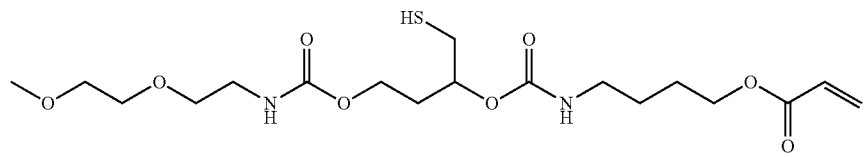
L54
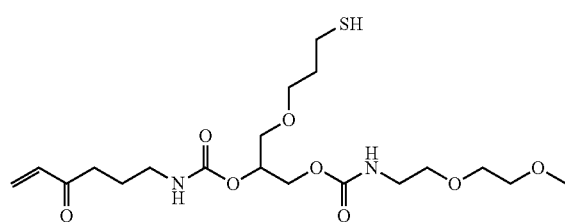
L55
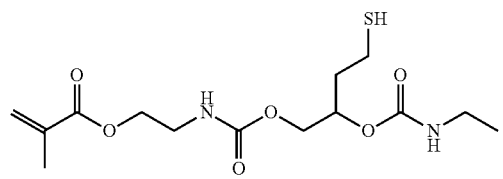
L56
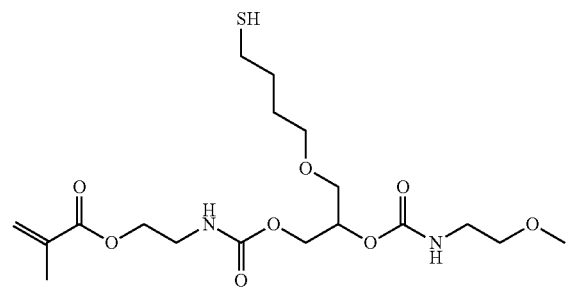
L57
L58
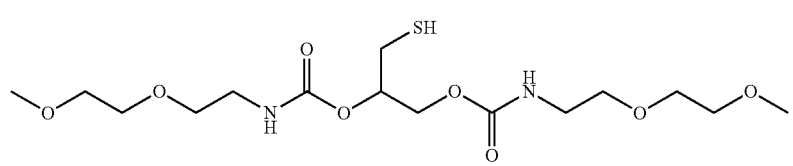
L59
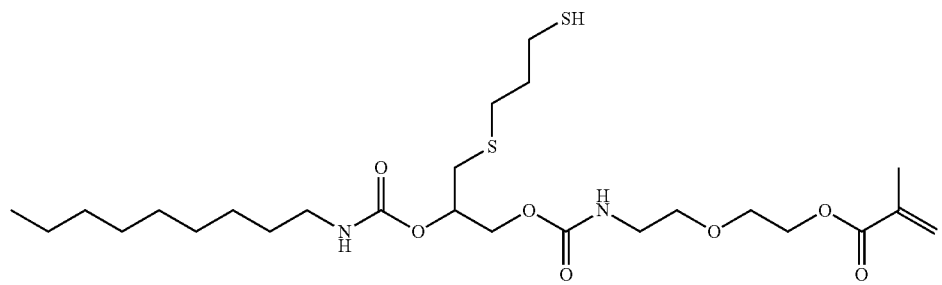
L60

-continued
L61
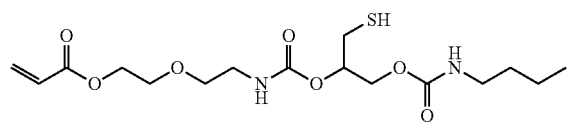
L62
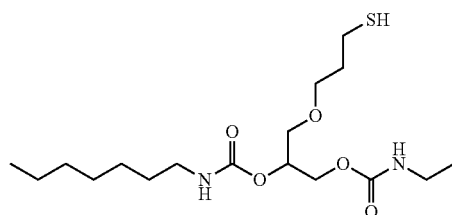
L63
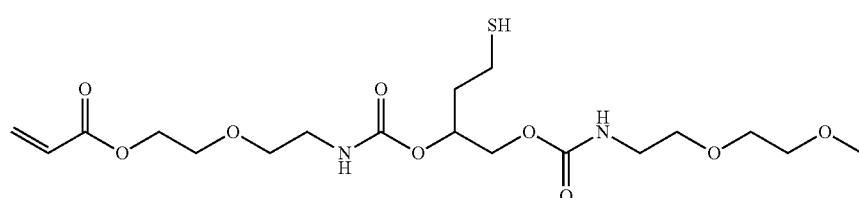
L64
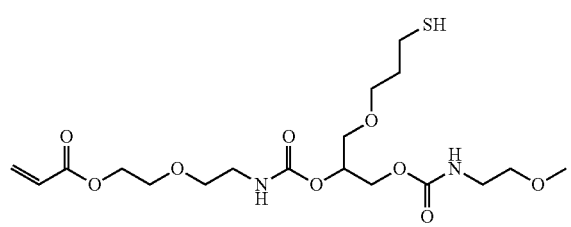
L65
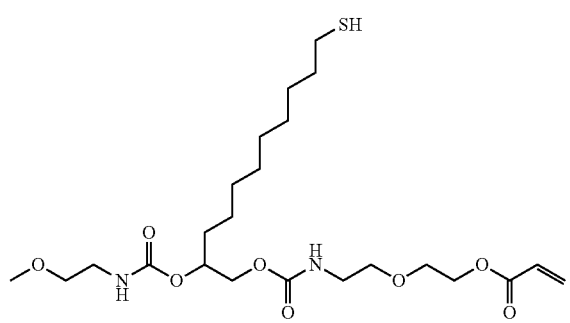
L66
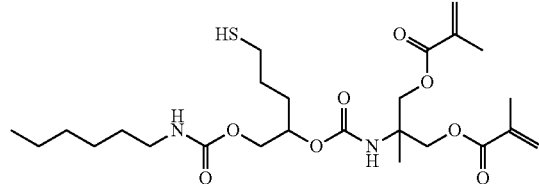
L67
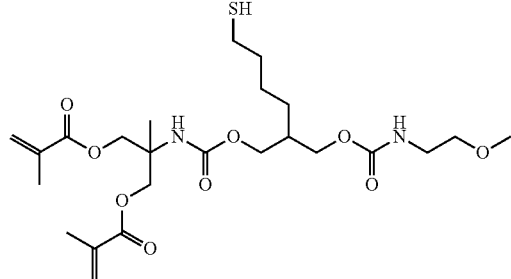
L68
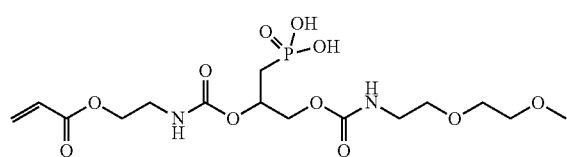
L69
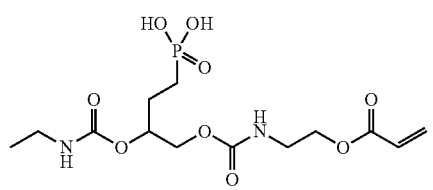
L70
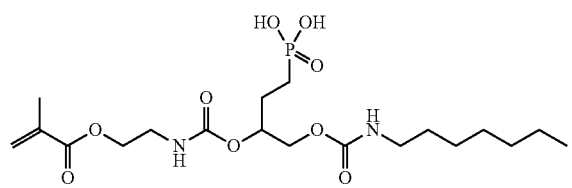
L71
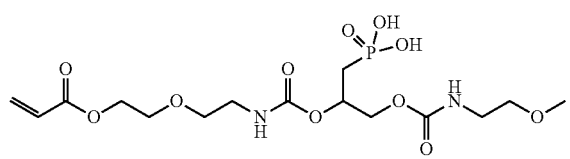

-continued
L72
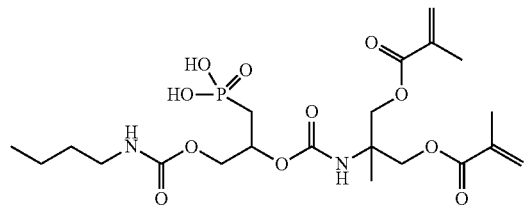
L73
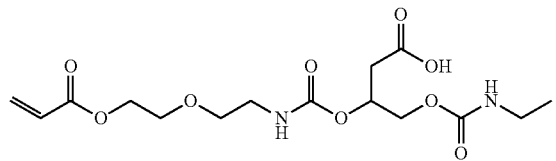
L74
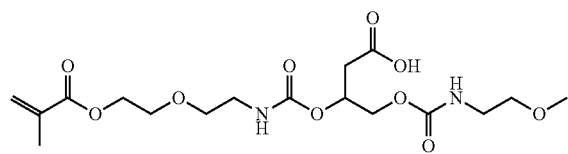
L75
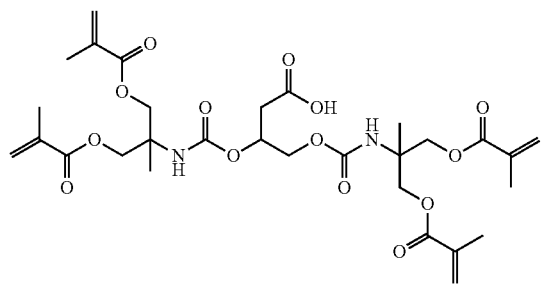
L76
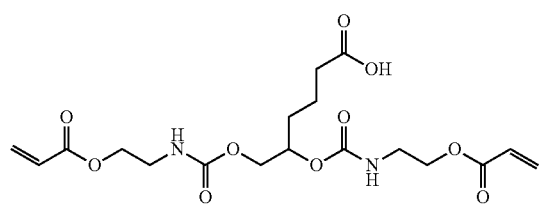
L77
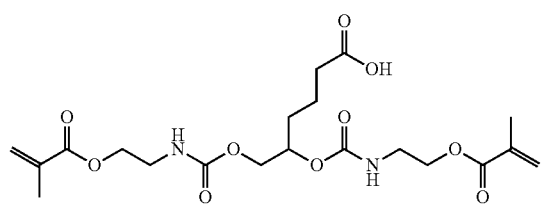
L78
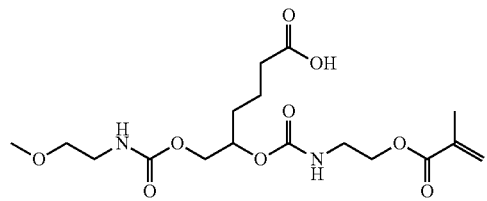
L79
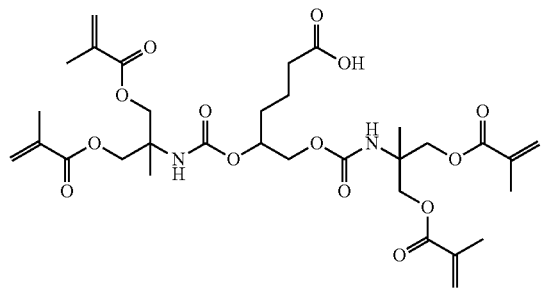
L80
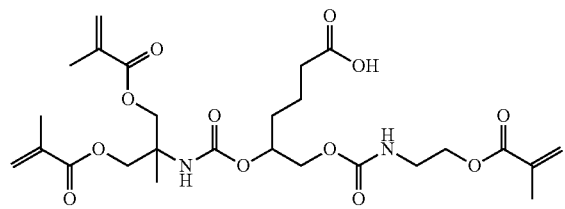
L81
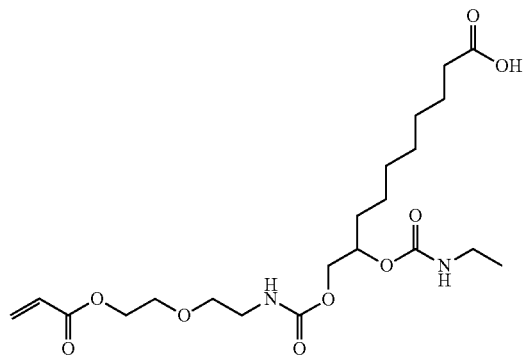

L82

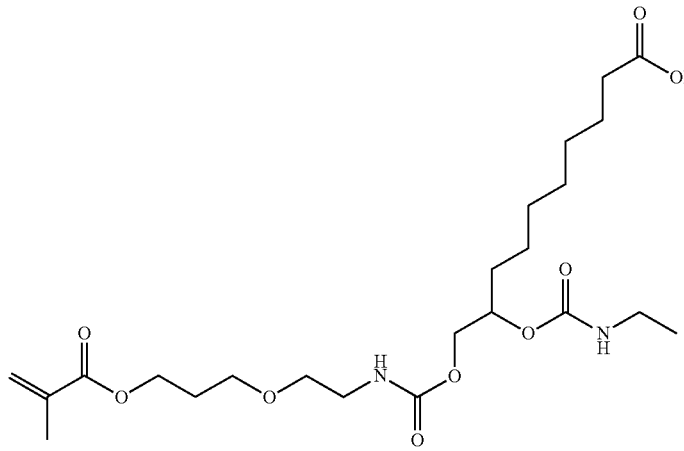

4. The semiconductor nanoparticle-ligand complex of claim 1,
wherein the semiconductor nanoparticle has a particle size of 1 nm to 30 nm.

5. A method for preparing a semiconductor nanoparticle-ligand complex, comprising:
a first surface modification step surface-modifying a surface of a semiconductor nanoparticle with a compound represented by chemical formula 6 below; and
a second surface modification step performing surface modification by reacting an alcohol group (—OH) of chemical formula 6 of the semiconductor nanoparticle surface-modified by the compound represented by chemical formula 6 with an acrylic compound:

[Chemical formula 6]

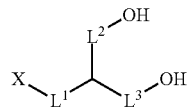

in chemical formula 6,
wherein X is a functional group bonded to a surface of a semiconductor nanoparticle and is —S(H), —P=O(OH)$_2$ or —COOH,
wherein $L^1$ is selected from the group consisting of: an arylene group of $C_6$-$C_{30}$; a heterocyclic group of $C_2$-$C_{30}$ including at least one heteroatom selected from the group consisting of O, N, S, Si, and P; an alkylene group of $C_1$-$C_{20}$; an alkoxyl group of $C_1$-$C_{20}$; an alkylthio group of $C_1$-$C_{20}$; and a combination thereof,
wherein $L^2$ and $L^3$ are, independently of each other, selected from the group consisting of a single bond; an arylene group of $C_6$-$C_{20}$; a heterocyclic group of $C_2$-$C_{20}$ including at least one heteroatom selected from the group consisting of O, N, S, Si, and P; an aliphatic ring group of $C_3$-$C_{20}$, an alkylene group of $C_1$-$C_{10}$; an alkoxyl group of $C_1$-$C_{10}$; an alkylthio group of $C_1$-$C_{10}$; and a combination thereof,
wherein in $L^1$ to $L^3$, each of the arylene group, the heterocyclic group, the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$.

6. The method of claim 5,
wherein the acrylic compound is represented by chemical formula 7 to chemical formula 9 below:

[Chemical formula 7]

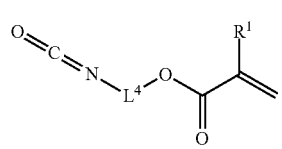

in chemical formula 7,
$R^1$ is a hydrogen or methyl group,
wherein $L^4$ is selected from the group consisting of an alkylene group of $C_1$-$C_{20}$; an alkoxyl group of $C_1$-$C_{20}$; an alkylthio group of $C_1$-$C_{20}$; and chemical formula 10 below,

[Chemical formula 8]

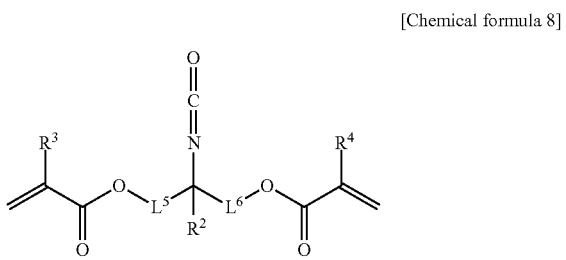

in chemical formula 8,
wherein $R^2$ to $R^4$ are, independently of each other, a hydrogen or methyl group,
wherein $L^5$ and $L^6$ are, independently of each other, selected from the group consisting of an alkylene group of $C_1$-$C_{20}$; an alkoxyl group of $C_1$-$C_{20}$; an alkylthio group of $C_1$-$C_{20}$; and chemical formula 10,

[Chemical formula 9]

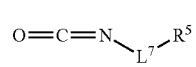

in chemical formula 9, $R^5$ is hydrogen or an alkyl group of $C_1$-$C_{10}$, wherein $L^7$ is selected from the group consisting of a single bond, an alkylene group of $C_1$-$C_{20}$; an alkoxyl group of $C_1$-$C_{20}$; an alkylthio group of $C_1$-$C_{20}$; and chemical formula 10, wherein in $L^4$ to $L^7$ in chemical formula 7 to chemical formula 9, each of the alkylene group, the alkoxyl group, and the alkylthio group may further be substituted with one or more substituents selected from the group consisting of deuterium; an aryl group of $C_6$-$C_{10}$; a heterocyclic group of $C_2$-$C_{10}$; an aliphatic ring group of $C_3$-$C_{10}$; and an alkyl group of $C_1$-$C_{10}$,

[Chemical formula 10]

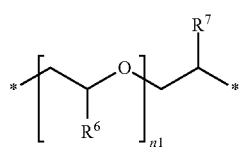

in chemical formula 10, wherein n1 is an integer from 1 to 12, and wherein $R^6$ and $R^7$ are, independently of each other, a hydrogen or methyl group.

7. A photosensitive resin composition, comprising:

(A) the semiconductor nanoparticle-ligand complex of claim 1;

(B) a photocrosslinkable monomer; and (C) an initiator.

8. The photosensitive resin composition of claim 7, wherein the photocrosslinkable monomer is a photosensitive resin composition represented by chemical formula I below:

[Chemical formula I]

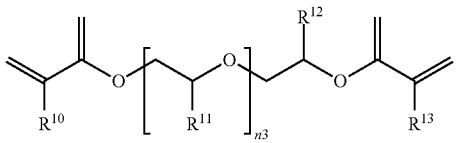

in chemical formula I above, wherein $R^{10}$ to $R^{13}$ are, independently of each other, a hydrogen or methyl group, wherein n3 is an integer from 1 to 15.

9. The photosensitive resin composition of claim 7, further comprising a light diffuser.

10. The photosensitive resin composition of claim 9, wherein the light diffuser includes barium sulfate, calcium carbonate, titanium dioxide, zirconia, or a combination thereof.

11. The photosensitive resin composition of claim 9, wherein a content of the light diffuser is 0.1 wt % to 10 wt % with respect to a total amount of the photosensitive resin composition.

12. The photosensitive resin composition of claim 7, wherein with respect to a total amount of the photosensitive resin composition, 10 wt % to of the semiconductor nanoparticle-ligand complex (A), 30 wt % to 90 wt % of the photocrosslinkable monomer (B), and 0.1 wt % to 10 wt % of the initiator (C) are included.

13. An optical film comprising the semiconductor nanoparticle-ligand complex of claim 1 and having a thickness of 0.005 μm to 500 μm.

14. An electroluminescent diode comprising the optical film of claim 13.

15. An electronic device comprising a display device including the optical film of claim 13; and a controller driving the display device.

16. An electronic device comprising a display device including the electroluminescent diode of claim 14; and a controller driving the display device.

* * * * *